(12) United States Patent
Komoguchi et al.

(10) Patent No.: US 7,842,986 B2
(45) Date of Patent: Nov. 30, 2010

(54) SOLID-STATE IMAGING DEVICE AND METHOD FOR FABRICATING THE SAME RELATED APPLICATION DATA

(75) Inventors: Tetsuya Komoguchi, Tokyo (JP); Yoshiyuki Enomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 131 days.

(21) Appl. No.: 12/127,434

(22) Filed: May 27, 2008

(65) Prior Publication Data

US 2008/0265353 A1   Oct. 30, 2008

Related U.S. Application Data

(63) Continuation of application No. 10/538,943, filed as application No. PCT/JP03/15939 on Dec. 12, 2003, now Pat. No. 7,442,973.

(30) Foreign Application Priority Data

| Dec. 13, 2002 | (JP) | ............................ P2002-362685 |
| Dec. 25, 2002 | (JP) | ............................ P2002-373415 |
| Dec. 25, 2002 | (JP) | ............................ P2002-373745 |
| Sep. 12, 2003 | (JP) | ............................ P2003-320920 |

(51) Int. Cl.
  *H01L 31/062* (2006.01)
(52) U.S. Cl. ................ 257/291; 257/292; 257/293; 257/E27.133
(58) Field of Classification Search ............... 257/291, 257/292, 293, E27.133
See application file for complete search history.

(56) References Cited

FOREIGN PATENT DOCUMENTS

| JP | 61-049466 | * | 3/1986 |
| JP | SHO 63-044760 A | | 2/1988 |
| JP | SHO 63-044761 A | | 2/1988 |
| JP | 06-112513 | | 4/1994 |
| JP | 07-045805 | | 2/1995 |
| JP | 09-120954 | | 5/1997 |
| JP | 09-266295 | | 10/1997 |
| JP | 10-326885 | * | 12/1998 |
| JP | 11-87675 | | 3/1999 |
| JP | 2000-124438 | | 4/2000 |
| JP | 2000-150845 | | 5/2000 |
| JP | 2001-77339 | | 3/2001 |
| JP | 2001-189440 | | 7/2001 |
| JP | 2001-267544 | * | 9/2001 |
| JP | 2002-110953 | | 4/2002 |
| JP | 2002-118245 | | 4/2002 |
| JP | 2002-237582 | | 8/2002 |

(Continued)

OTHER PUBLICATIONS

Japanese Office Action Issued on Oct. 19, 2007.

(Continued)

*Primary Examiner*—Tan N Tran
(74) *Attorney, Agent, or Firm*—SNR Denton US LLP

(57) ABSTRACT

A solid-state imaging device having a plurality of light-receiving sections which are disposed in a substrate and which generate charge in response to incident light, a planarizing layer which covers predetermined elements disposed on the substrate to perform planarization, a plurality of signal lines disposed above the planarizing layer and a waveguide which guides incident light to each of the light-receiving sections, the waveguide passing through the space between the plurality of signal lines.

6 Claims, 68 Drawing Sheets

FOREIGN PATENT DOCUMENTS

| | | |
|---|---|---|
| JP | 2002-246579 | 8/2002 |
| JP | 2003-258220 | 9/2003 |

OTHER PUBLICATIONS

Japanese Office Action issued on Oct. 23, 2007.

Office Action for Japanese Application No. 2002-362685 dated Aug. 7, 2009.

Japanese Patent Office, Office Action issued in Patent Application JP 2007-325614, on Aug. 24, 2010.

* cited by examiner

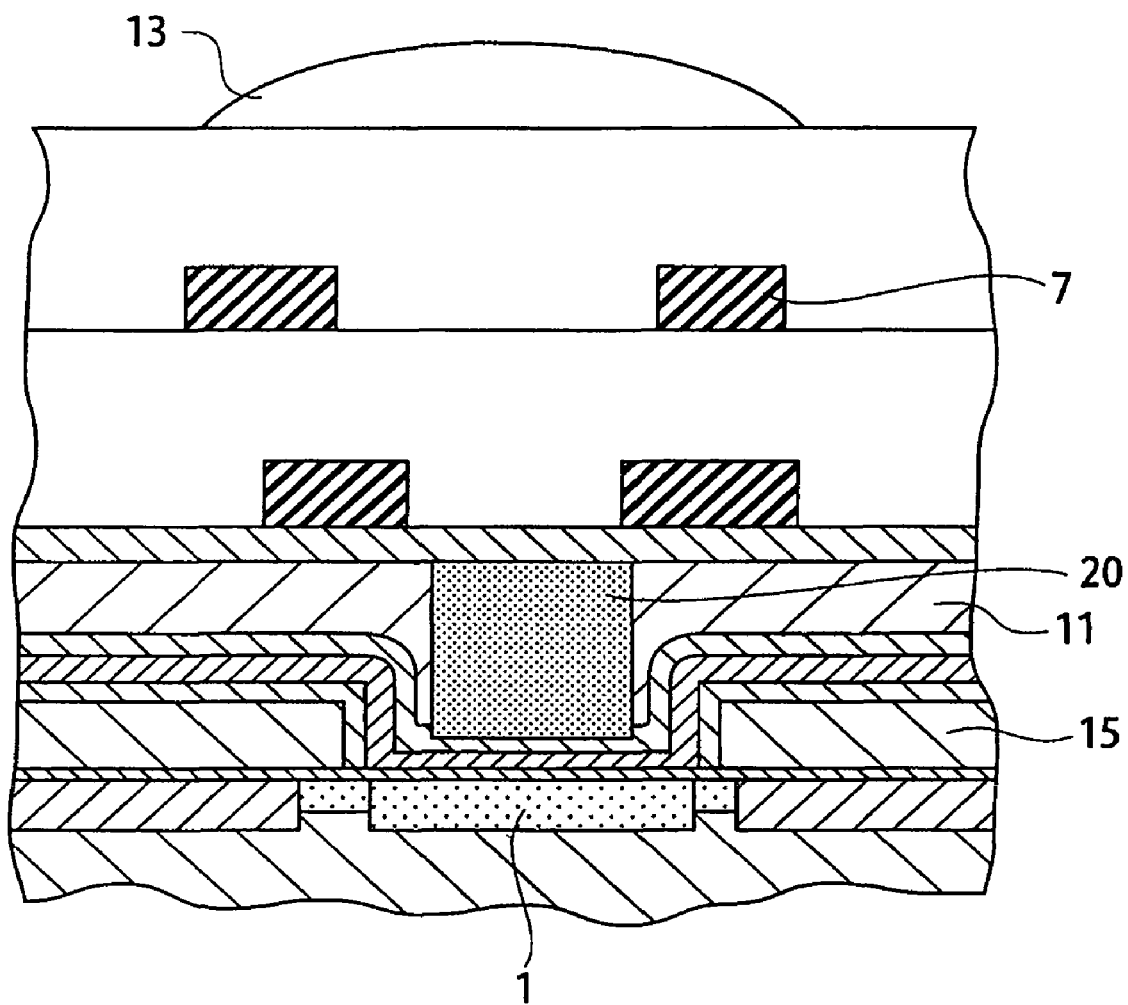
Fig.27 – PRIOR ART

SOLID-STATE IMAGING DEVICE AND METHOD FOR FABRICATING THE SAME

RELATED APPLICATION DATA

This application is a continuation of U.S. patent application Ser. No. 10/538,943 filed Jun. 13, 2005, the entirety of which is incorporated herein by reference to the extent permitted by law. Application Ser. No. 10/538,943 is the Section 371 National Stage of PCT/JP03/15939 filed on Dec. 12, 2003. The present application also claims priority to Japanese Patent Application No. P2002-362685 filed in the Japanese Patent Office on Dec. 13, 2002, Japanese Patent Application No. P2002-373415 filed in the Japanese Patent Office on Dec. 25, 2002, Japanese Patent Application No. P2002-373745 filed in the Japanese Patent Office on Dec. 25, 2002 and Japanese Patent Application No. P2003-320920 filed in the Japanese Patent Office on Dec. 9, 2003.

TECHNICAL FIELD

The present invention relates to a solid-state imaging device having a waveguide structure and a method for fabricating the solid-state imaging device.

BACKGROUND ART

MOS sensors are solid-state imaging devices which have recently been actively developed as a result of reviewing their features, such as lower power consumption than CCD sensors. In such MOS sensors, unlike CCD sensors, charges stored in light-receiving sections are not read from imaging regions by reading the insides of substrates, but charges stored are read out as electric (voltage) signals to signal lines, in the vicinity of light-receiving sections, and output from the imaging regions through the signal lines. The signal lines are referred to as output signal lines and are disposed above the substrates. Besides the output signal lines, signal lines for supplying signals to read electrodes in order to initially read out the charges stored in the light-receiving sections and reset signal lines for erasing charges in pixels are similarly disposed above the substrates. These signal lines are disposed above planarizing films which cover elements, such as read electrodes, on the substrates. Furthermore, since the number of pixels has been increasing in solid-state imaging devices, a light-receiving section and signal lines per pixel must be placed within a small area. Consequently, signal lines are formed in a multi-layered manner above planarizing films, and in some cases, signal lines may overhang above light-receiving sections.

FIG. 27 is a sectional side elevation showing an example of a waveguide structure in a conventional technique. As shown in FIG. 27, in the conventional solid-state imaging device, in order to prevent incident light from being eclipsed due to irregularities caused by read electrodes, incident light is guided to a light-receiving section 1 by a waveguide 20 provided in a planarizing film 11 covering read electrodes 15.

However, in such a structure, it is not possible to avoid eclipses due to signal lines 7 disposed above the planarizing film 11, and thus the advantage of providing the waveguide 20 is significantly reduced. Furthermore, since the conventional waveguide 20 is disposed so as to fit a space between the read electrodes 15 which are placed substantially symmetrically on both sides of the light-receiving section 1, the waveguide 20 cannot be adjusted so as to meet the asymmetry between a plurality of signal lines 7 disposed above the planarizing film 11 with respect to the light-receiving section 1 or overhanging of the signal lines 7 above the light-receiving section 1.

DISCLOSURE OF INVENTION

The present invention provides a solid-state imaging device and a method for fabricating the solid-state imaging device which have been conceived to achieve the object described above.

That is, in one aspect of the present invention, a solid-state imaging device includes a plurality of light-receiving sections which are disposed in a substrate and which generate charge in response to incident light, a planarizing layer which covers predetermined elements disposed on the substrate to perform planarization, a plurality of signal lines disposed above the planarizing layer, and a waveguide which guides incident light to each of the light-receiving sections, the waveguide passing through the space between the plurality of signal lines.

In another aspect of the present invention, a method for fabricating a solid-state imaging device includes a step of forming an insulating film on a substrate provided with a light-receiving section, a step of forming an opening in the insulating film at a position corresponding to the light-receiving section, and a step of forming a waveguide by embedding a light-transmissive material in the opening so that the waveguide can guide incident light from outside to the light-receiving section, wherein in the step of forming the opening, a resist layer is formed in a forward tapered shape during photoresist patterning for forming the opening, and the forward tapered shape is transferred during the formation of the opening by etching so that the opening has a forward tapered portion in which the size of the planar shape viewed from the direction of incident light decreases from the light incident side surface toward the light-receiving section.

In another aspect of the present invention, a method for fabricating a solid-state imaging device includes a step of forming an insulating film on a substrate provided with a light-receiving section, a step of forming an opening in the insulating film at a position corresponding to the light-receiving section, and a step of forming a waveguide by embedding a light-transmissive material in the opening so that the waveguide can guide incident light from outside to the light-receiving section, wherein in the step of forming the opening, an etching process is performed to form the opening under the etching conditions such that a forward tapered shape is formed by inhibiting isotropic etching, and thereby the opening has a forward tapered portion in which the size of the planar shape viewed from the direction of incident light decreases from the light incident side surface toward the light-receiving section.

In another aspect of the present invention, a method for fabricating a solid-state imaging device provided with a hole disposed above a light-receiving section, the hole including a low-refractive-index layer and a high-refractive-index layer embedded in the low-refractive-index layer, the method including a step of forming the low-refractive-index layer covering the surface, forming an opening in the low-refractive-index layer, and embedding the high-refractive-index layer in the opening, the step being repeated a plurality of times to form the hole.

In another aspect of the present invention, a method for fabricating a solid-state imaging device including a photoelectric conversion section disposed in a semiconductor substrate, an upper-layer film disposed on the semiconductor substrate with a gate-insulating film therebetween, a hole formed so as to extend from the upper surface of the upper-layer film to the gate-insulating film in a light-receiving region of the photoelectric conversion section, and a waveguide embedded in the hole, the method including a step of embedding a first high-refractive-index material containing hydrogen constituting at least a part of the waveguide in the hole formed in the upper-layer film, and a step of releasing hydrogen from the first high-refractive-index material toward the photoelectric conversion section by subjecting the first high-refractive-index material to heat treatment in a hydrogen atmosphere.

BRIEF DESCRIPTION OF THE DRAWINGS

FIG. 27 is a sectional side elevation showing an example of a conventional waveguide structure.

BEST MODE FOR CARRYING OUT THE INVENTION

Solid-state imaging devices and methods for fabricating the same according to the present invention will be described below based on the drawings.

Figure 1:
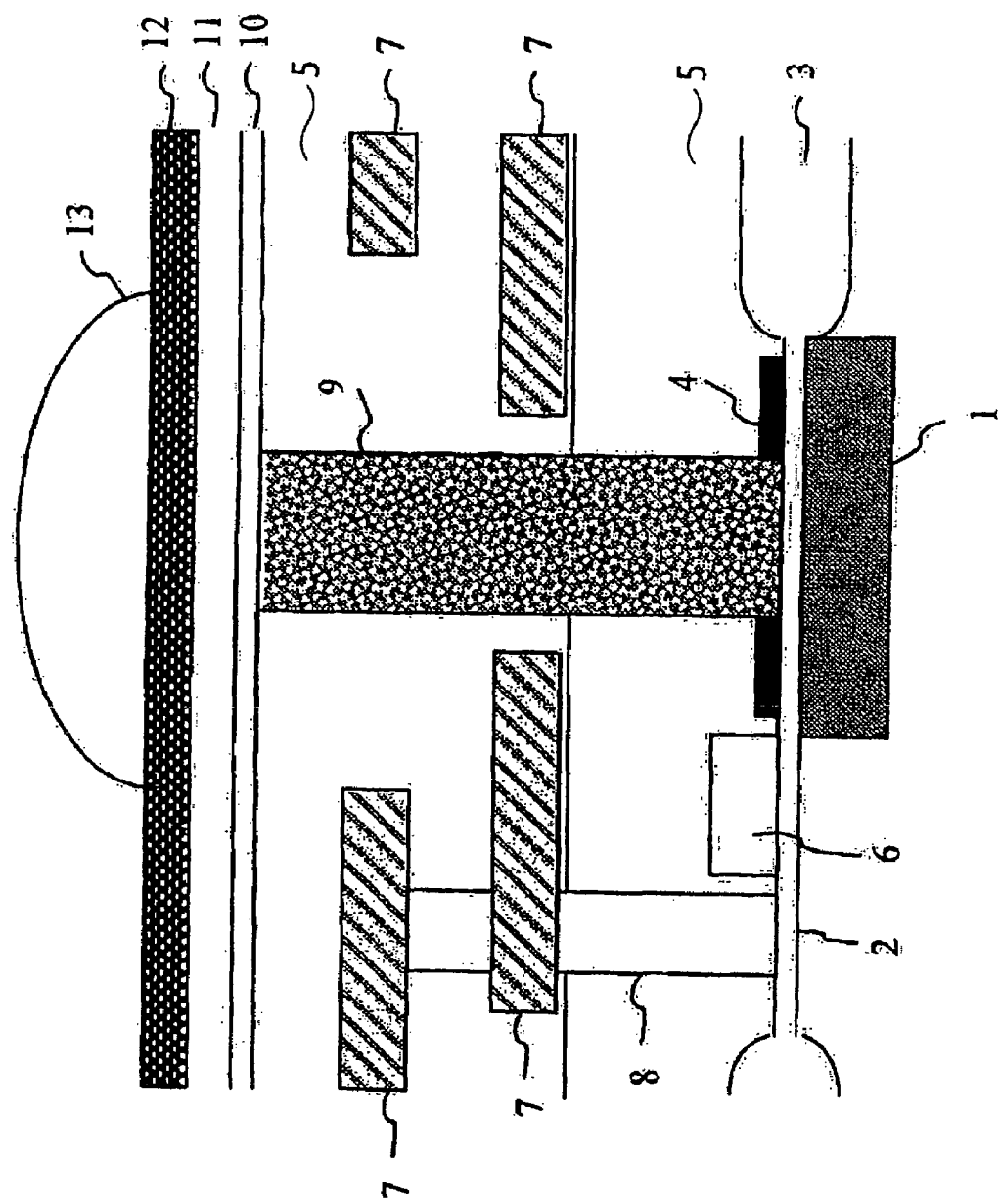
FIG. 1 is a sectional side elevation schematically showing an example of a structure of a solid-state imaging device according to the present invention.

FIG. 1 is a sectional side elevation schematically showing an example of a structure of a solid-state imaging device according to the present invention. As shown in the example of FIG. 1, in the solid-state imaging device having a waveguide structure, an insulating film 5 is disposed on a substrate provided with a light-receiving section 1, which functions as a photodiode, in the surface region with a gate-insulating film 2, an element isolation insulating film 3, and a stopper SiN film (etch stopper film) 4 therebetween.

The insulating film 5 includes a plurality of layers. The insulating film 5 may contain a plurality of different materials. Among the plurality of layers of the insulating film 5, a lower layer has a function of planarizing the upper surface by covering a read gate 6 which is required to read signal charges from the light-receiving section 1. Namely, the lower layer is a planarizing film. Furthermore, signal lines 7 are disposed in a multi-layered manner above the planarizing film. The signal lines 7 are disposed above the periphery of the light-receiving section 1 and at positions overhanging above the light-receiving section 1. Conductive plugs 8 associated with the signal lines 7 are also disposed in the insulating film 5. FIG. 1 shows only one line that indicates that a plurality of layers is contained in the insulating film 5. Although there may be other interfaces between the individual layers, such interfaces will be omitted in the drawing because they are not required for the description of the present invention.

Furthermore, a waveguide 9 is disposed in the insulating film 5 at a position corresponding to the light-receiving section 1, the wave guide 9 guiding incident light to the light-receiving section 1 through the space between the multi-layered signal lines 7. An on-chip lens 13 is disposed above the insulating film 5 with a passivation film 10, a planarizing film 11, and a color filter 12 therebetween.

The waveguide 9 is formed, for example, by forming an opening (hole) in the insulating film 5 so as to extend from the light incident side through the space between the multi-layered signal lines 7 to the light-receiving section 1, and by embedding a light-transmissive material, such as silicon nitride (P—SiN), in the opening by a plasma CVD (chemical vapor deposition) process. When the refractive index of the light-transmissive material is higher than that of the insulating film 5, the waveguide 9 not only optically connects the light-receiving section 1 to the on-chip lens 13 but also improves the light-collecting ratio to the light-receiving section 1 by totally reflecting incident light having an incident angle larger than the critical angle at the interface between the waveguide 9 and the insulating film 5.

Because of the structure described above, incident light can be guided to the light-receiving section 1 with high efficiency even if a plurality of signal lines 7 is disposed asymmetrically to the light-receiving section 1 above the periphery of the light-receiving section 1 and at positions overhanging above the light-receiving section 1.

Solid-state imaging devices and methods for fabricating the same according to the present invention will be described below based on the drawings.

Embodiment 1

Figure 2:
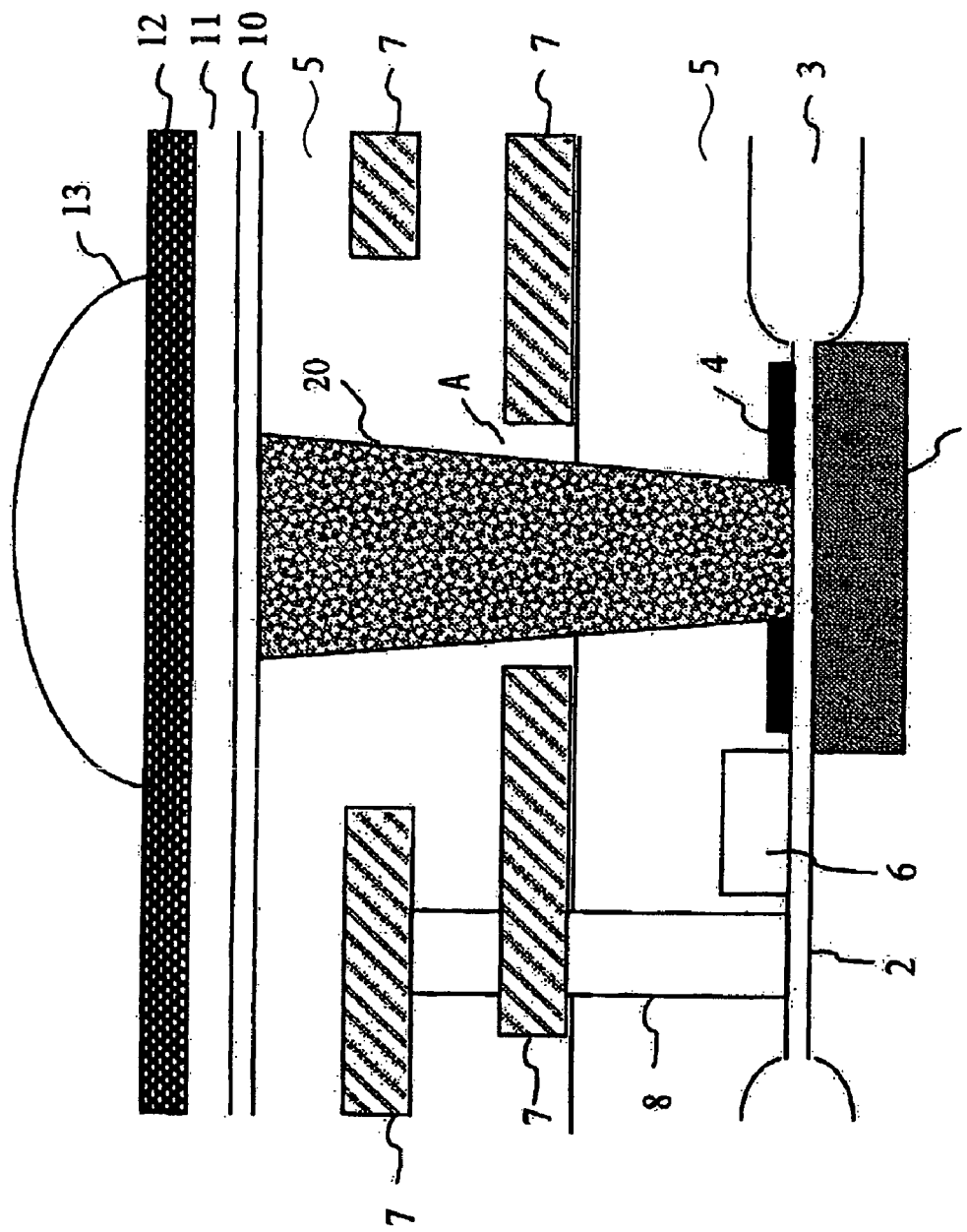
FIG. 2 is a sectional side elevation schematically showing an example of a structure of a solid-state imaging device according to a first embodiment (hereinafter referred to as "Embodiment 1") of the present invention.

First, a general structure of a solid-state imaging device according to the present invention will be described. FIG. 2 is a sectional side elevation schematically showing an example of a structure of a solid-state imaging device according to a first embodiment (hereinafter referred to as "Embodiment 1") of the present invention. In FIG. 2, the same reference numerals are used for the same elements as those of the conventional solid-state imaging device (refer to FIG. 27).

As shown in FIG. 2, in the solid-state imaging device in this embodiment, an insulating film 5 is disposed on a substrate provided with a light-receiving section 1, which functions as a photodiode, with a gate-insulating film 2, an element isolation insulating film 3, and a stopper SiN film (etch stopper film) 4 therebetween. The insulating film 5 is embedded with a read gate 6 which is required to read signal charges from the light-receiving section 1, a multi-layered signal lines 7, and conductive plugs 8 associated with the signal lines 7. Furthermore, a waveguide 20 composed of a light-transmissive material is disposed in the insulating film 5 at a position corresponding to the light-receiving section 1. An on-chip lens 13 is disposed above the upper surface of the insulating film 5 with a passivation film 10, a planarizing film 11, and a color filter 12 therebetween. The waveguide 20 is composed of a light-transmissive material that has a higher refractive index than the insulating film 5.

In the solid-state imaging device described here, the shape of the waveguide 20 is different from that of the conventional solid-state imaging device (refer to FIG. 27). Namely, the waveguide structure is different from the conventional one. In the waveguide structure according to this embodiment, the waveguide has a forward tapered portion. The expression "forward tapered portion" refers to a portion having a tapered shape in which the size of the planar shape viewed from the direction of incident light gradually decreases from the light incident surface of the insulating film 5 toward the light-receiving section 1.

The forward tapered portion may extend throughout the waveguide 20 as in the example shown in FIG. 2. However, it is not always necessary to form the forward tapered portion throughout the waveguide 20, and the forward tapered portion must be formed in at least a part of the waveguide 20 so as to extend from the light incident surface of the insulating film 5 toward the light-receiving section 1. More particularly, the forward tapered portion may be disposed only on the light incident side of a signal line 7 which overhangs most greatly above the light-receiving section 1 among the multi-layered signal lines 7 (refer to numeral A in FIG. 2), i.e., so as to extend from the light incident surface of the insulating film 5 only to a depth reaching the signal line 7, and the other part may be formed in a straight shape instead of a tapered shape.

Furthermore, desirably, the forward tapered portion has a planar shape corresponding to the signal lines 7 formed in the insulating film 5, in particular, corresponding to the signal line 7 overhanging above the light-receiving section 1, instead of the planar shape of the light-receiving section 1.

Figure 3:
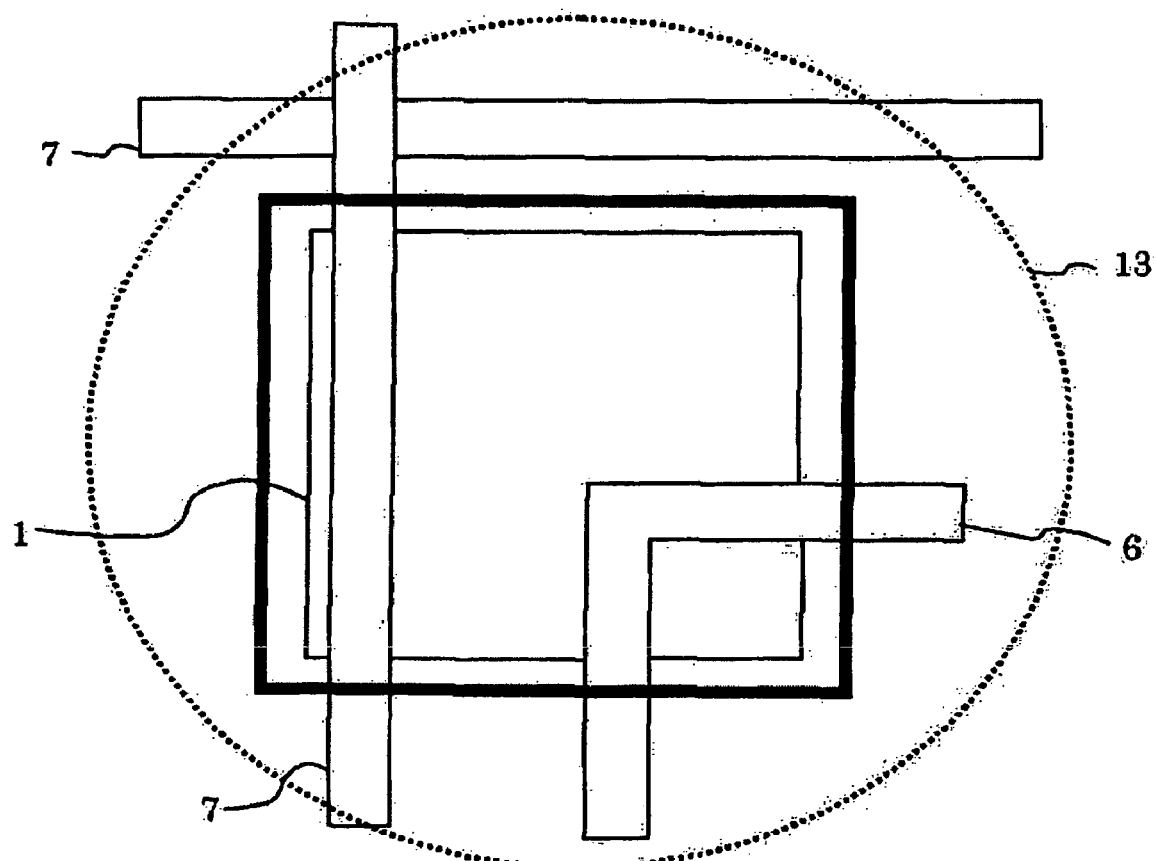
FIG. 3 is an explanatory view showing a specific example of a planar shape of a forward tapered portion of a solid-state imaging device according to the present invention (part 1).
Figure 4:
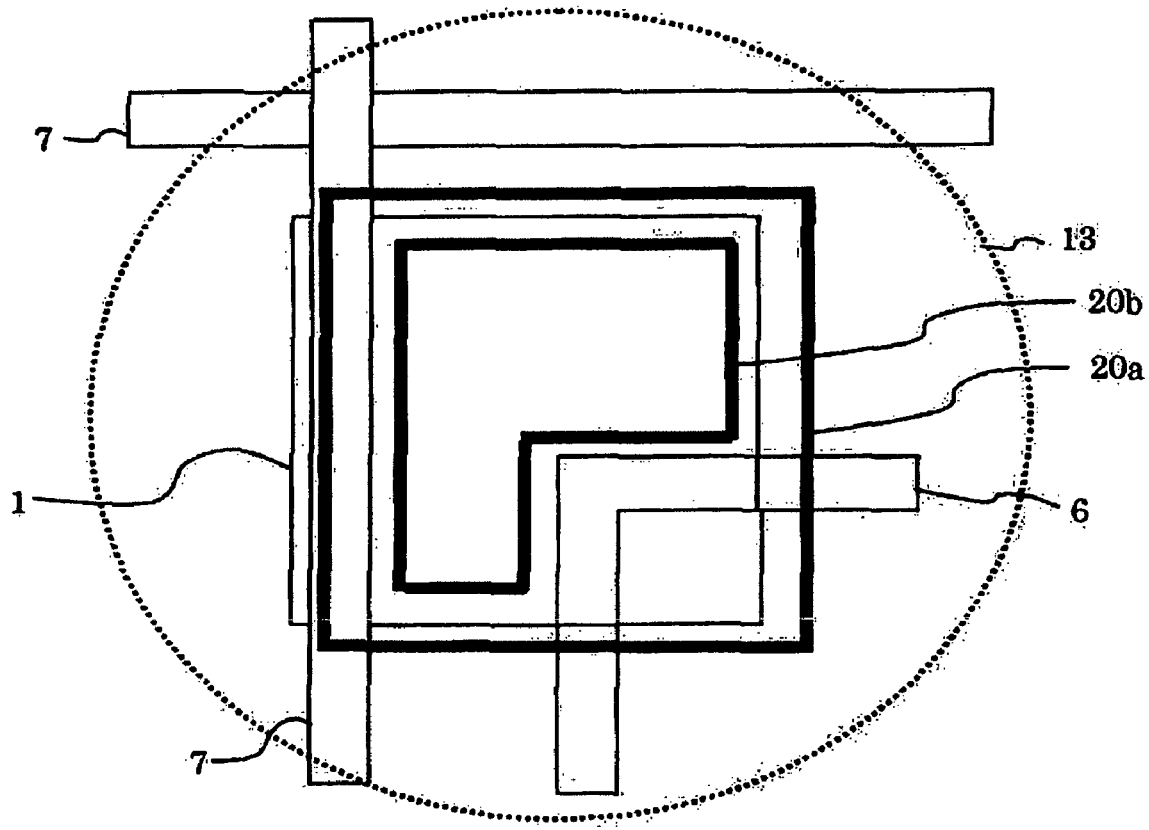
FIG. 4 is an explanatory view showing a specific example of a planar shape of a forward tapered portion of a solid-state imaging device according to the present invention (part 2).
Figure 5:
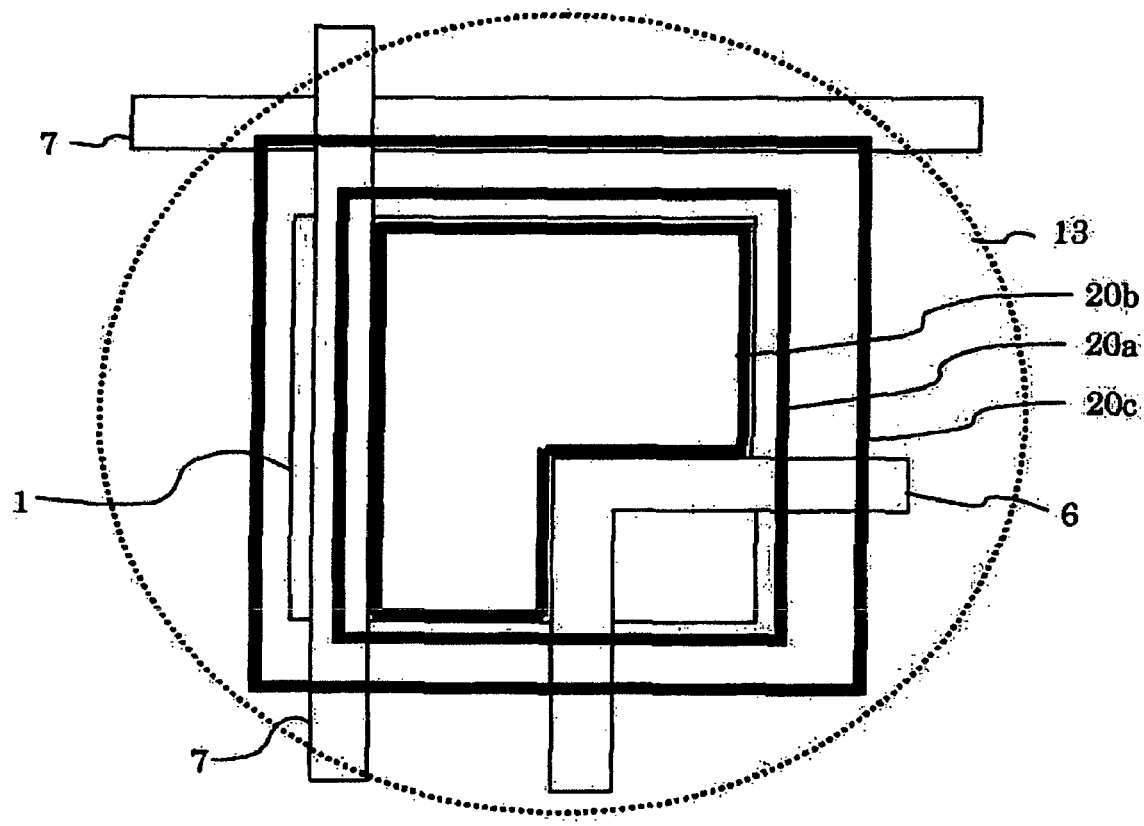
FIG. 5 is an explanatory view showing a specific example of a planar shape of a forward tapered portion of a solid-state imaging device according to the present invention (part 3).

Here, specific examples of the planar shape of the forward tapered portion of the waveguide 20 will be described. FIGS. 3 to 5 are explanatory views showing specific examples of the planar shape of the forward tapered portion.

An example in which the planar shape of the light-receiving section 1 is rectangular as shown in FIG. 3 will be examined. In such a case, the planar shape of the waveguide 20 may be set to be rectangular corresponding to the light-receiving section 1. However, if a signal line 7 overhanging above the light-receiving section 1 is present, incident light is blocked by the signal line 7, and the surface which light reaches (light acceptance surface) is narrowed by that amount.

For the reason described above, when a forward tapered portion is provided on the waveguide 20, for example, as shown in FIG. 4, even if the shape of an opening 20a on the light incident side of the forward tapered portion is rectangular, the shape of an opening 20b on the light-receiving section 1 side may be set to be a planar shape corresponding to the signal line 7 overhanging above the light-receiving section 1. In this way, light entering from the opening 20a can be concentrated on the opening 20b, and as a result, incident light is allowed to efficiently reach the light-receiving section 1.

Moreover, the forward tapered portion does not necessarily have a tapered shape with one cone angle, and for example, taper shapes with two or more different cone angles may be combined. In such a case, for example, as shown in FIG. 5, the forward tapered portion on the light-receiving section 1 side is formed as in FIG. 4, while the forward tapered portion on the light incident side is formed such that the shape of an opening 20c on the light incident side set to be larger than the opening 20a. In this way, even if the opening 20a of the forward tapered portion on the light-receiving section 1 side is narrow, by expanding the opening 20c of the forward tapered portion on the light incident side, a larger amount of light can be guided to the light-receiving section 1.

Figure 6:
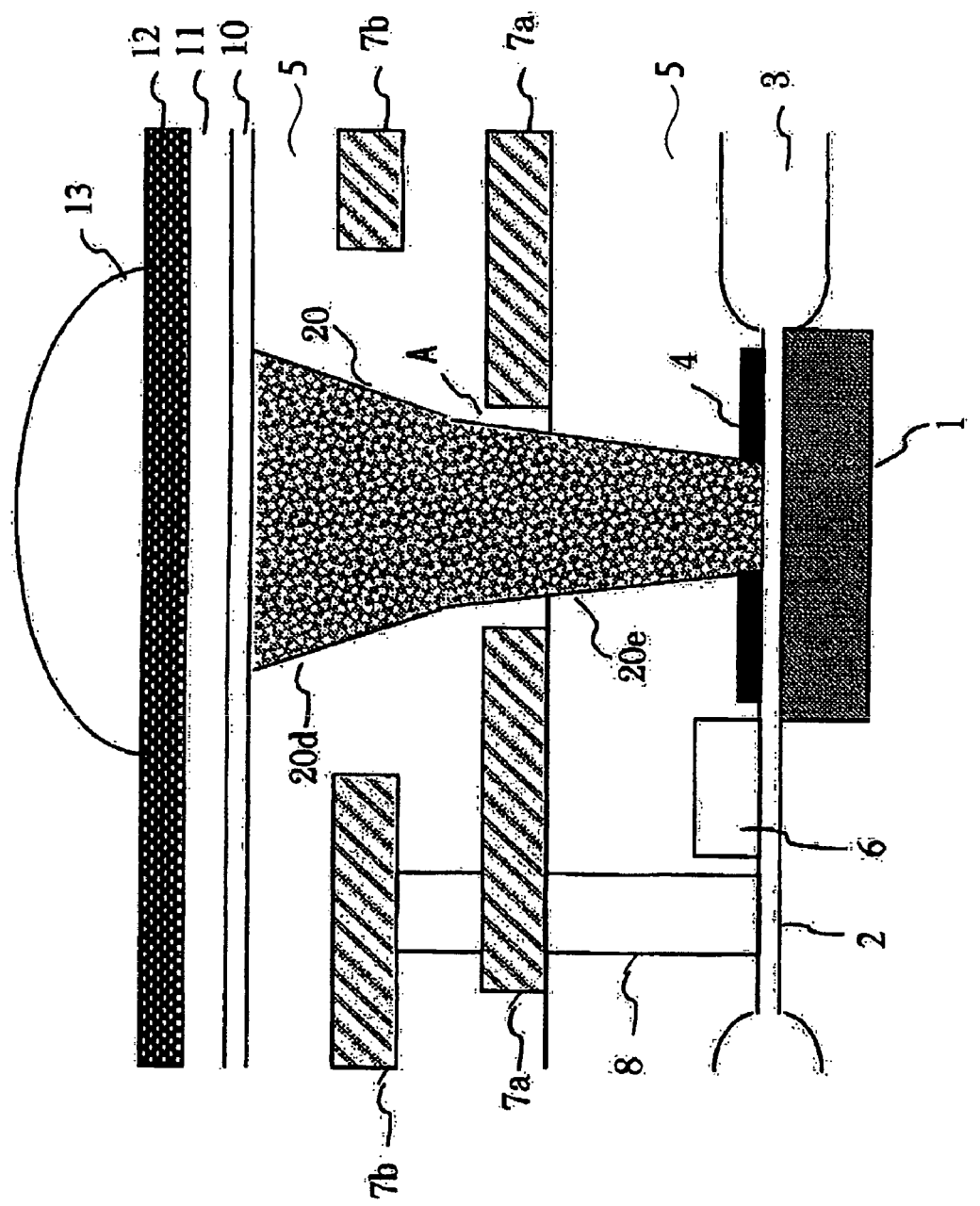
FIG. 6 is a sectional side elevation schematically showing another example of a structure of a solid-state imaging device according to the present invention (part 1).
Figure 7:
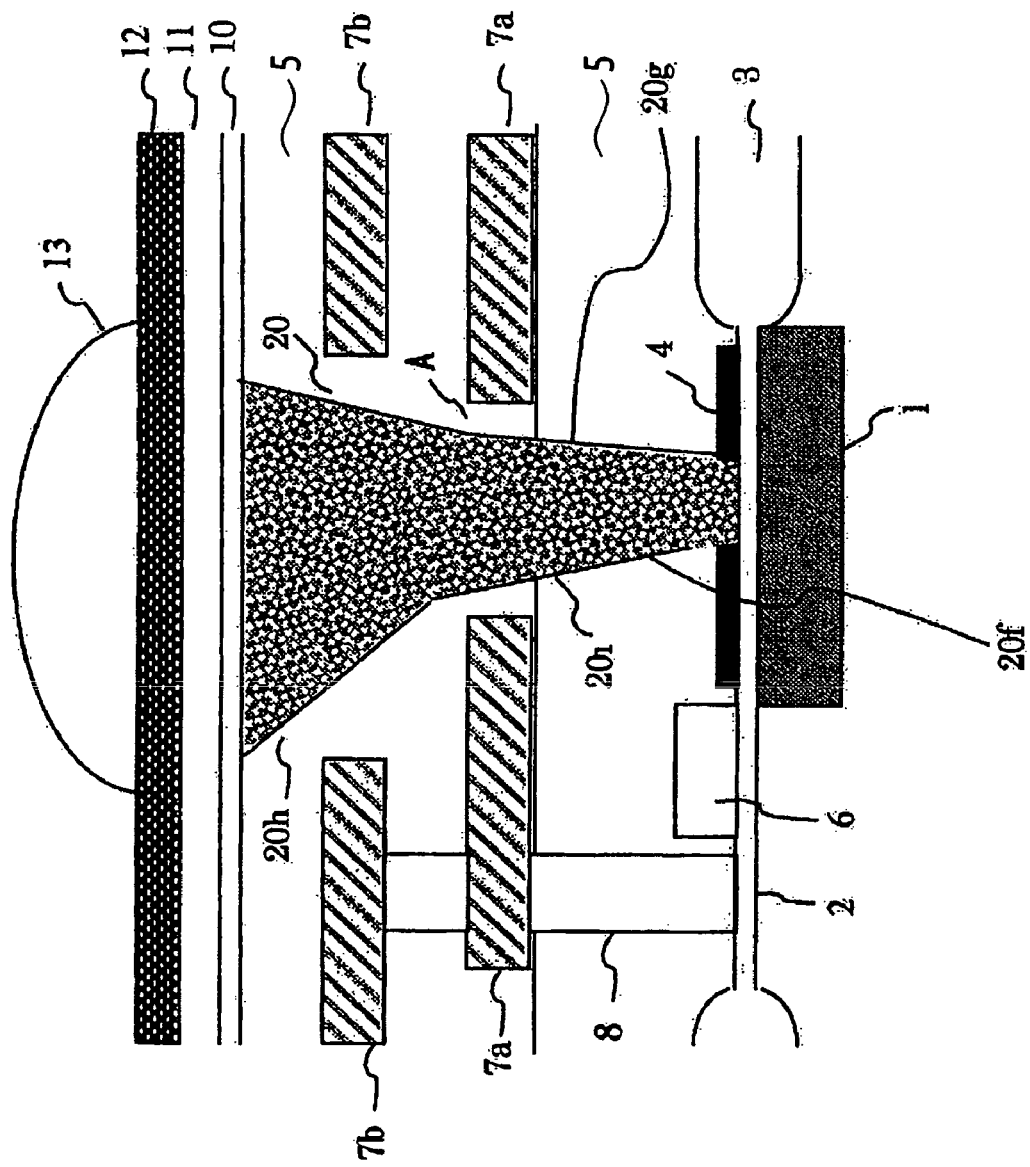
FIG. 7 is a sectional side elevation schematically showing another example of a structure of a solid-state imaging device according to the present invention (part 1).

FIGS. 6 and 7 are sectional side elevations schematically showing other examples of a structure of a solid-state imaging device according to the present invention, in which the forward tapered portion has a combination of tapered shapes with two or more different cone angles. In the drawings, the same reference numerals are used for the same elements as those of the solid-state imaging device described above (refer to FIG. 2).

As shown in FIG. 6, the waveguide 20 of the solid-state imaging device may be designed to have a first slope 20d which inclines such that the size of the planar shape of the waveguide 20 gradually decreases from the light incident side toward the side of the signal line 71 (refer to reference numeral A in FIG. 6). In addition to the first slope 20d, the waveguide 20 has a second slope 20e which inclines at an angle that is different from that of the first slope 20d. However, instead of the second slope 20e, the waveguide 20 may have a non-sloping part (not shown in the drawing) that is not inclined at all.

The first slope 20d of the waveguide 20 has an angle of inclination according to the positional relationship between at least two signal lines 7a and 7b that overlap each other in the lamination direction (vertical direction). Namely, the angle of inclination is specified depending on the positions of the ends of the upper and lower signal lines 7a and 7b. For example, as in the example shown in FIG. 6, in the case in which the end of the lower signal line 7a greatly overhangs above the light-receiving section 1, and in contrast, the end of the upper signal line 7b does not overhang above the light-receiving section 1, thus producing a two-dimensional difference between the positions of the ends of the individual signal lines, the angle of inclination of the first slope 20d is large with respect to the optical axis of incident light.

Additionally, the angle of inclination of the first slope 20d does not necessarily correspond to the angle between the ends of the signal lines 7a and 7b at the light-receiving section 1 side, and must be set according to the positional relationship between the signal lines 7a and 7b.

Even in the waveguide 20 having the forward tapered portion in which the first slope 20d and the second slope 20e (or a non-sloping part) are combined as described above, by enlarging the opening at the light incident side, a larger amount of light can be guided to the light-receiving section 1. Namely, in the conventional waveguide structure (refer to Fig. A), it is not possible to dispose signal lines 7 in the vicinity of the light-receiving section 1 because of a decrease in the amount of light collected. However, if the waveguide structure including the waveguide 20 having the first slope 20d is employed, it is possible to improve the light collection efficiency to the light-receiving section 1. Consequently, in an imaging device, such as a MOS (Metal Oxide Semiconductor) imaging device (i.e., a CMOS sensor or the like), the signal line 7 can be disposed in the vicinity of the light-receiving section 1. Furthermore, it becomes possible to overcome the problem of limitation in placement of lines resulting from an increase in the area of the light-receiving section 1 and a decrease in the area of the pixel circuit. In particular, this becomes prominent when the end of the signal line 7a greatly overhangs above the light-receiving section 1.

Furthermore as shown in FIG. 7, the waveguide 20 of the solid-state imaging device may be designed such that its sidewall includes a first side face 20f and a second side face 20g, and the planar shape of the waveguide 20 is gradually decreased by the first side face 20f and the second side face 20g. In such a case, the first side face 20f has a shape that is different from that of the second side face 20g. At least the first side face 20f has a plurality of slopes 20h and 20i having different angles of inclination. The slopes 20h and 20i may be constructed as in the first slope 20d and the second slope 20e (or a non-sloping part). Namely, at least one slope 20h among the slopes 20h and 20i has an inclination angle according to the positional relationship between at least two signal lines 7a and 7b that overlap each other in the lamination direction (vertical direction), and the lower signal line 7a is disposed such that the end thereof greatly overhangs above the light-receiving section 1.

Even in the waveguide 20 having the forward tapered portion in which the first side face 20f and the second side face 20g are combined as described above, by enlarging the opening at the light incident side, a larger amount of light can be guided to the light-receiving section 1. Namely, in the conventional waveguide structure, it is not possible to dispose signal lines 7 in the vicinity of the light-receiving section 1 because of a decrease in the amount of light collected. However, if the waveguide structure including the waveguide 20 having the first side face 20f is employed, it is possible to improve the light collection efficiency to the light-receiving section 1. Furthermore, it becomes possible to overcome the problem of limitation in placement of lines resulting from an increase in the area of the light-receiving section 1 and a decrease in the area of the pixel circuit. In particular, this becomes prominent when the end of the signal line 7a greatly overhangs above the light-receiving section 1.

The outline of a method for fabricating a waveguide having the structure described above, i.e., a method for fabricating a solid-state imaging device according to the present invention, will be described below. FIGS. 8 to 12 are sectional side elevations illustrating a method for fabricating a solid-state imaging device according to the present invention. Here, a method for fabricating the solid-state imaging device shown in FIG. 2 will be described as an example.

Figure 8:
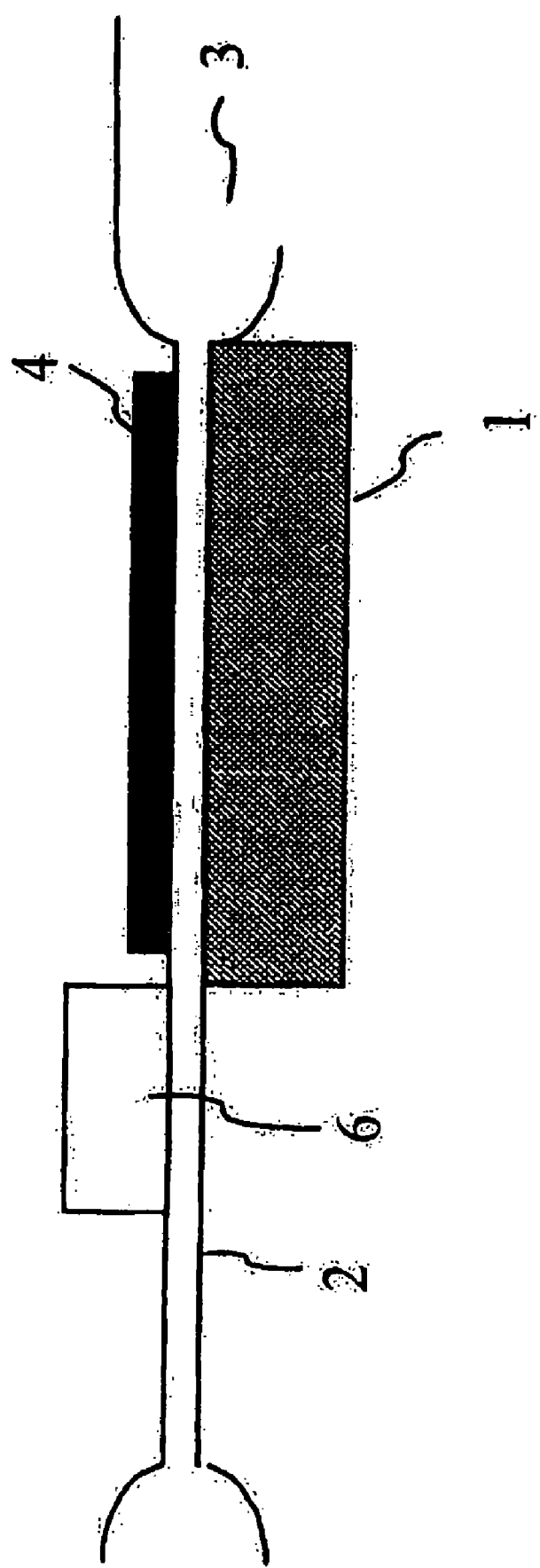
FIG. 8 is a sectional side elevation illustrating a method for fabricating a solid-state imaging device according to the present invention (part 1).

In order to fabricate the solid-state imaging device, first, as shown in FIG. 8, a light-receiving section 1 and a read gate 6 are formed, and then a stopper SiN film 4 is formed on the light-receiving section 1 with a gate-insulating film 2 therebetween, the stopper SiN film 4 being used as an etch stopper film during etching for opening a waveguide. The stopper SiN film 4 is formed using SiN in view of the selective ratio during etching for opening the waveguide. Subsequently, multi-layered signal lines 7, conductive plugs 8 associated with the signal lines 7, and an insulating film 5 for embedding these elements are formed on the gate-insulating film 2. As the insulating film 5, an oxide film may be used. Up to this stage, the fabrication procedure is substantially the same as that for the conventional solid-state imaging device.

Figure 9:
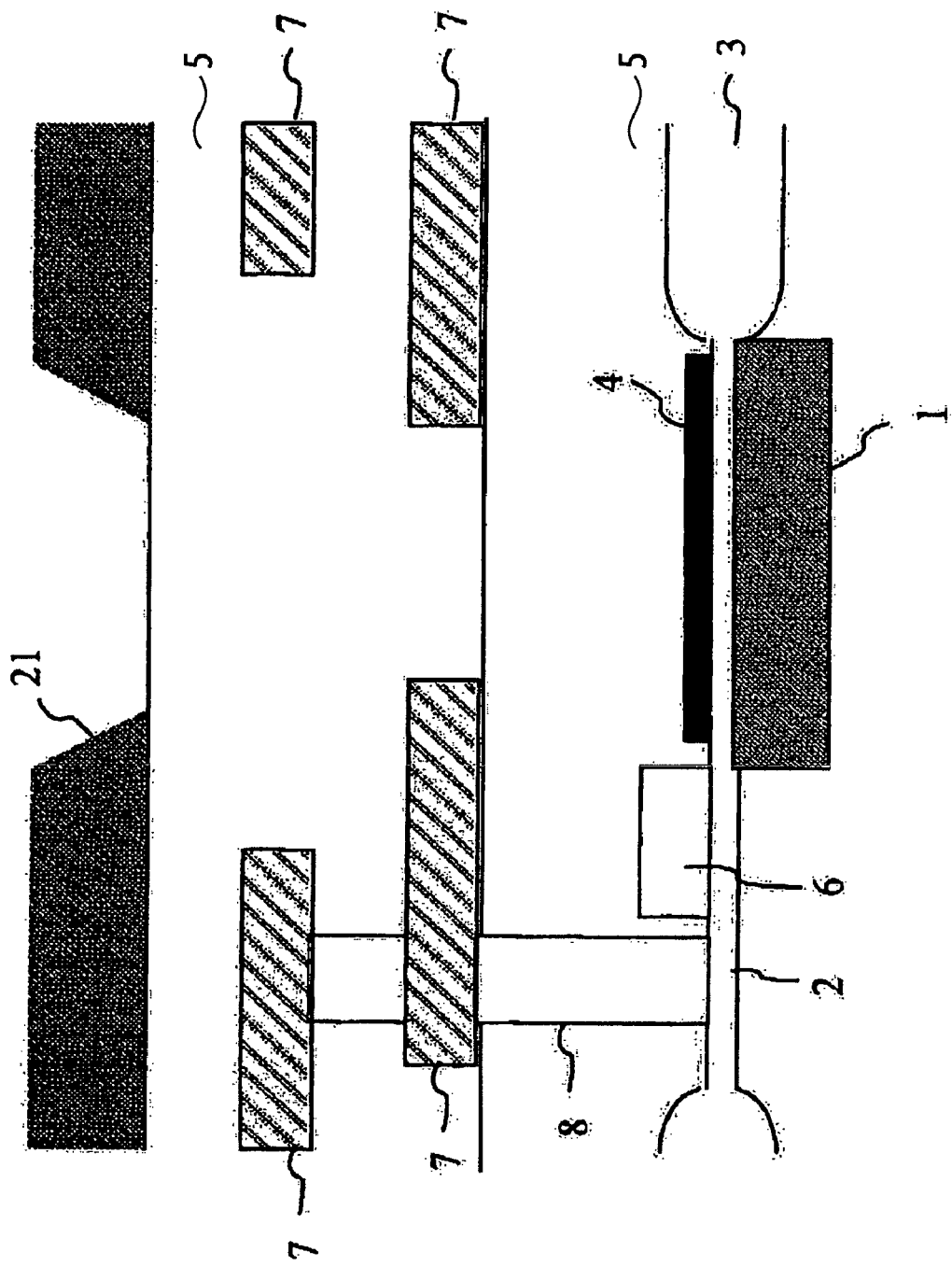
FIG. 9 is a sectional side elevation illustrating the method for fabricating the solid-state imaging device according to the present invention (part 2).

Subsequently, as shown in FIG. 9, patterning of a photoresist film 21 is performed on the upper surface of the insulating film 5 in order to form an opening for a waveguide 20. In this process, in order to produce the waveguide 20 having a forward tapered portion, the photoresist film 21 is formed so that the opening obtained by patterning has a forward tapered shape. The forward tapered shape can be produced by a known technique which is usually used for forming the photoresist film 21. Furthermore, the angle of the forward tapered shape, etc., can be specified according to the shape of the forward tapered portion to be formed.

Figure 10:
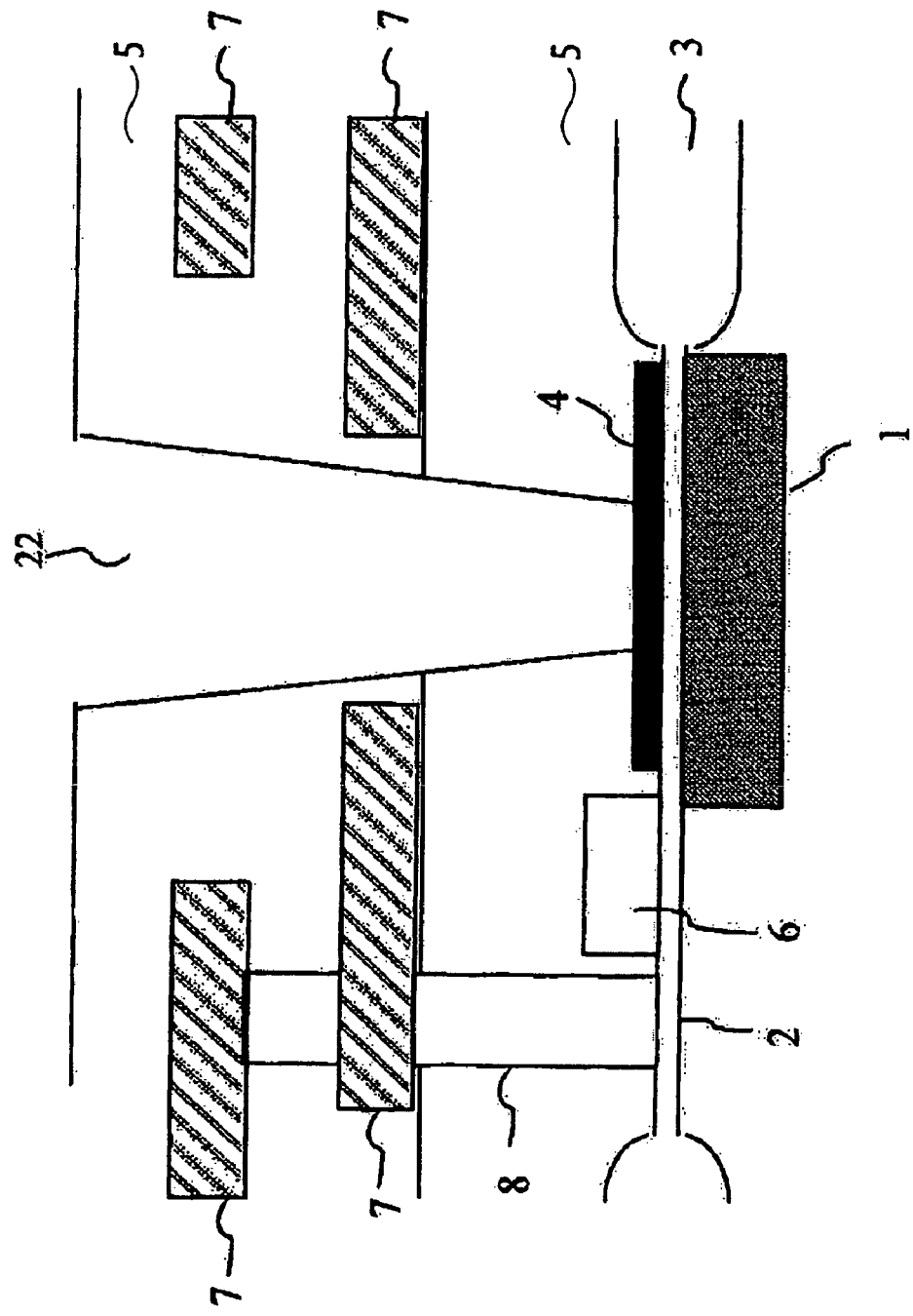
FIG. 10 is a sectional side elevation illustrating the method for fabricating the solid-state imaging device according to the present invention (part 3).

After the photoresist film 21 is formed, as shown in FIG. 10, an opening 22 is formed by etching. Thus, the opening 22 is formed in the insulating film 5 at a position corresponding to the light-receiving section 1 (on the upper side of the light-receiving section 1). Since the photoresist film 21 has a forward tapered shape, when the opening 22 is formed by etching, the forward tapered shape of the photoresist film 21 is transferred to the opening 22. Consequently, the opening 22 formed by etching has a forward tapered portion in which the size of the planar shape viewed from the direction of incident light decreases from the light incident surface toward the light-receiving section 1.

When the opening 22 is formed by etching, the etching conditions in the etching process may be set such that a forward tapered shape is formed by inhibiting isotropic etching. Specifically, in the etching process, for example, a sidewall-protecting film is formed using a CF-based gas, such as C4F8, having high deposition capability to inhibit isotropic etching so that the resulting opening 22 has a forward tapered shape. Besides the type of gas used, by appropriately selecting and adjusting the resist exposure conditions, the flow rate and pressure of the etching gas, the RF bias voltage, etc., isotropic etching can be inhibited so that the tapered shape is produced. That is, by adjusting the etching conditions in the etching process, the opening 22 formed by etching has a forward tapered portion.

As described above, the opening 22 for the waveguide 20 is formed in the insulating film 5 so as to have a forward tapered portion by forming a forward tapered resist layer during photoresist patterning, by setting etching conditions such that a forward tapered shape is formed by inhibiting isotropic etching in the etching process, or by the combination of these. The angle, depth, etc., of the forward tapered portion can be set as desired by adjusting the resist shape, etching conditions, etc. Since the resist shape and etching conditions, etc. can be adjusted using known techniques, a detailed description thereof will be omitted.

Figure 11:
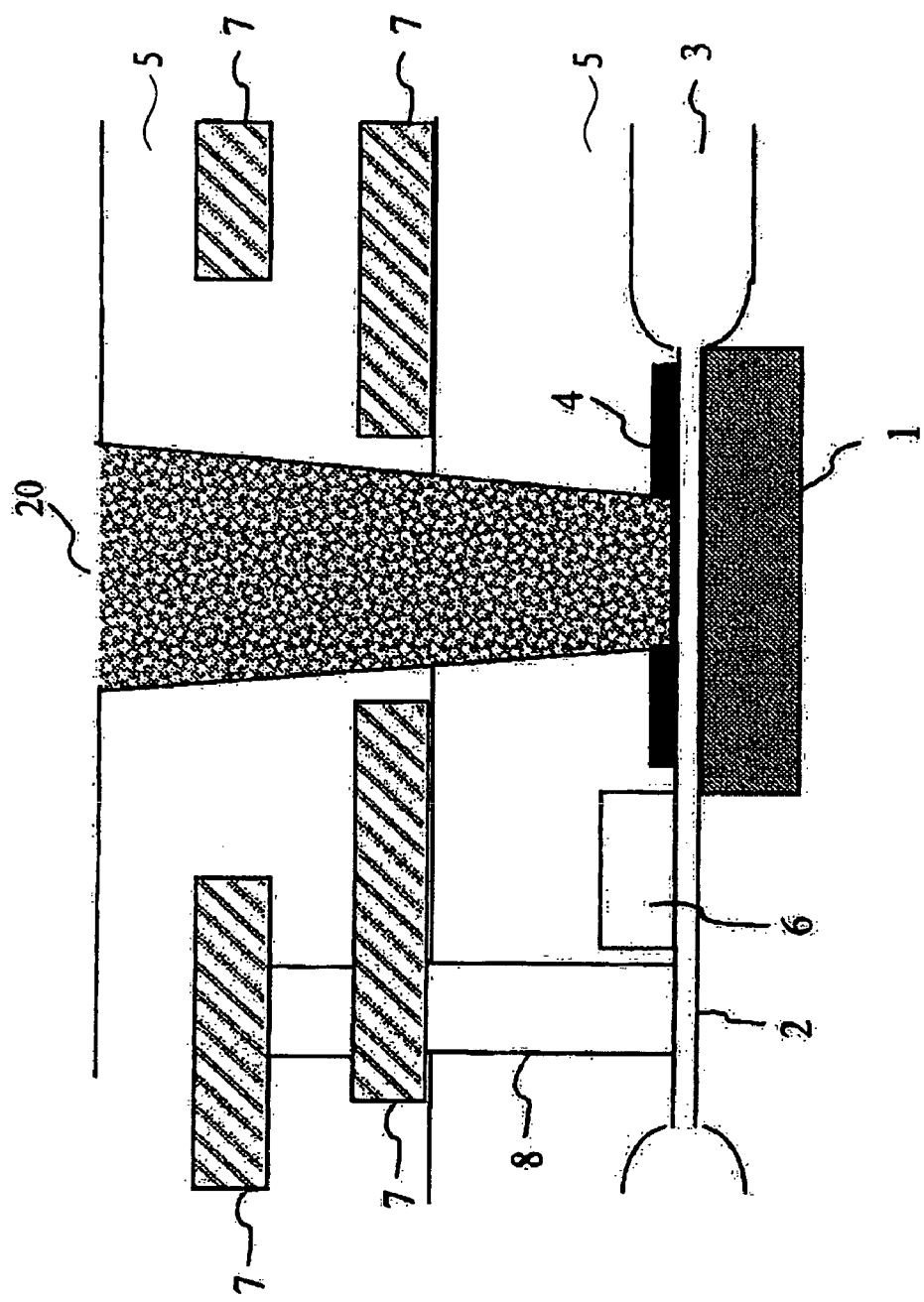
FIG. 11 is a sectional side elevation illustrating the method for fabricating the solid-state imaging device according to the present invention (part 4).

After the opening 22 is formed, as shown in FIG. 11, a light-transmissive material is embedded in the opening 22 to form the waveguide 20. Specifically, for example, the waveguide 20 is formed by embedding a light-transmissive material, such as P—SiN, using high-density plasma CVD. At this stage, the opening 22 has a forward tapered portion. That is, the front end (top) of the opening 22 is large because of the forward tapered portion. Consequently, when the light-transmissive material is embedded, the supply of radicals into the opening 22 is accelerated, and thus the light-transmissive material is evenly distributed into the opening 22. Moreover, even if a deposit is attached to the vicinity of the front end of the opening 22 when the light-transmissive material is embedded, the front end is not blocked with the deposit because of the largeness of the front end. For the reasons described above, in the opening 22 having a forward tapered portion, even if the aspect ratio is high, the light-transmissive material can be satisfactorily embedded. After the waveguide 20 is formed by embedding the light-transmissive material in the opening 22, global planarizing treatment is performed by an etch-back process or CMP (Chemical Mechanical Polishing).

Figure 12:
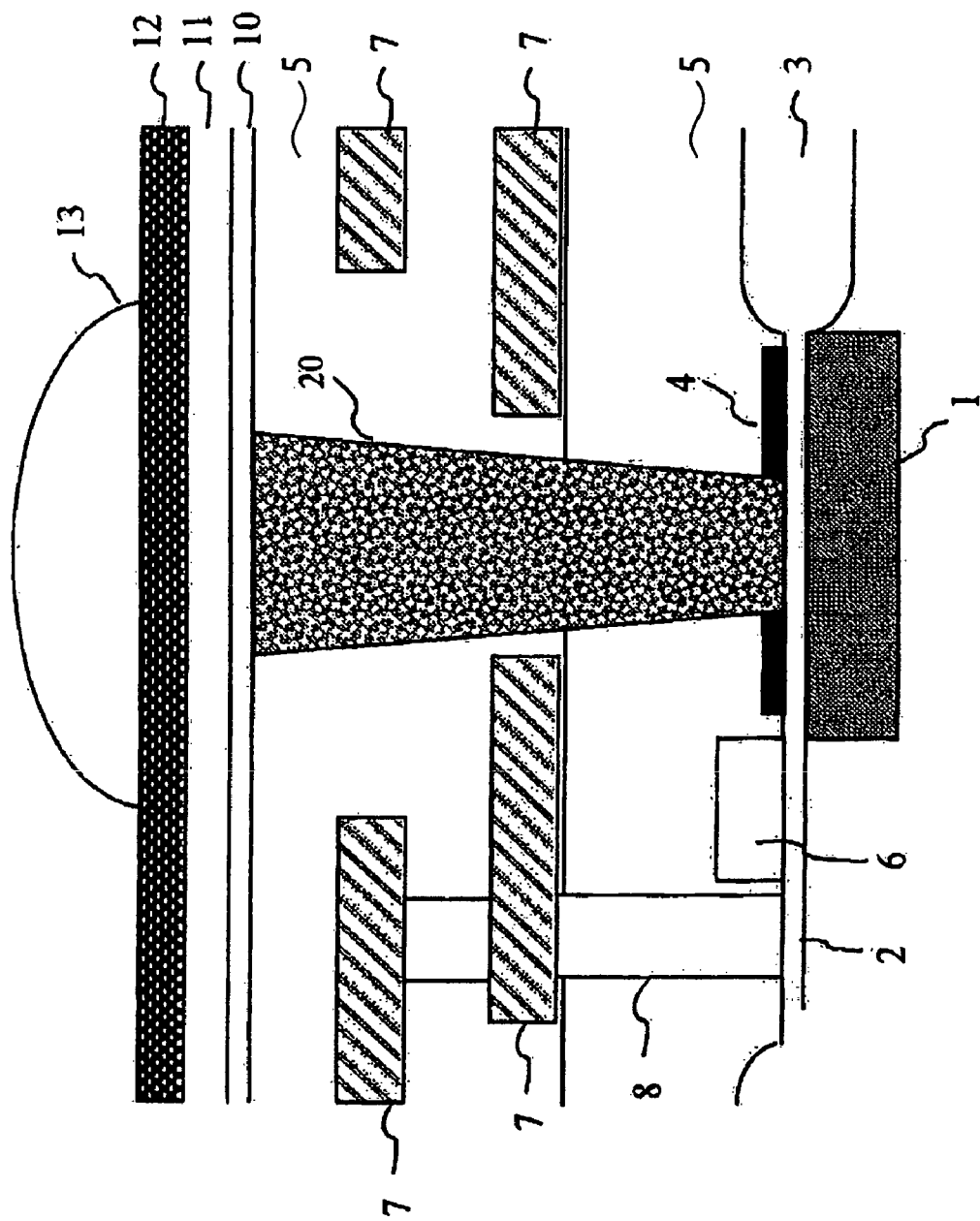
FIG. 12 is a sectional side elevation illustrating the method for fabricating the solid-state imaging device according to the present invention (part 5).

Subsequently, as shown in FIG. 12, a passivation film 10, a planarizing film 11, a color filter 12, and an on-chip lens 13 are formed in that order on the upper surface of the waveguide 20 and the insulating film 5 by substantially the same fabrication procedure for the solid-state imaging device as the conventional one. The solid-state imaging device is thereby completed.

As described above, in the solid-state imaging device and the fabrication method therefor according to this embodiment, the waveguide 20 has a forward tapered portion. That is, the opening 22 for forming the waveguide 20 has a forward tapered portion in which the size of the planar shape decreases from the light incident surface toward the light-receiving section. Consequently, when the waveguide 20 is formed by embedding the light-transmissive material into the opening 22, the property of embedding the light-transmissive material is improved compared with the conventional technique. Furthermore, the front end of the opening 22 is not blocked with deposits. Thus, the light-transmissive material can be satisfactorily embedded even into the opening 22 having a high aspect ratio. As a result, in the waveguide 20, the light collection efficiency can be improved and the variation in characteristics can be reduced.

Furthermore, since the light incident side of the waveguide 20 can be increased and the light-receiving section 1 side of the waveguide 20 can be decreased by the forward tapered portion, it is possible to form a waveguide having a shape that is most suitable for the structure of the solid-state imaging device, thus improving the light collection capability. That is, the increase in the size of the light incident side of the waveguide 20 enables an increase in the amount of light entering the waveguide 20. The decrease in the size of light-receiving section 1 side of the waveguide 20 enables efficient absorption of light into the waveguide 20, and for example, light emitted in an oblique direction is also easily concentrated on the light-receiving section 1. Thus, capability of collecting light to the light-receiving section 1 is improved.

Furthermore, for example, even if the planar shape of the light-receiving section 1 is decreased due to the increase in the number of pixels, or for example, even when a structure is employed in which signal lines 7, etc., cover the space above the light-receiving section 1, the front end of the opening 22 can be increased by the forward tapered portion while avoiding interference with the signals lines 7, etc. That is, since the distance between the waveguide 20 and the signal lines 7 can be increased by the forward tapered portion, it is possible to prevent lines from being scraped during the etching of the opening 22, and thus reliability of the solid-state imaging device can be improved, and generation of particles due to the reaction product with the signal lines 7 can be prevented.

These features are very effective particularly in a solid-state imaging device having a multi-layered wiring structure because the aspect ratio of the opening 22 for forming the waveguide 20 increases as the number of wiring layers and the number of pixels increase.

Furthermore, as described in this embodiment, for example, in the case in which the forward tapered portion is disposed only on the light incident side of the signal line 7 that greatly overhangs above the light-receiving section 1, the forward tapered portion is provided only on the necessary part. That is, the other portion may have a straight shape instead of a tapered shape, which is extremely suitable in improving light collection efficiency to the light-receiving section 1.

Furthermore, as described in this embodiment, in the case in which the forward tapered portion has a planar shape that corresponds to signal lines 7 formed in the insulating film 5, in particular, signal lines 7 overhanging above the light-receiving section 1, since incident light is not blocked by the signal lines 7, incident light is allowed to reach the light-receiving section 1 efficiently, thus being extremely suitable in improving light collection efficiency. Furthermore, since lines can be prevented from being scraped during the etching of the opening 22, reliability of the solid-state imaging device is greatly improved.

Furthermore, in the method for fabricating the solid-state imaging device according to this embodiment, the forward tapered portion is prepared by forming a forward tapered resist layer during photoresist patterning, by setting etching conditions such that a forward tapered shape is formed by inhibiting isotropic etching in the etching process, or by the combination of these. Consequently, even when a forward tapered portion is formed, addition of any special step or the like is not required, and the formation thereof can be easily performed.

Moreover, in the case in which the forward tapered portion is formed by adjusting etching conditions, the conditions can be changed during the etching. Therefore, even when the forward tapered portion is provided only partially or when taper shapes with two or more different cone angles are combined, such a structure can be easily produced only by one etching process.

Additionally, the solid-state imaging device and the fabrication method therefor described in this embodiment can be applied to solid-state imaging devices having a waveguide structure regardless of the type of device, e.g., a CCD (Charge Coupled Device) type or a CMOS (Complementary Metal Oxide Semiconductor) type.

In this embodiment, the present invention has been described with reference to the preferred examples. However, it is to be understood that the present invention is not limited to this embodiment. In particular, the light-receiving section 1, the planar shape of the waveguide 20, the multi-layered wiring structure, etc. described are only specific examples.

Embodiment 2

Next, a method for fabricating a solid-state imaging device according to a second embodiment (hereinafter referred to as "Embodiment 2") of the present invention will be described. FIGS. 13A to 13K are sectional side elevations illustrating a method for fabricating a solid-state imaging device according to Embodiment 2 of the present invention. In order to facilitate the description, the configurations of the element region, element isolation region, etc., provided on the silicon substrate as a base are not shown in the drawings.

Figure 13A:
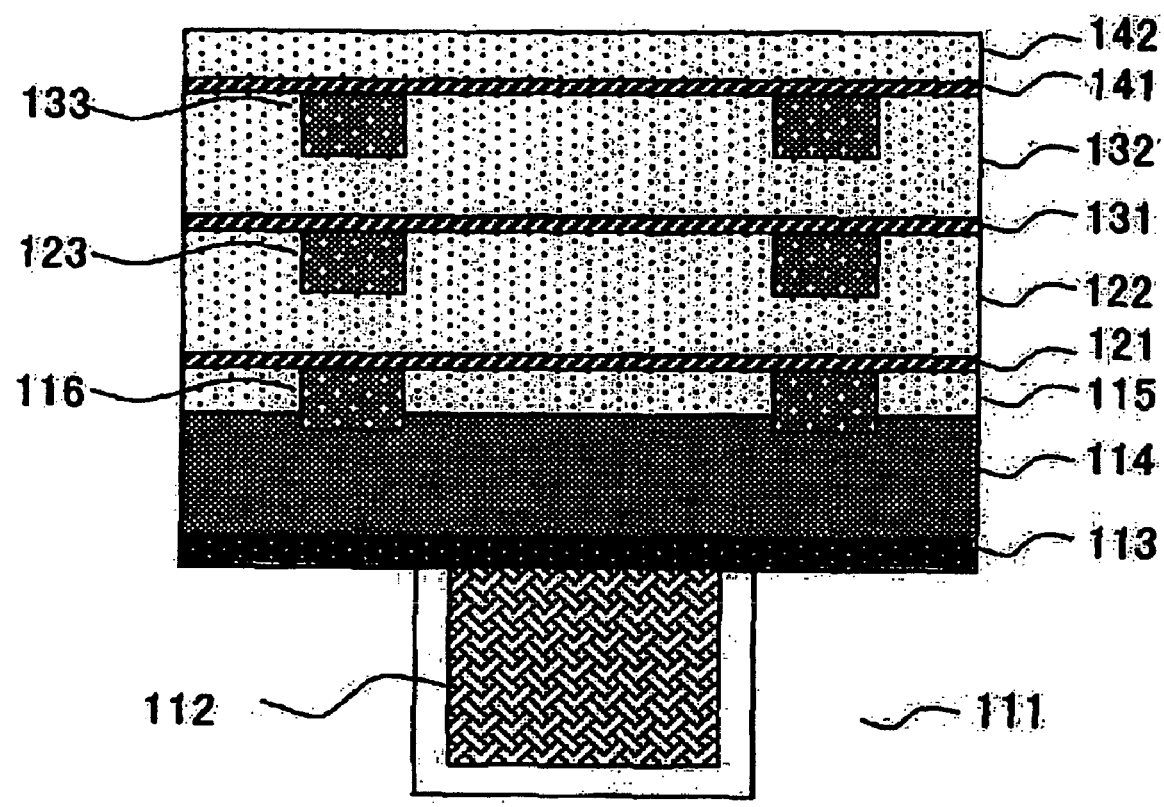
FIGS. 13A to 13K are sectional side elevations illustrating a method for fabricating a solid-state imaging device according to Embodiment 2 of the present invention.
Figure 13B:
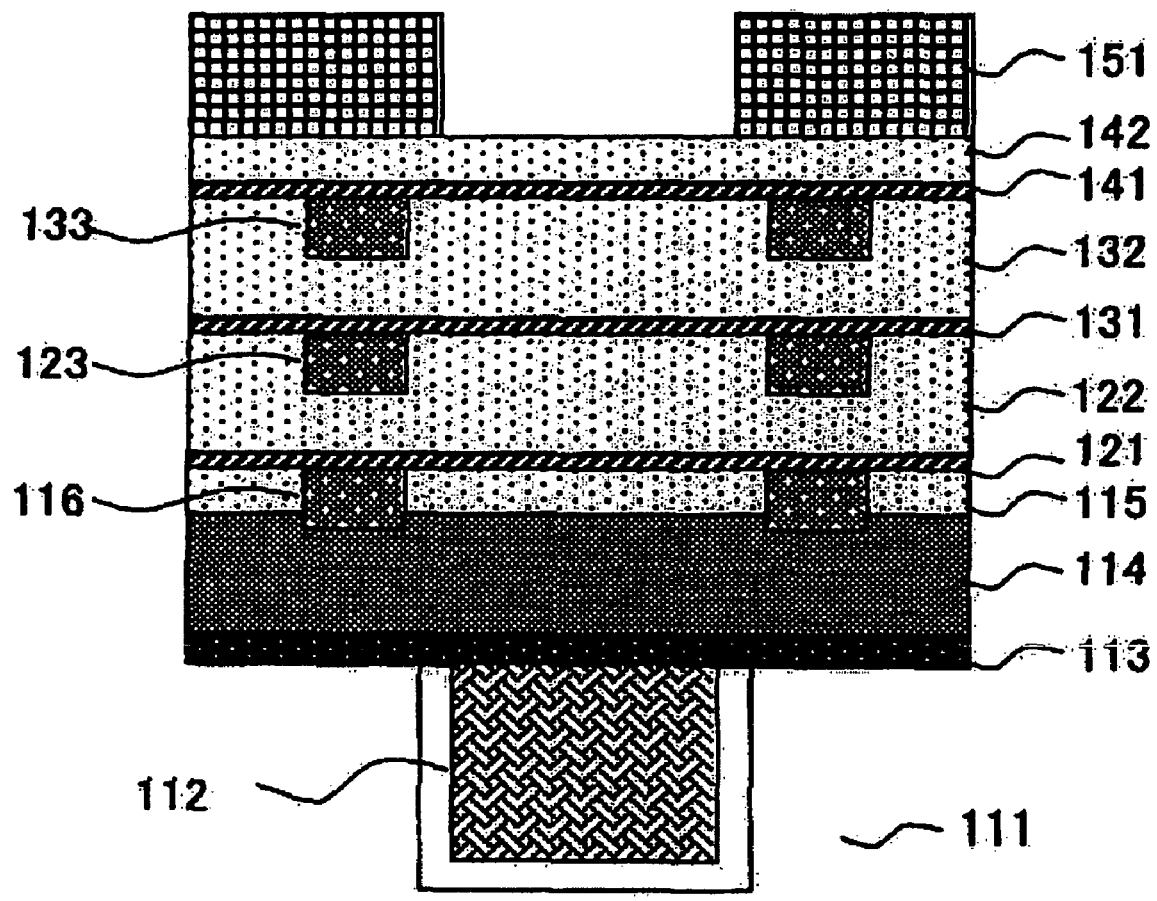

In Embodiment 2, as shown in FIG. 13A, a silicon substrate 111 is provided with a diode 112 which performs photoelectric conversion, a SiN film 113, a poly-interlayer film 114, first signal lines 116, an interlayer film 115 for the first signal lines, a diffusion prevention film 121 composed of copper (Cu) applied to the first wiring, an interlayer film 122 between the first signal lines and second signal lines, second signal lines 123, a diffusion prevention film 131 composed of Cu applied to the second wiring, an interlayer film 132 between the second signal lines and third signal lines, third signal lines 133, a diffusion prevention film 141 composed of Cu applied to the third wiring, and an interlayer film 142 between the third wiring and signal lines disposed thereabove. First, as shown in FIG. 13B, in order to form a portion serving as a waveguide by lithography, patterning of a resist layer 151 which serves as a mask is performed. In this example, all the interlayer films are composed of SiO2. The poly-interlayer film 114 has a thickness of 450 nm, the interlayer film 115 for the first signal lines has a thickness of 150 nm, each of the interlayer film 122 between the first signal lines and the second signal lines and the interlayer film 132 between the second signal lines and the third signal lines has a thickness of 200 nm, and the interlayer film 142 on the third wiring has a thickness of 300 nm. The signal lines 116, 123, and 133 are all composed of Cu, and each have a thickness of 200 nm. The Cu diffusion prevention films 121 and 141 are both composed of SiC, and each have a thickness of 50 nm. The SiN film 113 in the bottom has a thickness of 50 nm.

Figure 13C:
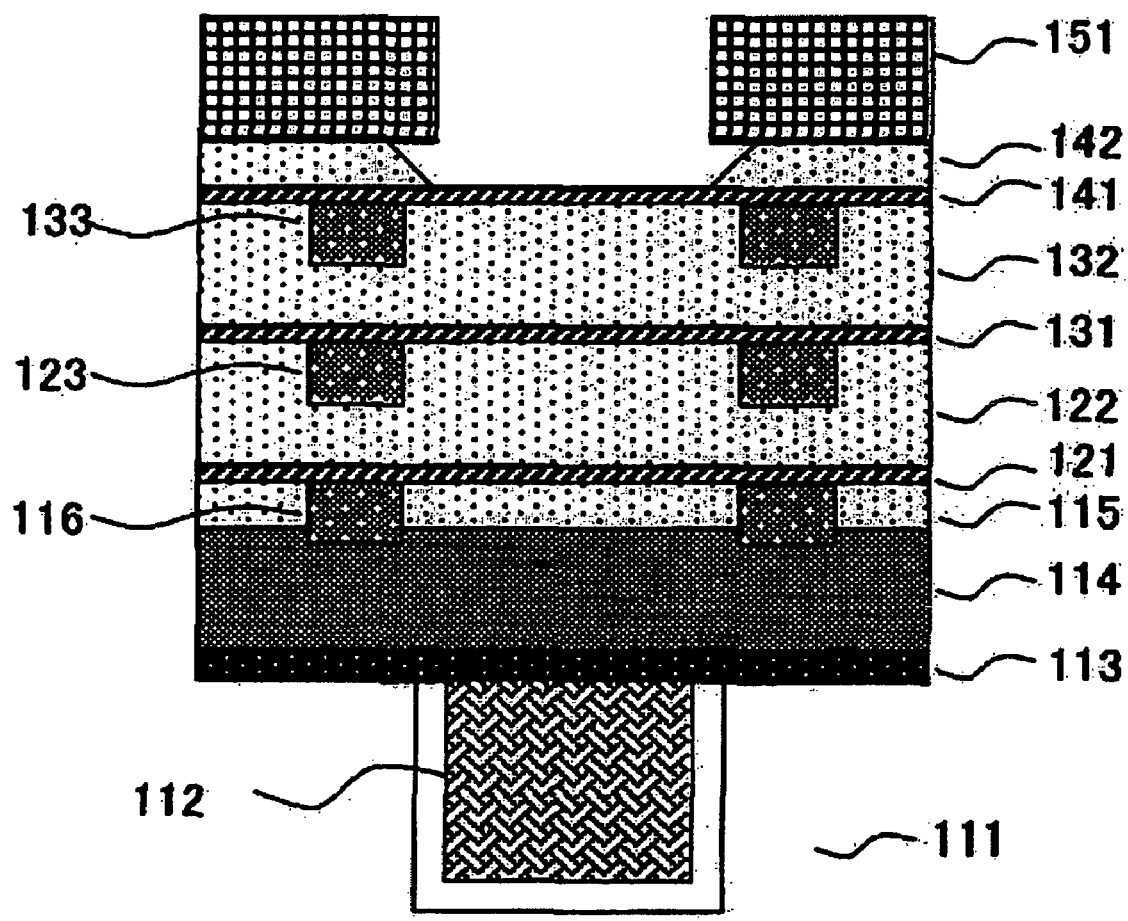
Figure 13D:
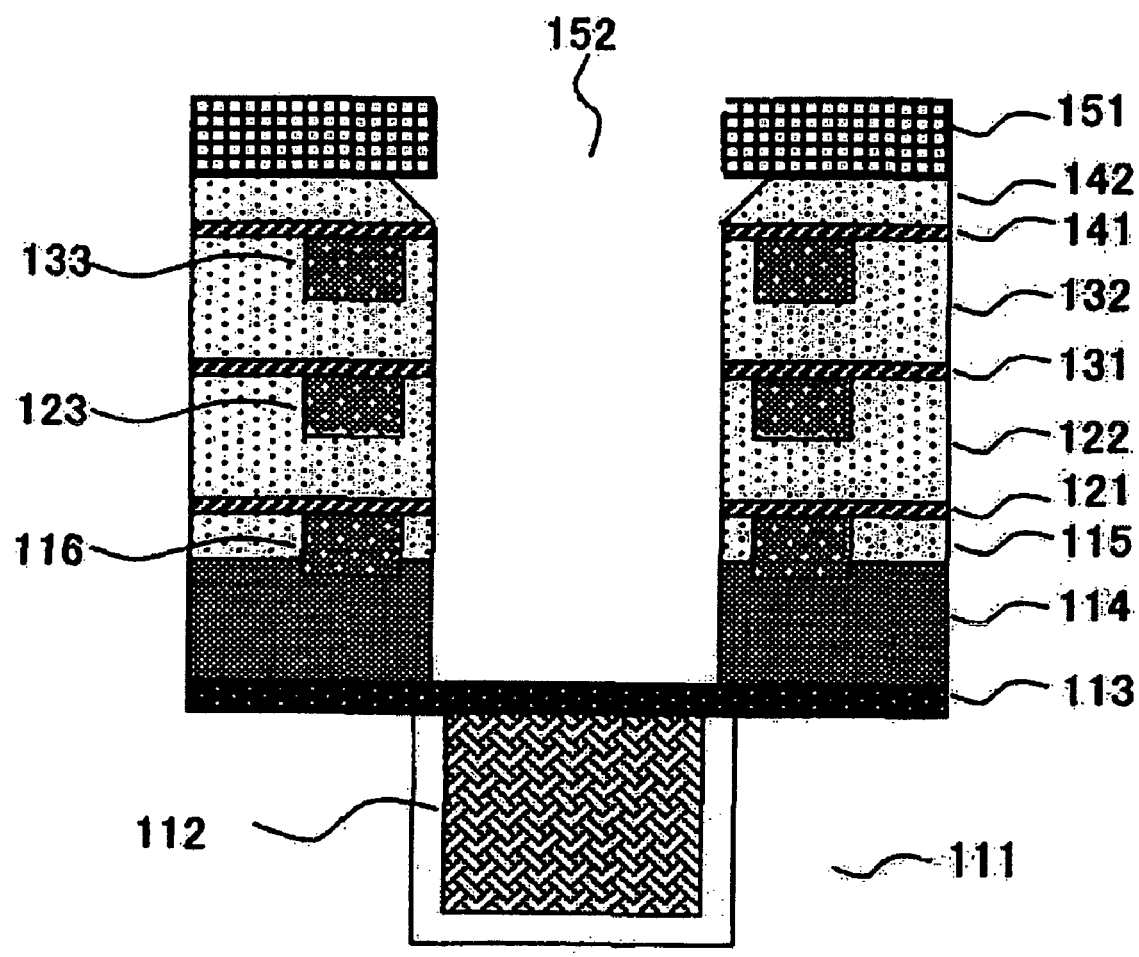

After the patterning of the resist layer 151, as shown in FIG. 13C, the interlayer 142 on the top wiring layer is isotropically processed. Furthermore, as shown in FIG. 13D, the interlayer films in the region for forming the waveguide are processed by anisotropic etching to form a waveguide 152.

Figure 13E:
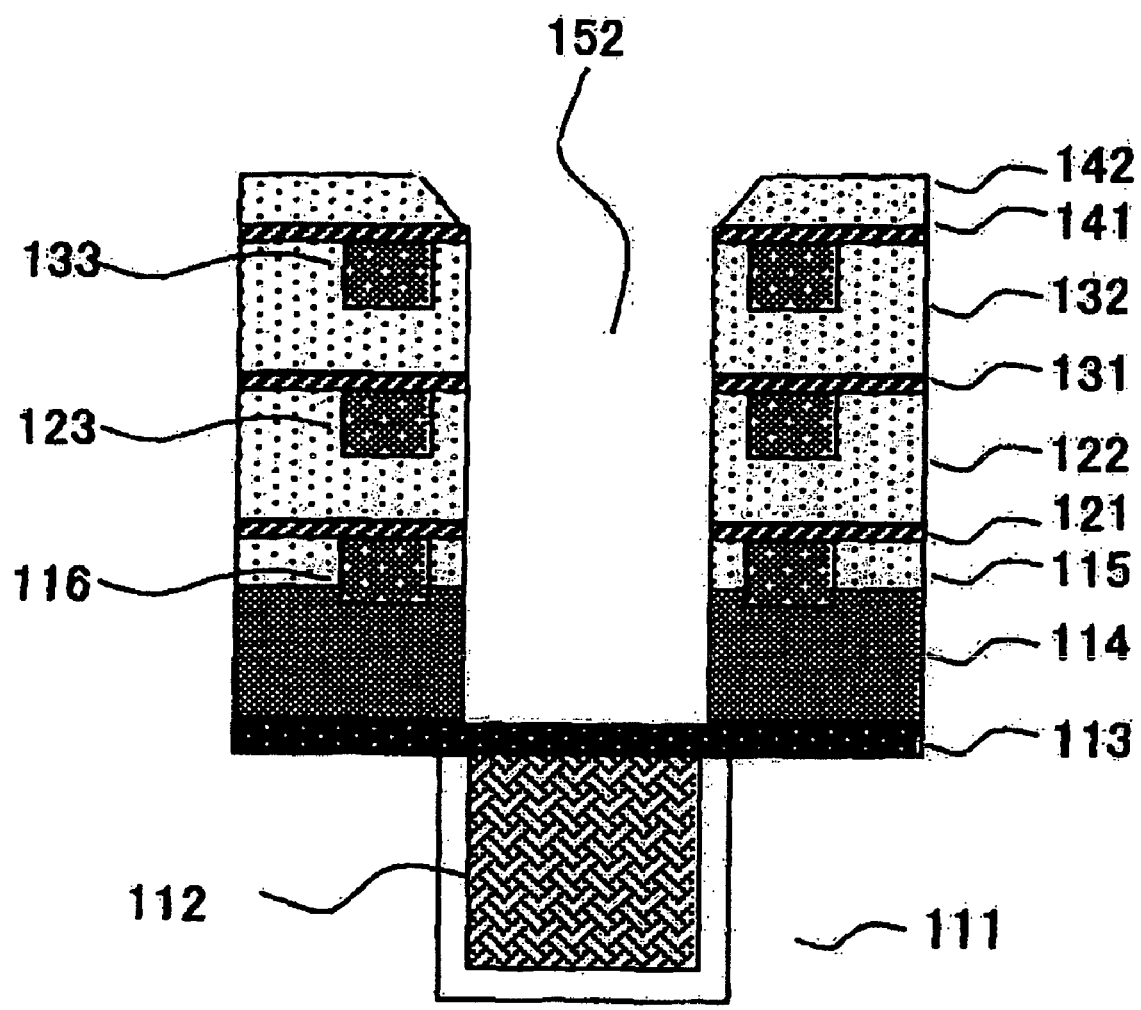
Figure 13F:
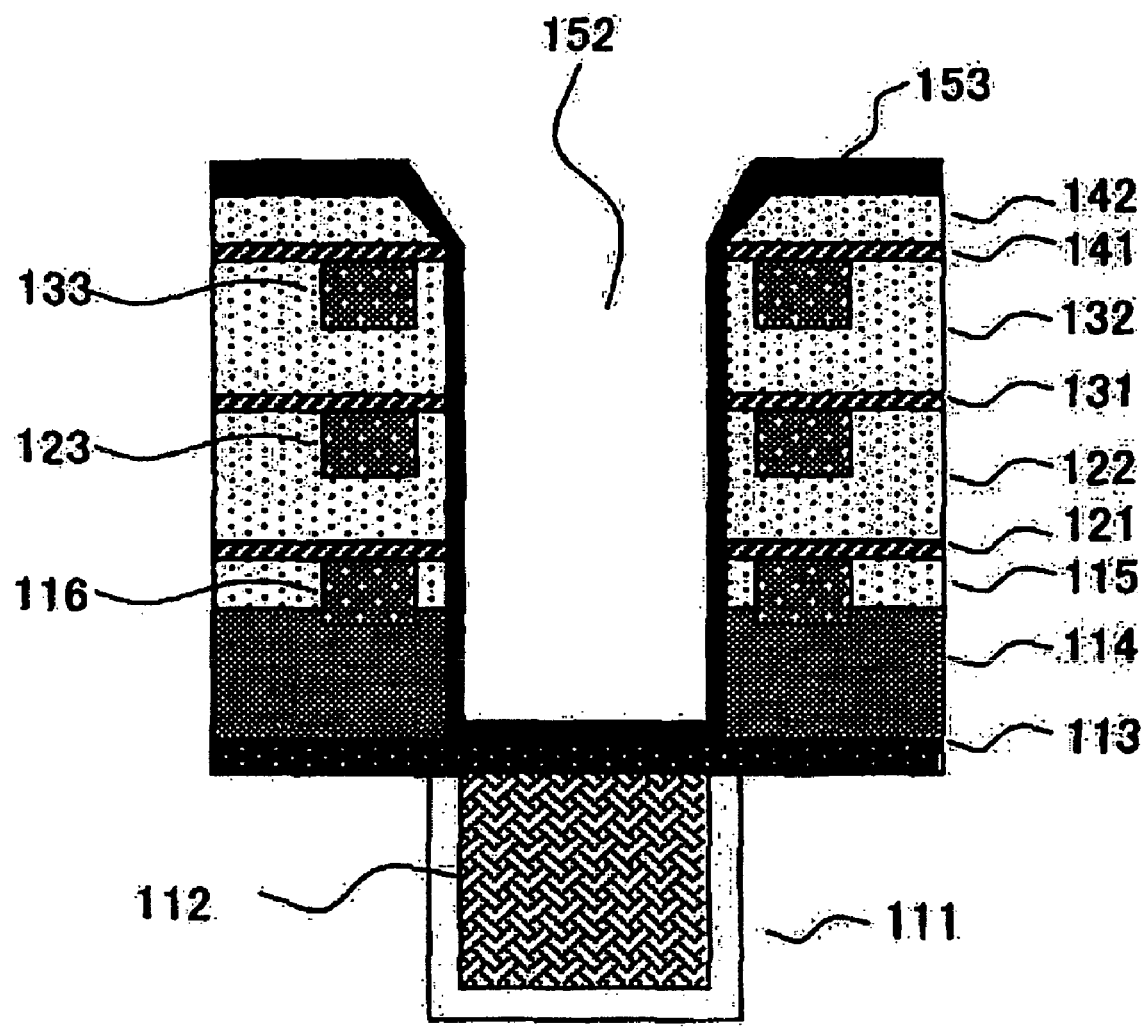
Figure 13G:
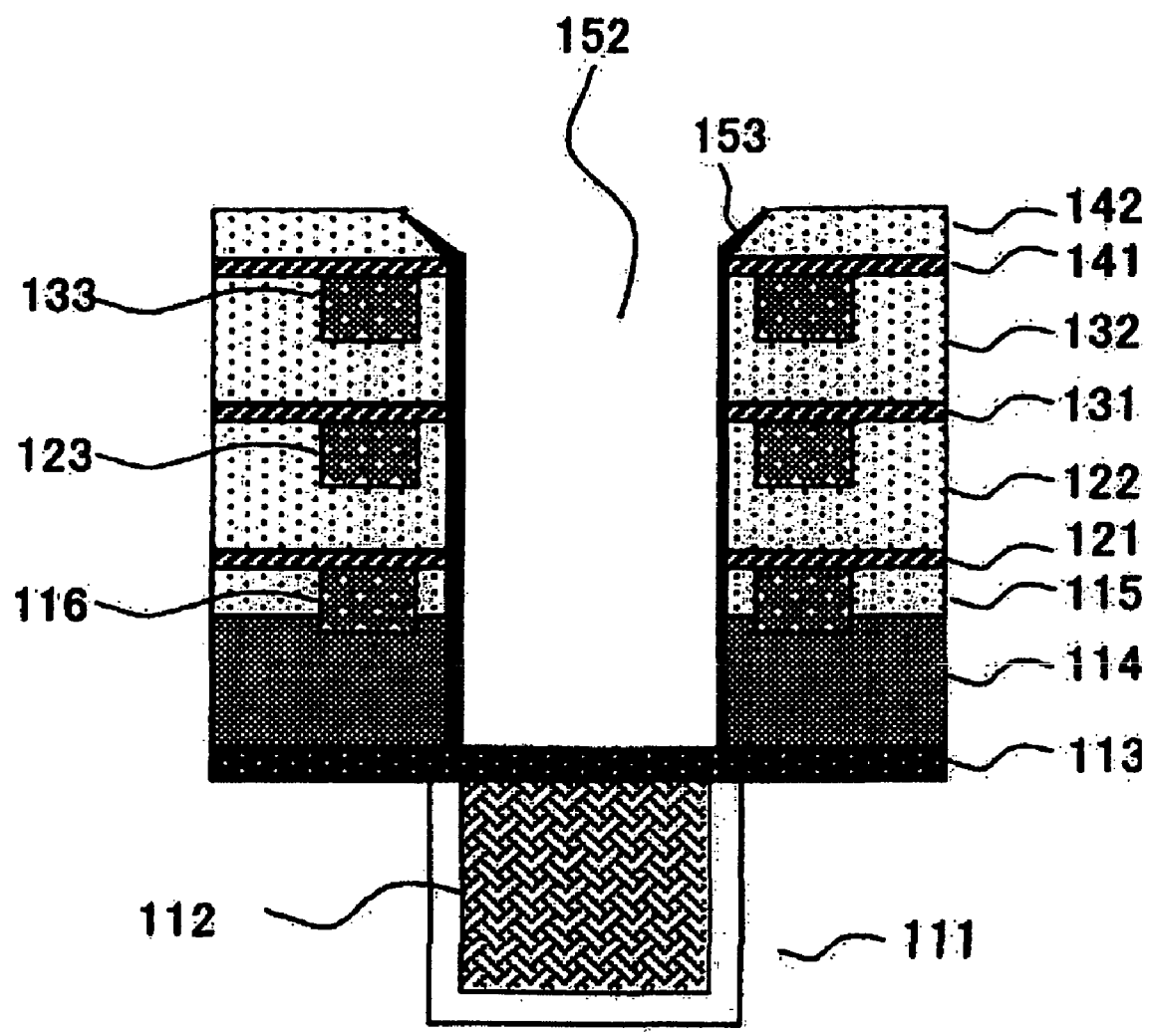

After the formation of the waveguide 152, as shown in FIG. 13E, the resist layer 151 used in lithography is removed. Subsequently, as shown in FIG. 13F, a metal film 153 for forming an outer tube of the waveguide is deposited at a thickness of 50 nm, and then, as shown in FIG. 13G, by etching back the entire surface of the metal film 153, the metal film 153 for forming the outer tube is allowed to remain only on the side face. In this example, aluminum is used for the metal film 153. However, it may be possible to employ a clad structure in which a low-refractive-index film is used as the sidewall and the inside is embedded with a high-refractive-index film.

Figure 13H:
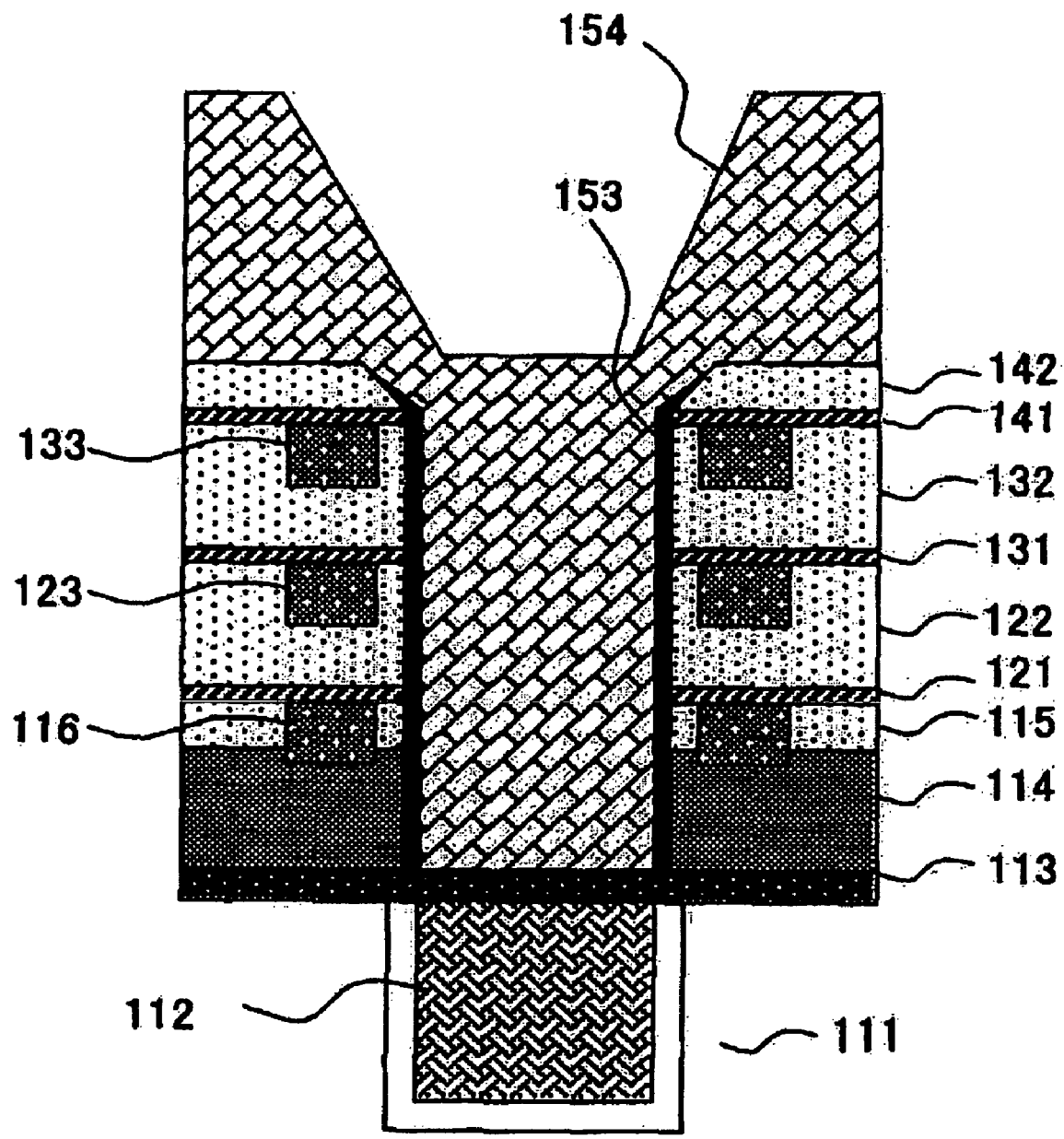

Subsequently, as shown in FIG. 13H, an insulating film 154 is embedded in the waveguide 152 by high-density plasma CVD. The insulating film 154 is a transparent film that transmits visible light. Specifically, an ordinary SiO2 film is used in this example.

Figure 13I:
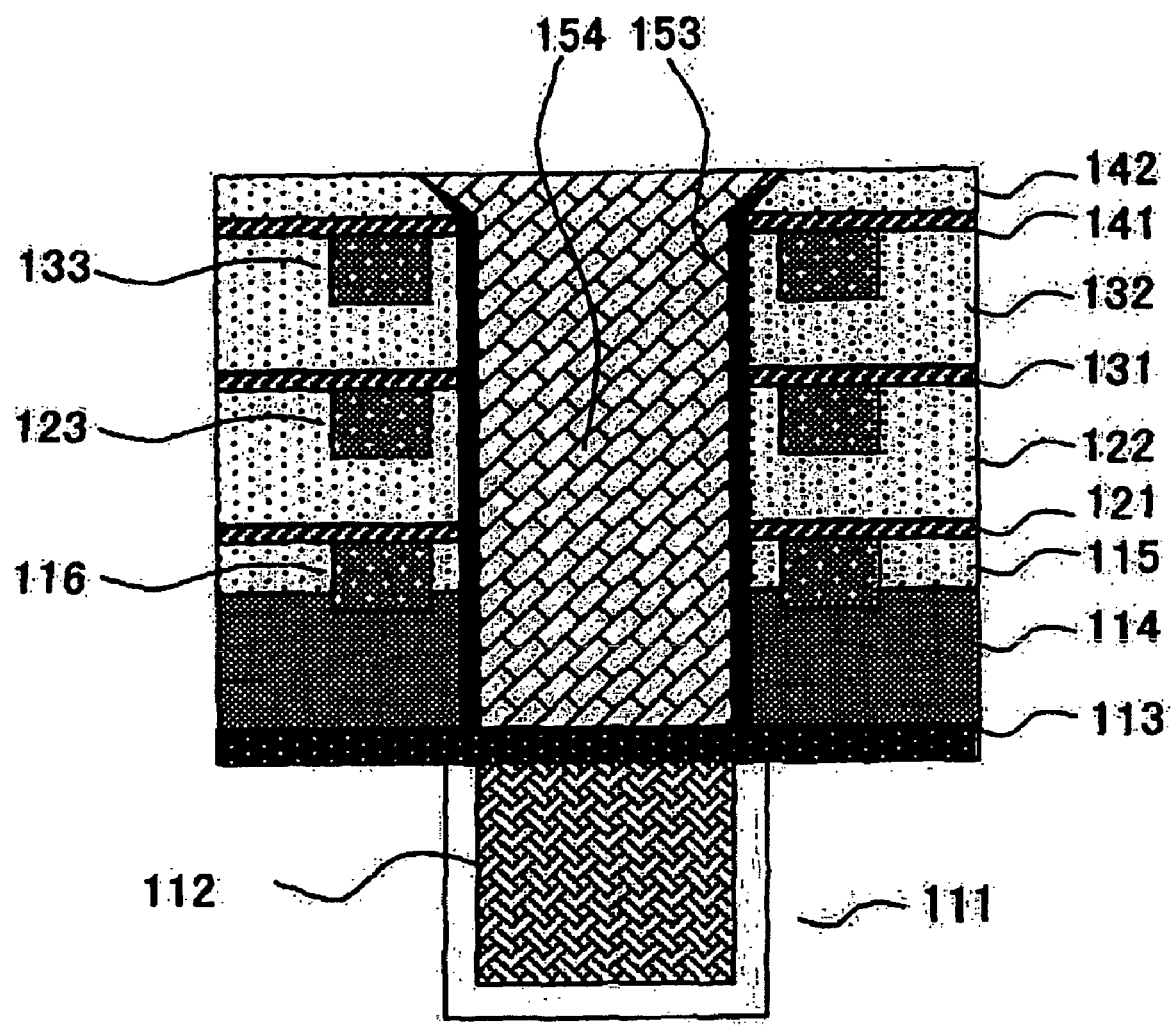

After the insulating film 154 is embedded, as shown in FIG. 13I, planarization is performed by CMP to remove the insulating film 154 formed to the region other than the waveguide.

Although an example in which high-density plasma CVD is used to embed the transparent insulating film 154 in the waveguide 152 has been described above, the transparent insulating film 154 may be embedded by other method, for example, a coating method. In such a case, if planarization is simultaneously achieved by the coating method, the planarization process using CMP can be eliminated.

Figure 13J:
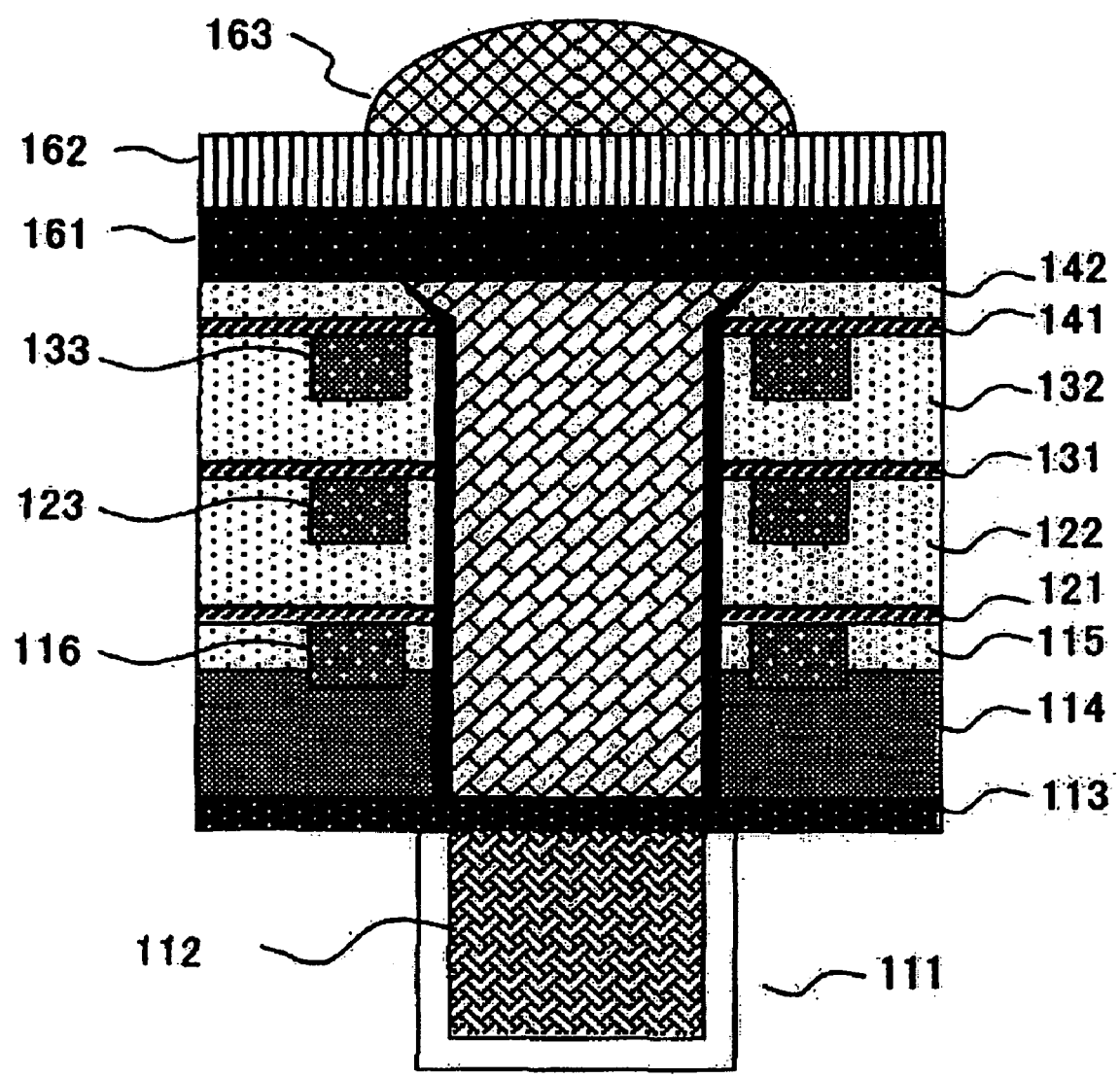

The method for fabricating the solid-state imaging device in Embodiment 2 has been described above. In the subsequent step, an on-chip lens may be formed in order to allow a sufficient amount of light to enter the waveguide 152. That is, as shown in FIG. 13J, a SiN film 161, a color filter 162, and an on-chip lens 163 may be formed on the planarized transparent insulating film 154.

Figure 13K:
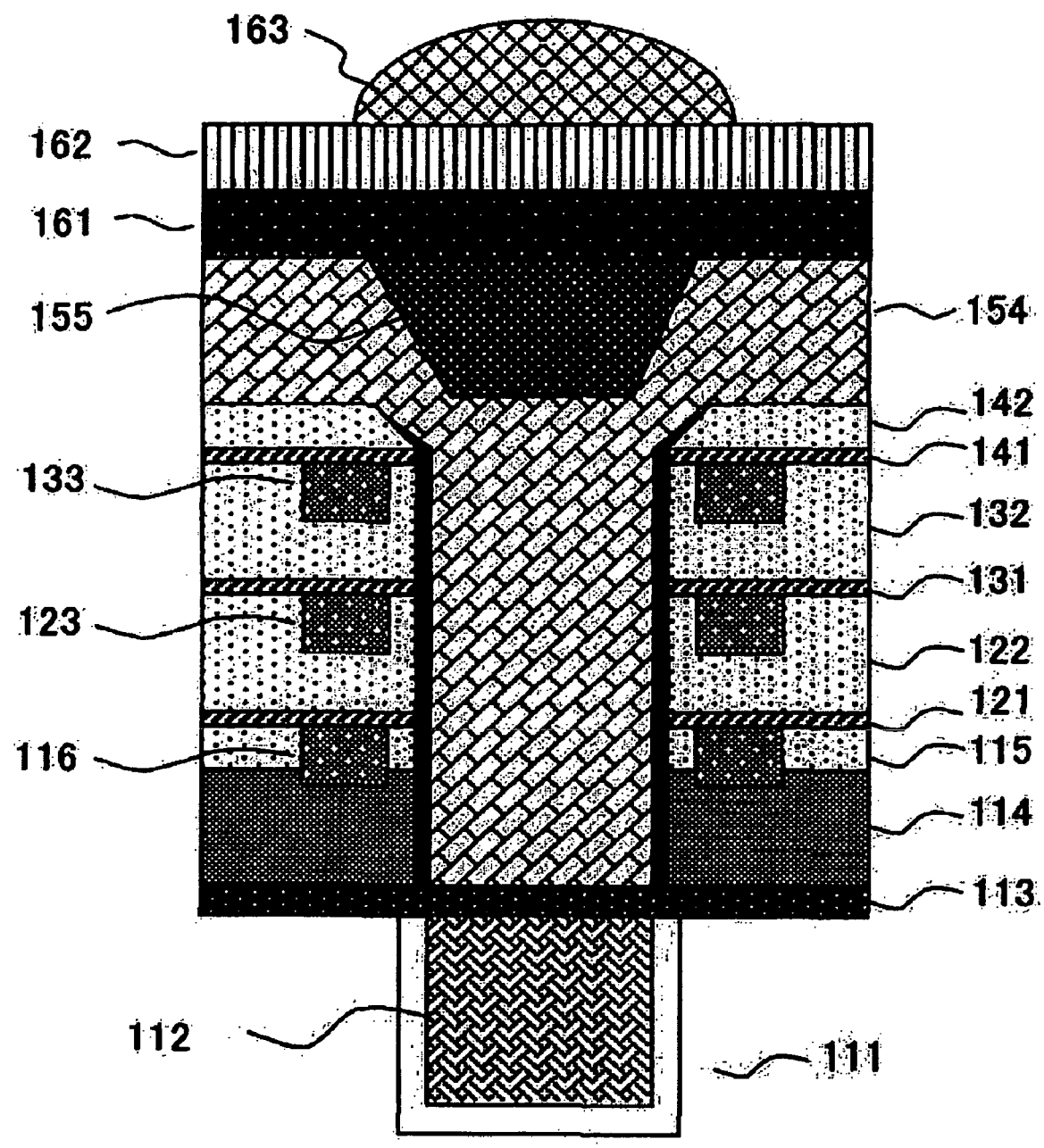

In the example described above, the transparent insulating film 154 is embedded by high-density plasma CVD and then planarization is performed by CMP. However, as shown in FIG. 13K, without performing planarization by CMP, a film 155 composed of a material having a higher refractive index than the embedded insulating film 154, for example, composed of SiN, may be formed thereon, and subsequently, the film 155 may be planarized by an etch-back process or CMP so that the film 155 remains only above the waveguide to form a concave lens, thus allowing light being efficiently concentrated on the waveguide.

Furthermore, in Embodiment 2, although an example in which the metal film 153 is formed directly after a portion for forming the waveguide is opened, it may be possible to form the metal film 153 after an insulating film is formed, for example, with a thickness of 50 nm. In such a case, dielectric strength between the waveguide and the signal lines is easily ensured.

Embodiment 3

Next, a method for fabricating a solid-state imaging device according to a third embodiment (hereinafter referred to as "Embodiment 3") of the present invention will be described. FIGS. 14A to 14K are sectional side elevations illustrating a method for fabricating a solid-state imaging device according to Embodiment 3 of the present invention. Here, in order to facilitate the description, the configurations of the element region, element isolation region, etc., provided on the silicon substrate as a base are not also shown in the drawings.

Figure 14A:
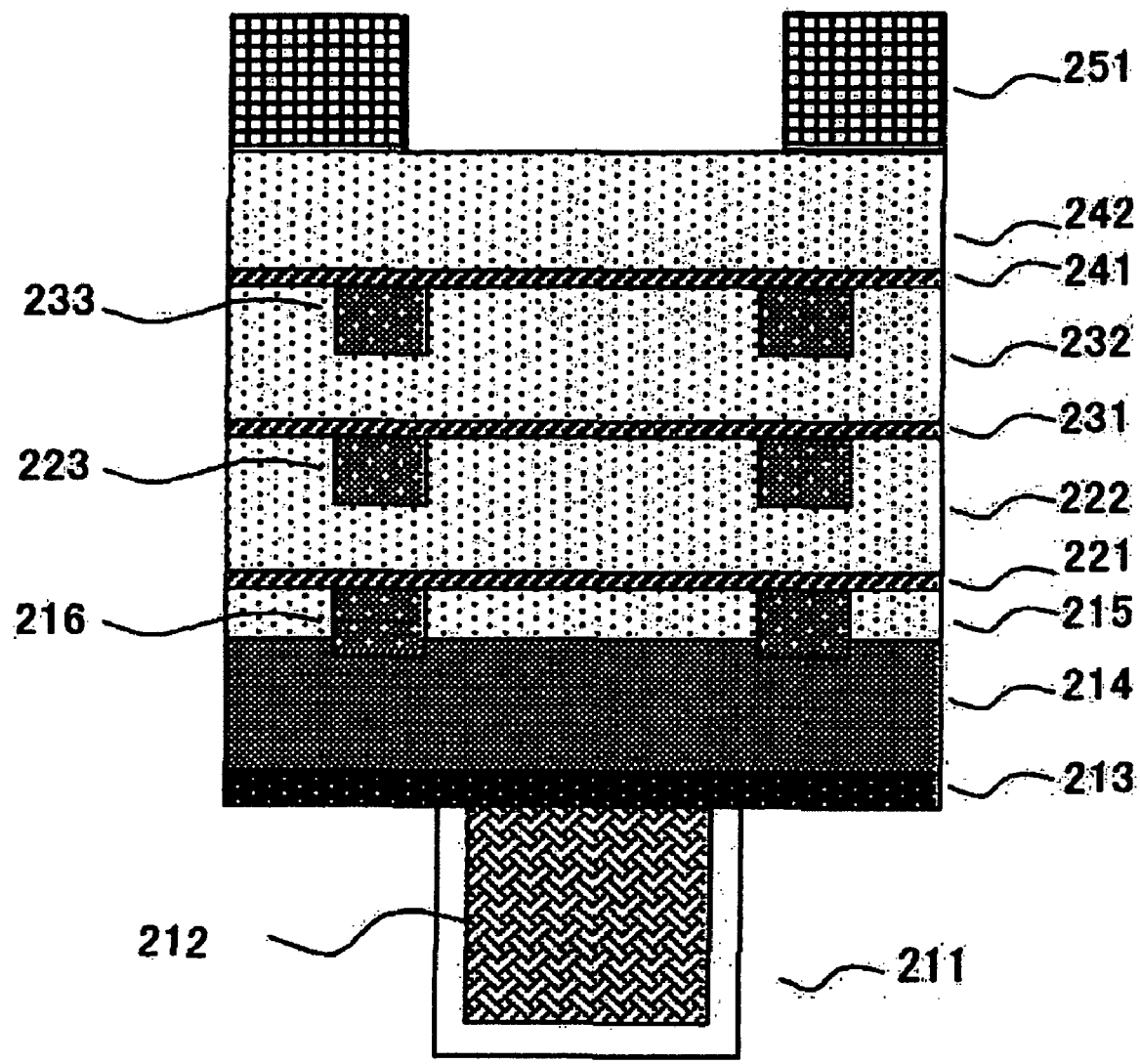
FIGS. 14A to 14K are sectional side elevations illustrating a method for fabricating a solid-state imaging device according to Embodiment 3 of the present invention.

In Embodiment 3, a silicon substrate 211 is provided with a diode 212 which performs photoelectric conversion, a SiN film 213, a poly-interlayer film 214, first signal lines 216, an interlayer film 215 between the first signal lines, a diffusion prevention film 221 composed of Cu applied to the first wiring, an interlayer film 222 between the first signal lines and second signal lines, second signal lines 223, a diffusion prevention film 231 composed of Cu applied to the second wiring, an interlayer film 232 between the second signal lines and third signal lines, third signal lines 233, a diffusion prevention film 241 composed of Cu applied to the third wiring, and an interlayer film 242 between the third wiring and signal lines disposed thereabove. First, as shown in FIG. 14A, in order to form a portion serving as a waveguide by lithography, patterning of a resist layer 251 which serves as a mask is performed. The interlayer and wiring configurations are the same as those in Embodiment 2.

Figure 14B:
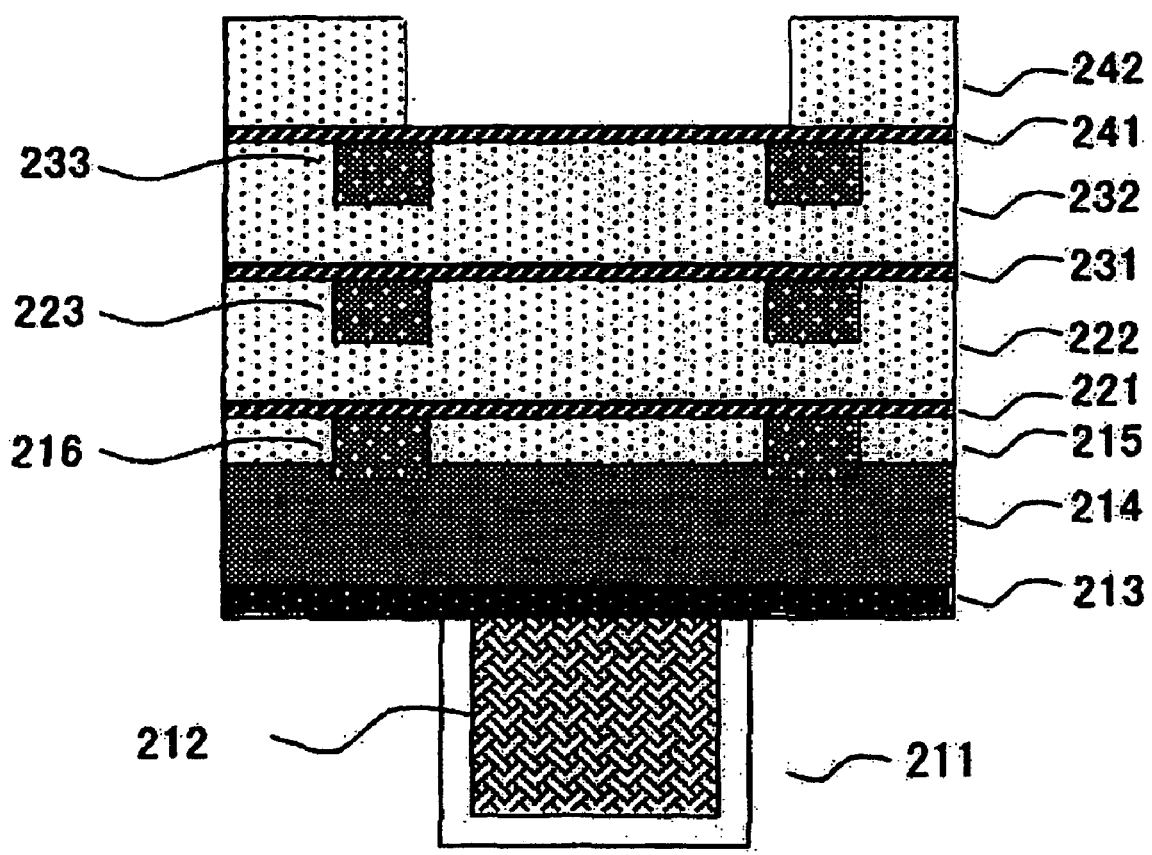

After the patterning of the resist layer 251, as shown in FIG. 14B, the interlayer 242 on the top wiring layer is processed. Specifically, an opening is formed in the interlayer 242 on the top wiring layer so as to have a size covering partially or entirely the signal lines 216, 223, and 233.

Figure 14C:
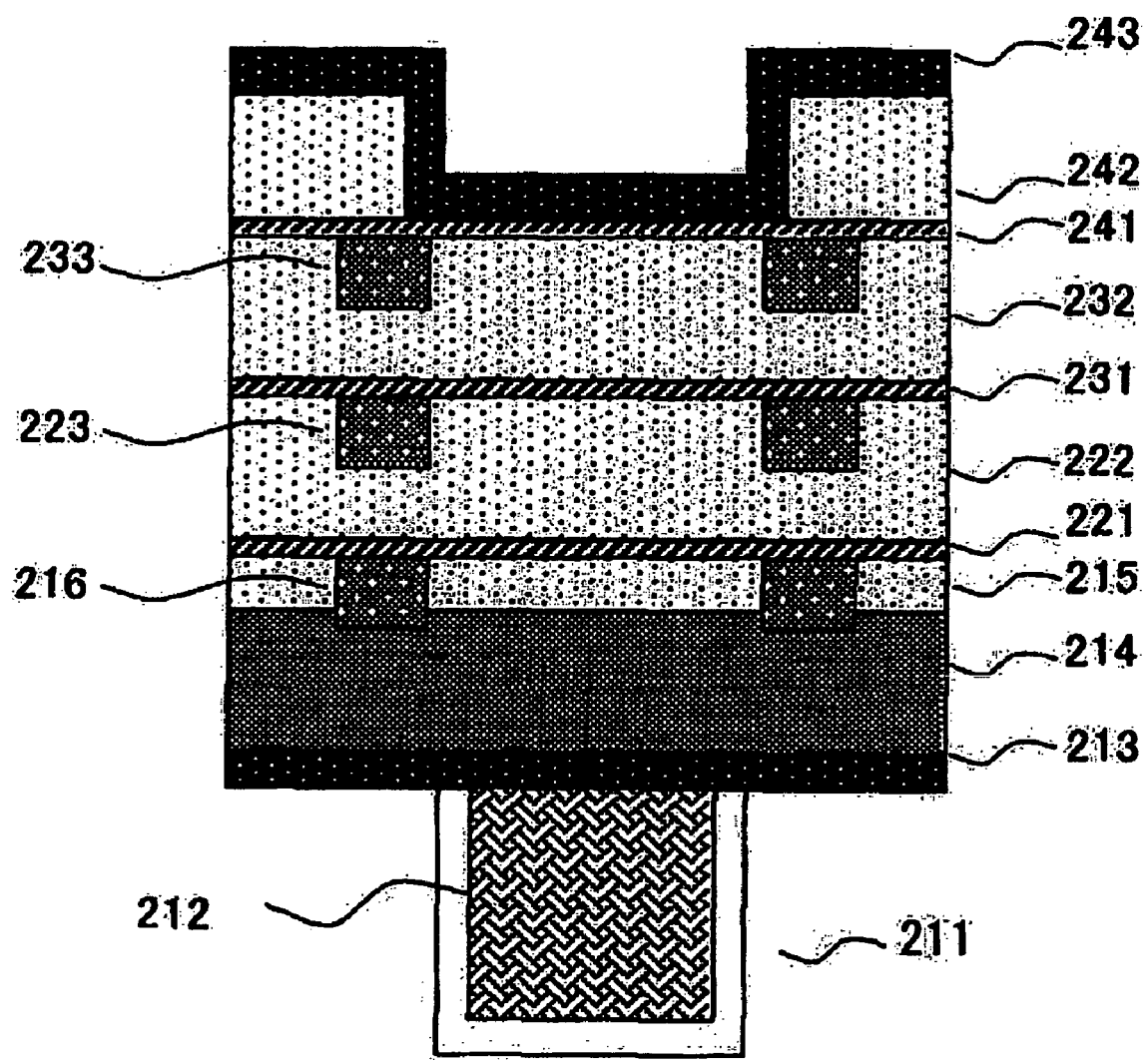
Figure 14D:
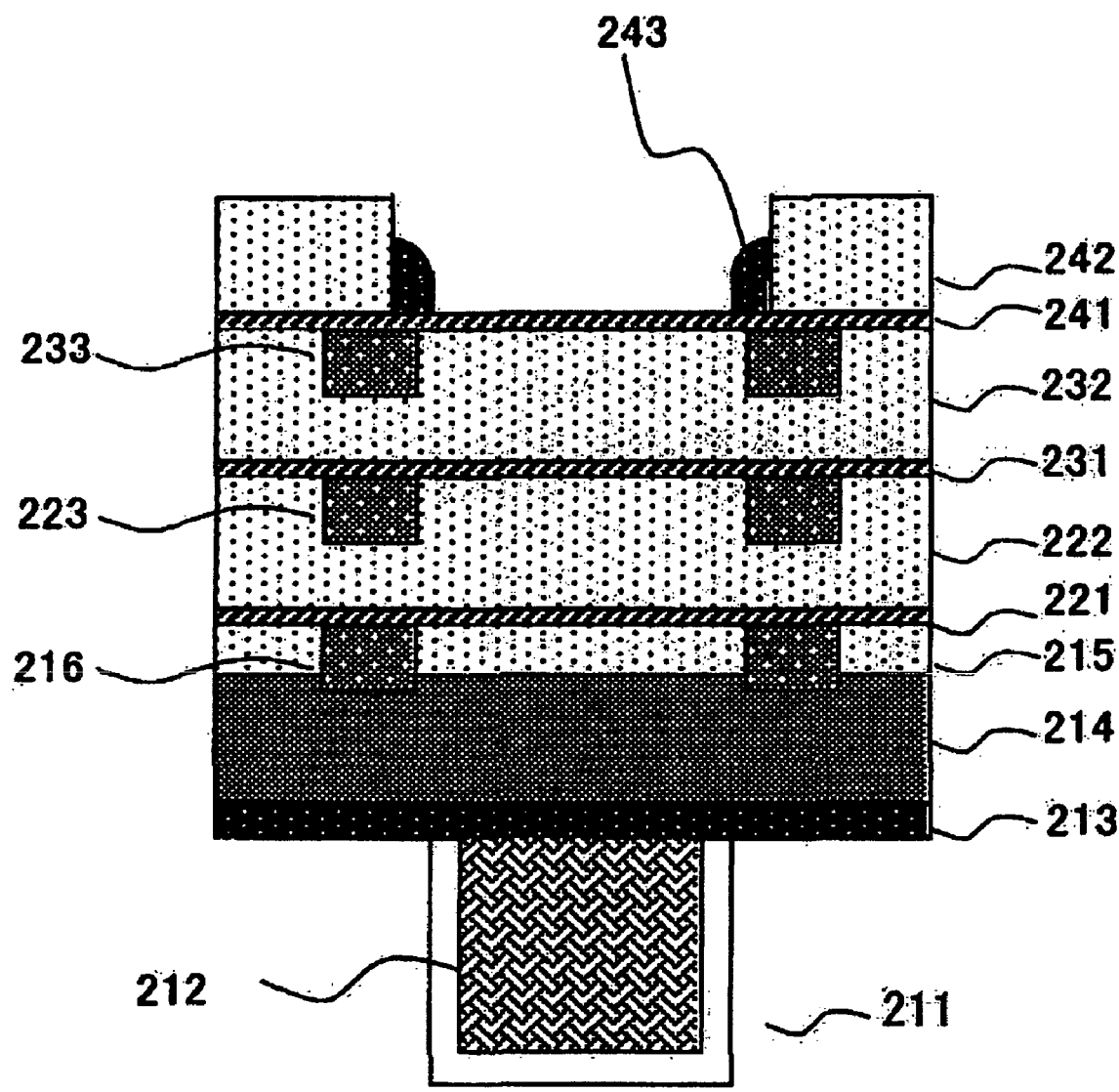

After the opening is formed, as shown in FIG. 14C, an insulating film 243 is formed, and furthermore, as shown in FIG. 14D, the insulating film 243 is subjected to RIE (Reactive Ion Etching) so that the insulating film 243 remains only on the side face of the opening. In this example, as the insulating film 243, a SiN film is deposited at a thickness of 200 nm.

Figure 14E:
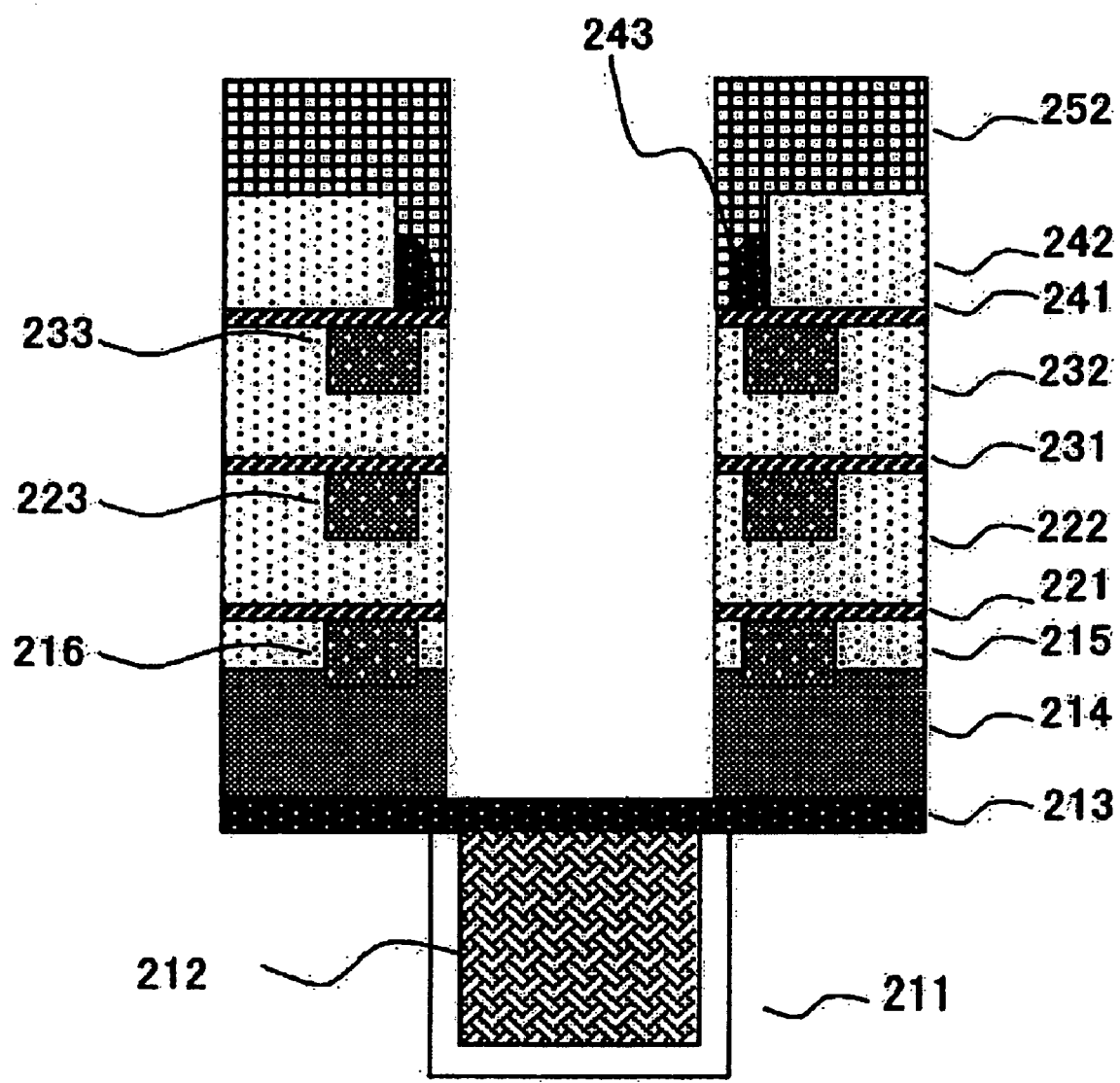

Subsequently, as shown in FIG. 14E, a waveguide is formed by lithography and RIE so as to have a distance that ensures sufficient dielectric strength from the signal lines 216, 223, and 233. In FIG. 14E, the reference numeral 252 represents a resist.

Figure 14F:
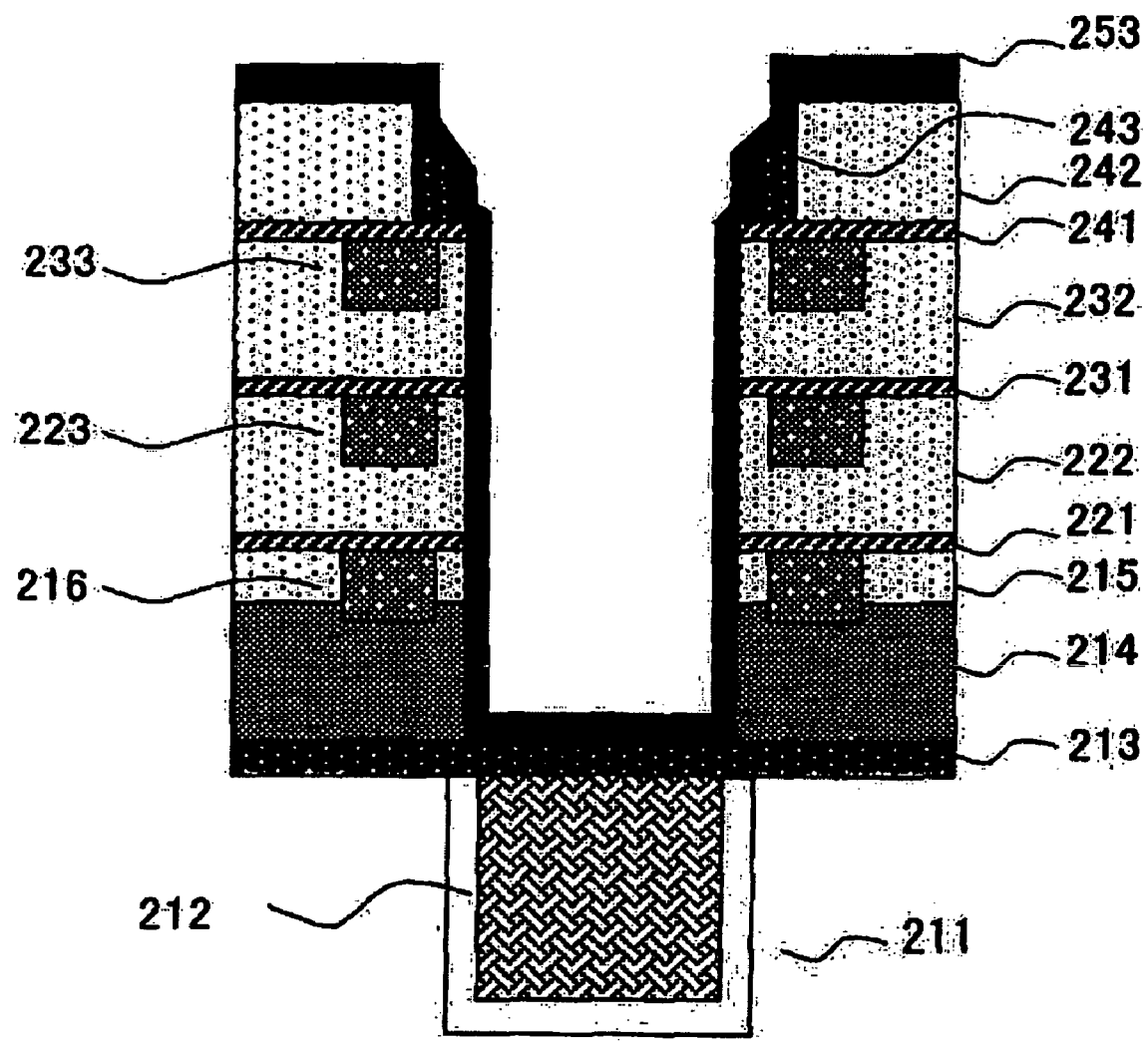
Figure 14G:
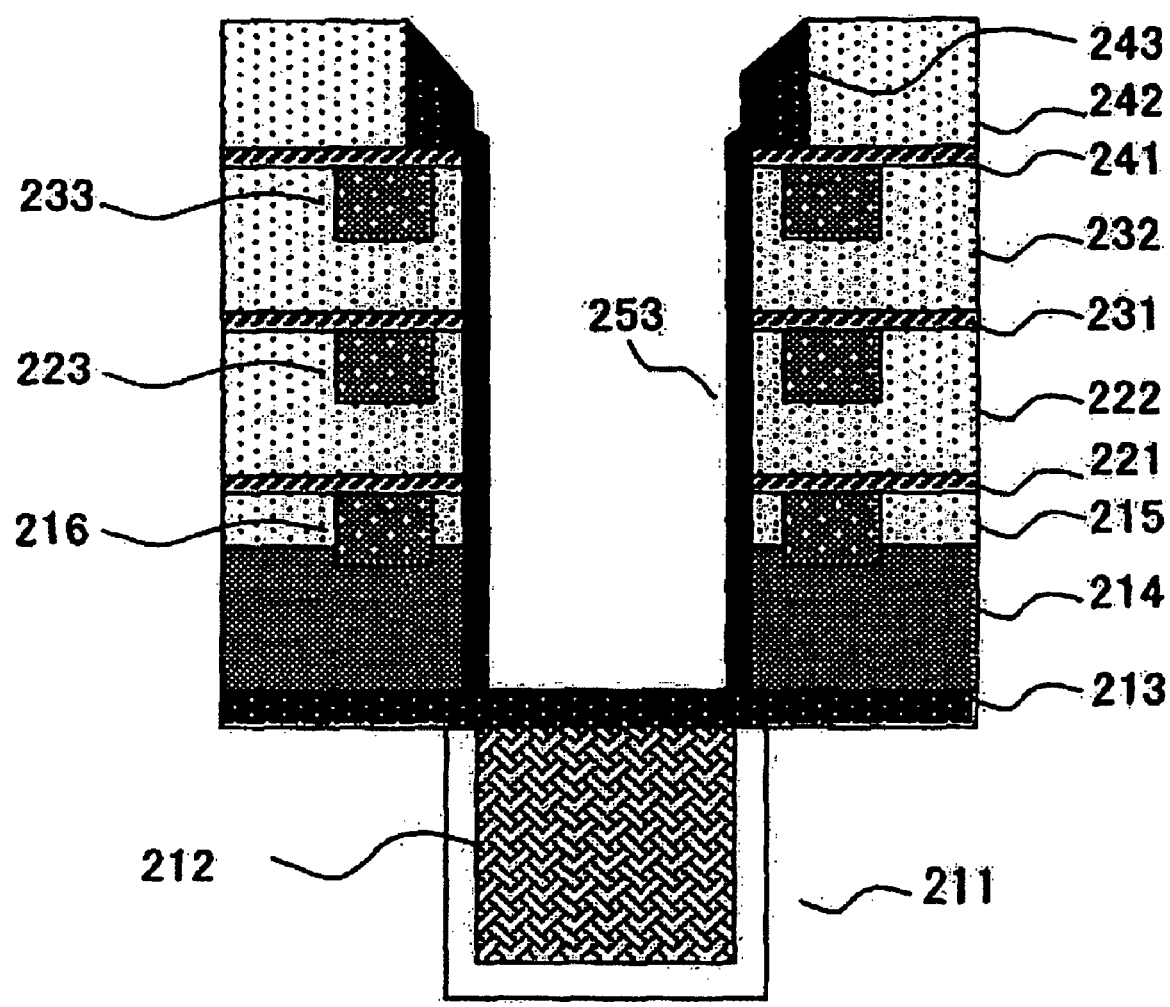

After the waveguide is formed, as shown in FIG. 14F, the resist 252 is stripped off, and then as a metal film 253 for forming an outer tube of the waveguide, for example, aluminum is deposited at a thickness of 5 nm. Subsequently, as shown in FIG. 14G, by etching back the entire surface of the metal film 253, the metal film 253 for forming the outer tube of the waveguide is allowed to remain only on the side face. Instead of using the aluminum film as the metal film 253, a clad structure may be employed in which a low-refractive-index film is used as the sidewall and the inside is embedded with a high-refractive-index film.

Figure 14H:
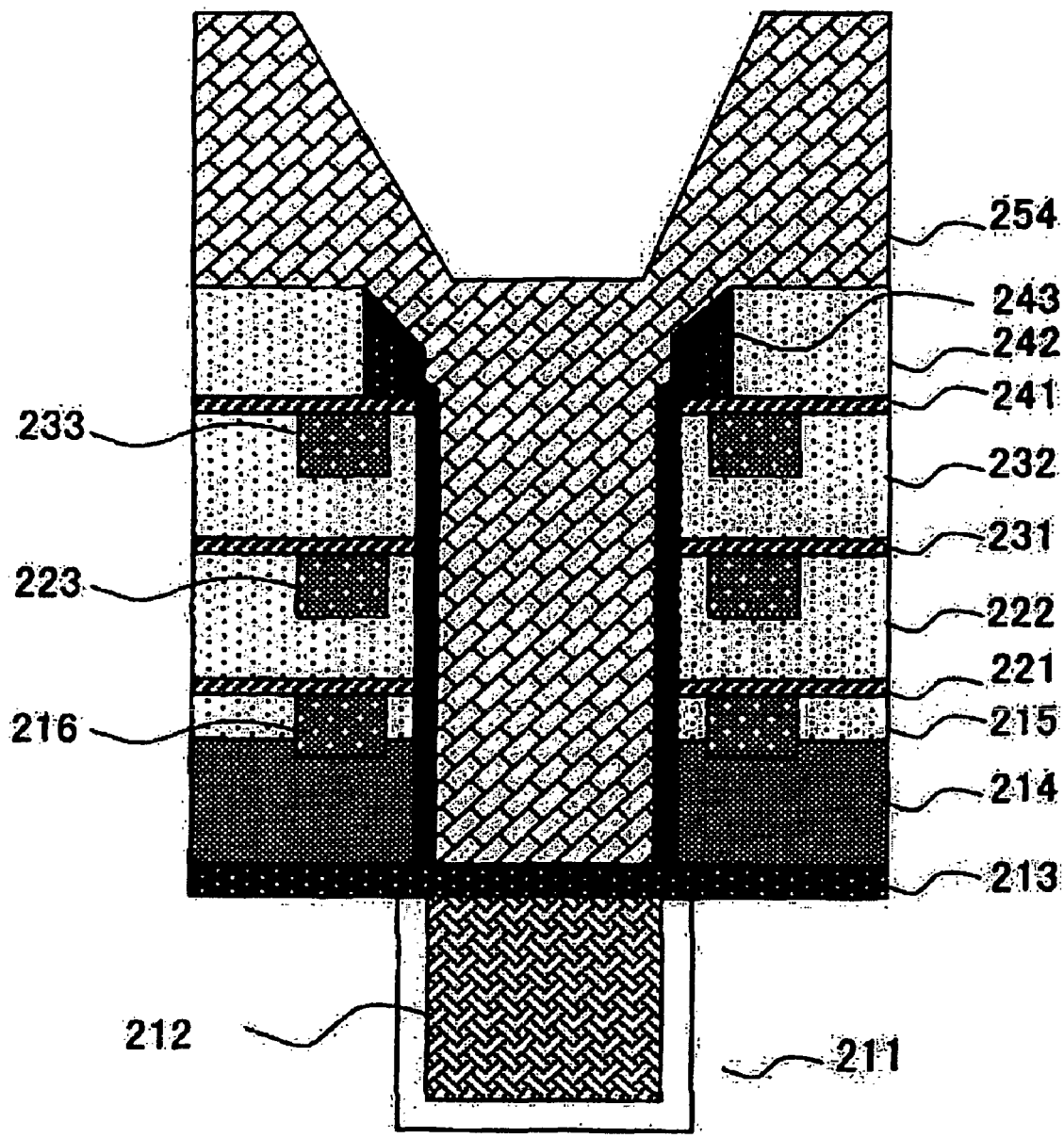

Subsequently, as shown in FIG. 14H, an insulating film 254 is embedded in the waveguide by high-density plasma CVD. The insulating film 254 is a transparent film that transmits visible light. Specifically, an ordinary SiO2 film is used in this example.

Figure 14I:
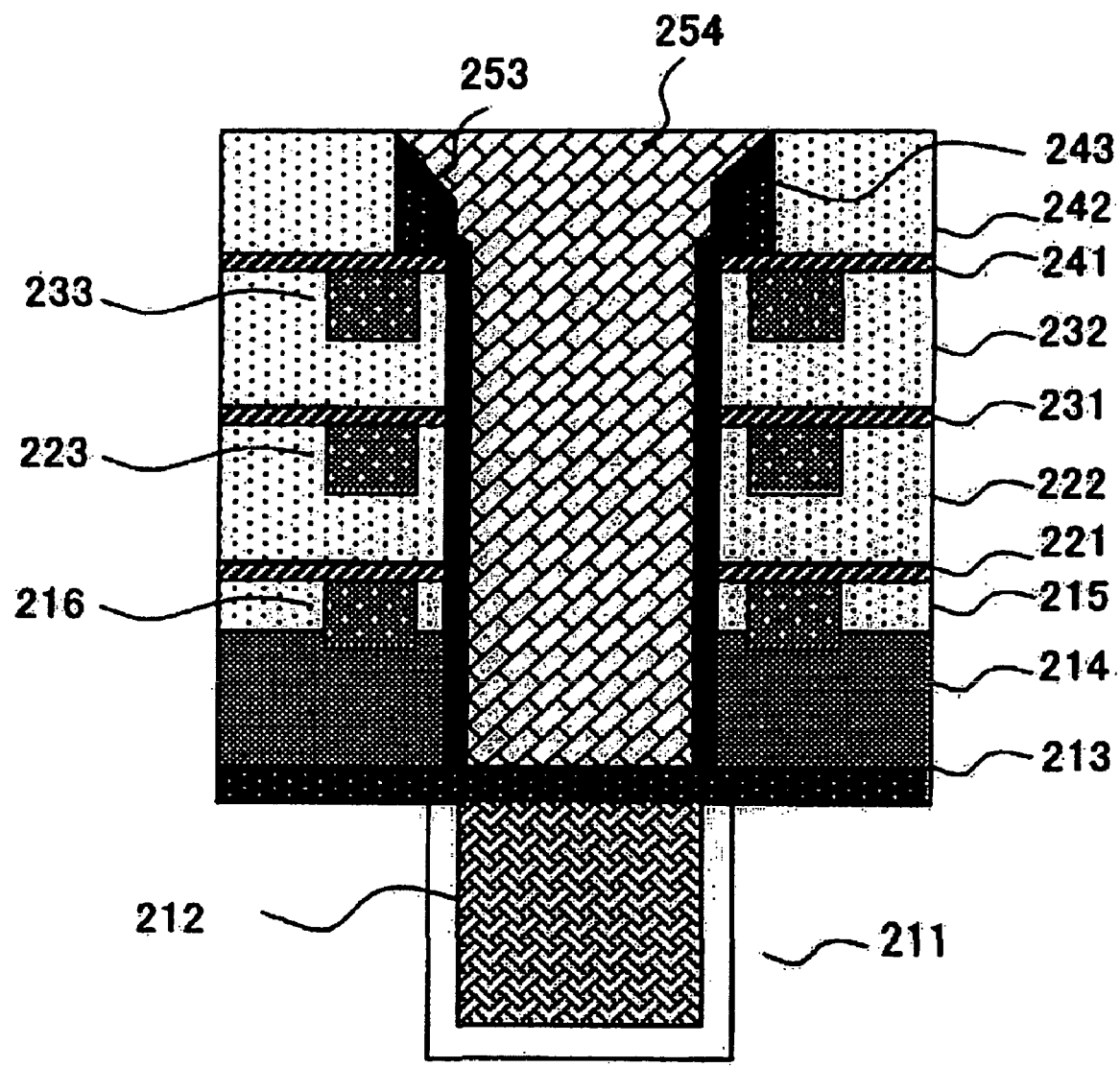

After the insulating film 254 is embedded, as shown in FIG. 14I, planarization is performed by CMP to remove the insulating film 254 formed in the region other than the waveguide.

Although an example in which high-density plasma CVD is used to embed the transparent insulating film 254 in the waveguide has been described above, the transparent insulating film 254 may be embedded by other method, for example, a coating method. In such a case, if planarization is simultaneously achieved by the coating method, the planarization process using CMP can be eliminated.

Figure 14J:
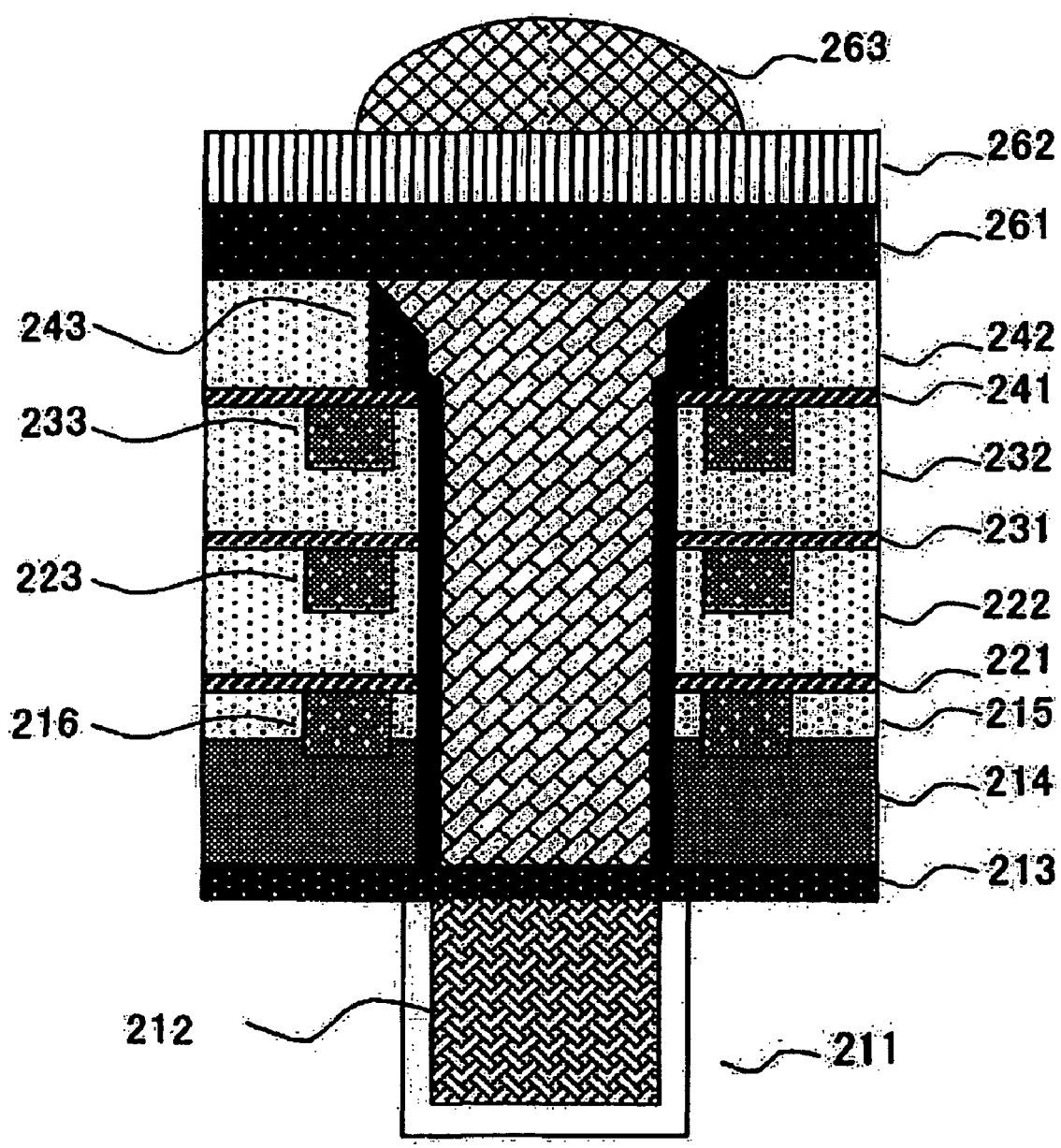

The method for fabricating the solid-state imaging device in Embodiment 3 has been described above. In the subsequent step, an on-chip lens may be formed in order to allow a sufficient amount of light to enter the waveguide. That is, as shown in FIG. 14J, a SiN film 261, a color filter 262, and an on-chip lens 263 may be formed on the planarized transparent insulating film 254.

Figure 14K:
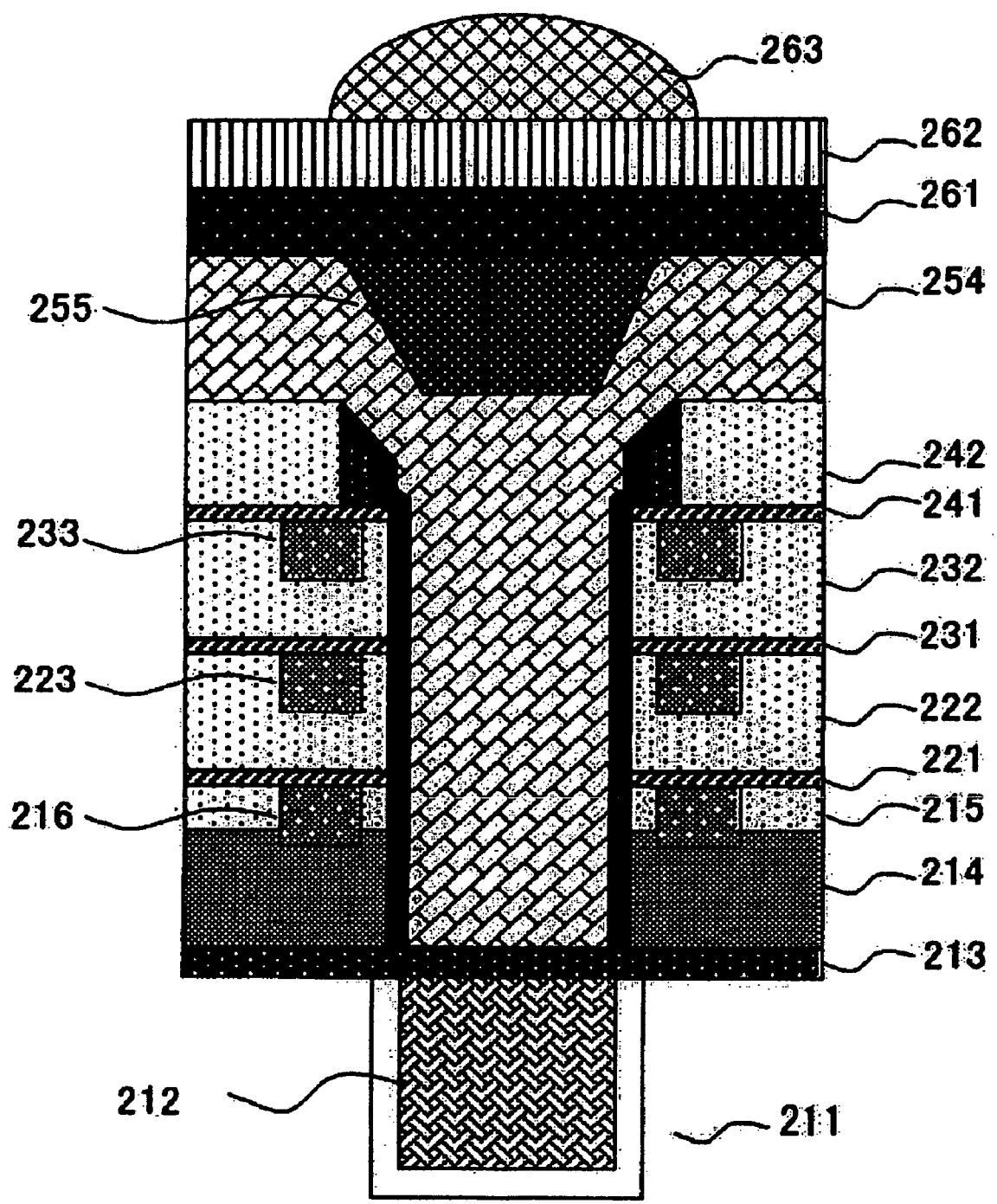

In the example described above, the transparent insulating film 254 is embedded by high-density plasma CVD and then planarization is performed by CMP. However, as shown in FIG. 14K, without performing planarization by CMP, a film 255 composed of a material having a higher refractive index than the embedded insulating film 254, for example, composed of SiN, may be formed thereon, and subsequently, the film 255 may be planarized by an etch-back process or CMP so that the film 255 remains only above the waveguide to form a concave lens, thus allowing light being efficiently concentrated on the waveguide.

Furthermore, in Embodiment 3, although an example in which the metal film 253 is formed directly after a portion for forming the waveguide is opened has been described, it may be possible to form the metal film 253 after an insulating film is formed, for example, with a thickness of 50 nm. In such a case, dielectric strength between the waveguide and the signal lines is easily ensured.

Embodiment 4

Next, a method for fabricating a solid-state imaging device according to a fourth embodiment (hereinafter referred to as "Embodiment 4") of the present invention will be described. FIGS. 15A to 15K are sectional side elevations illustrating a method for fabricating a solid-state imaging device according to Embodiment 4 of the present invention. Here, in order to facilitate the description, the configurations of the element region, element isolation region, etc., provided on the silicon substrate as a base are not also shown in the drawings.

Figure 15A:
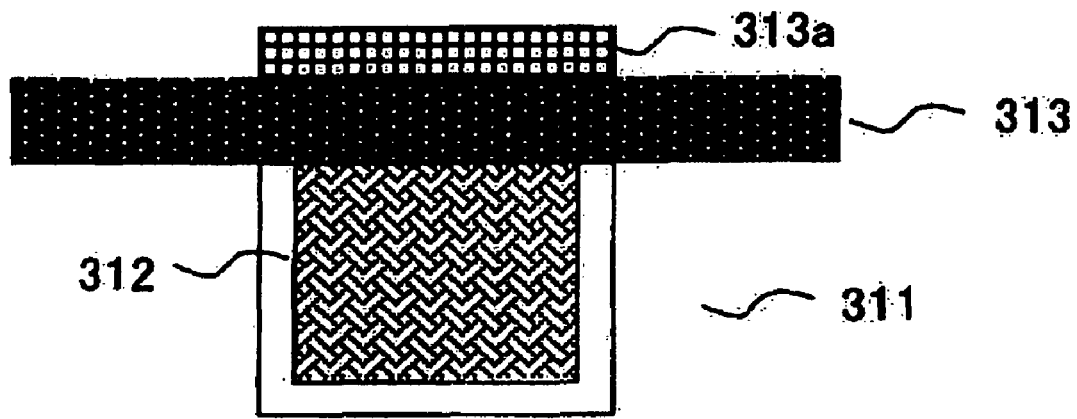
FIGS. 15A to 15K are sectional side elevations illustrating a method for fabricating a solid-state imaging device according to Embodiment 4 of the present invention.
Figure 15B:
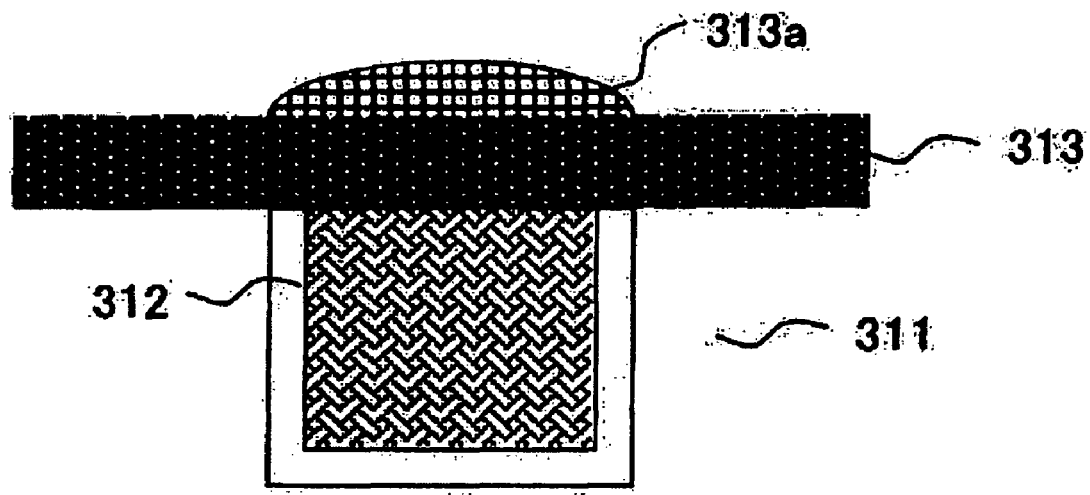
Figure 15C:
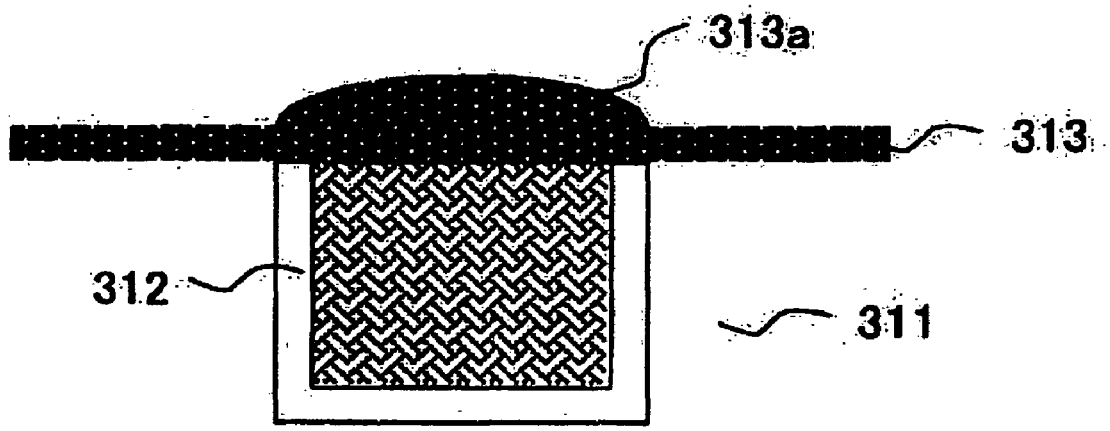

In embodiment 4, as shown in FIG. 15A, first, on a silicon substrate 311 provided with a diode 312 which performs photoelectric conversion and a SiN film 313, patterning of a resist layer 313a is performed by lithography at a position corresponding to a region in which a condensing lens is to be formed on the diode 312. The resist layer 313a is then rounded by heat treatment as shown in FIG. 15B. Subsequently, by processing the SiN film 313 and the resist layer 313a at the same etching rate, a condensing lens is formed on the diode 312 as shown in FIG. 15C.

Figure 15D:
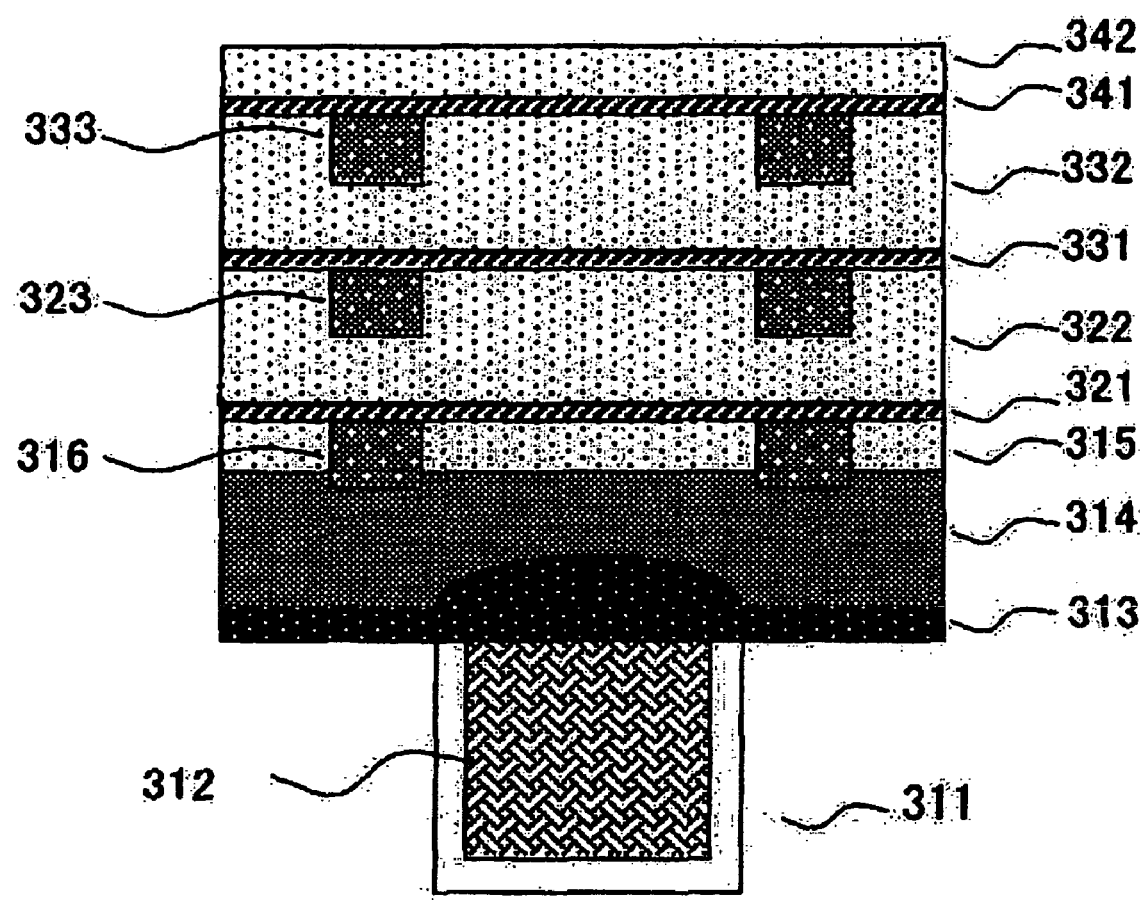

After the condensing lens is formed, a SiN film 313 which is an interlayer film below wiring is formed, contacts with a diffusion layer and a gate electrode (not shown in the drawing) are formed, and an interlayer film 315 for first signal lines, first signal lines 316, a diffusion prevention film 321 composed of Cu applied to the first wiring, an interlayer film 322 between the first signal lines and second signal lines, second signal lines 323, a diffusion prevention film 331 composed of Cu applied to the second wiring, an interlayer film 332 between the second signal lines and third signal lines, third signal lines 333, a diffusion prevention film 341 composed of Cu applied to the third wiring, and an interlayer film 342 between the third wiring and the signal lines disposed thereabove are formed. A structure shown in FIG. 15D is thereby obtained. The wiring and interlayer configurations are the same as those in Embodiment 2.

Figure 15E:
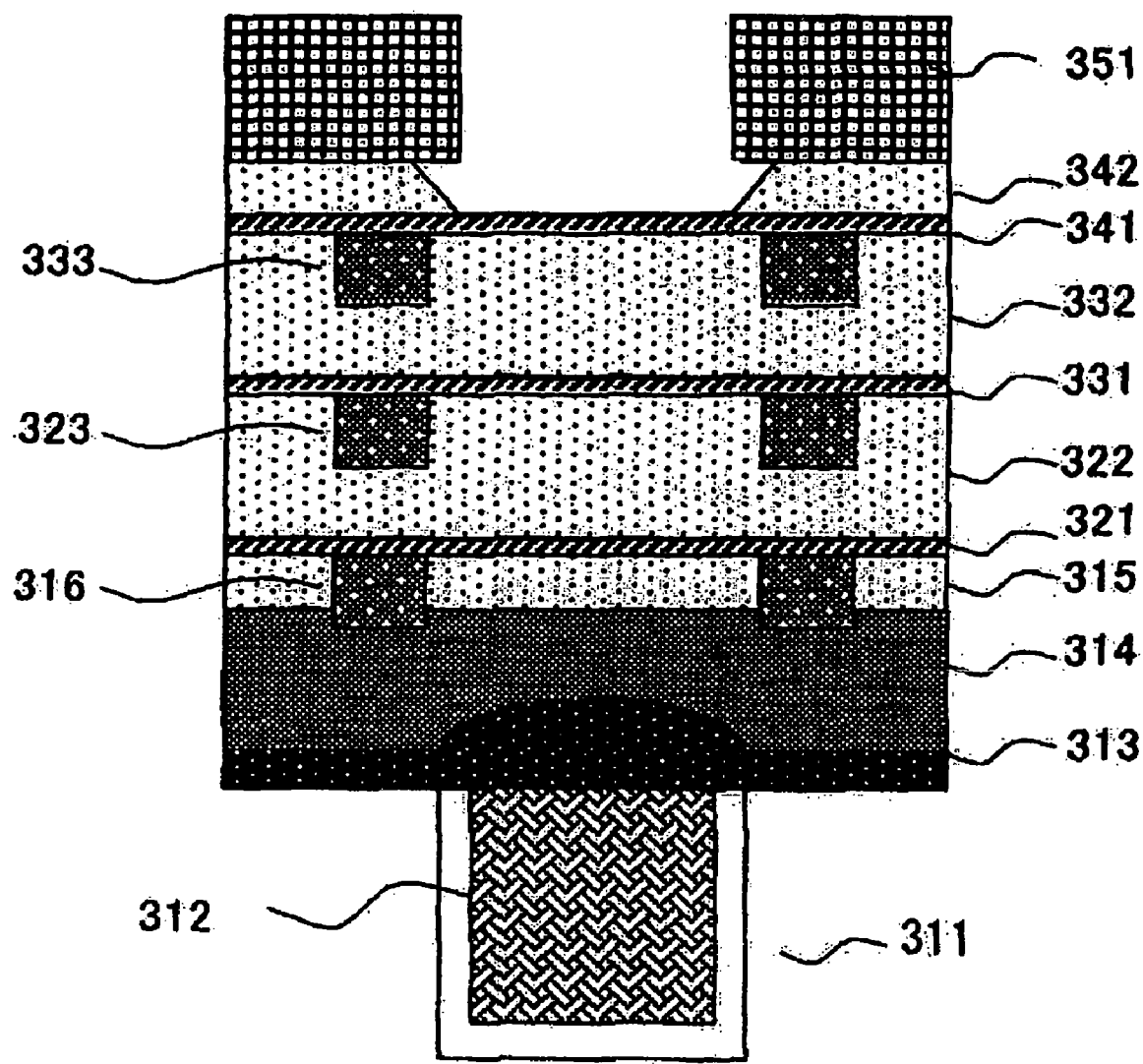

As shown in FIG. 15E, in order to form a portion serving as a waveguide by lithography, patterning of a resist layer 351 which serves as a mask is performed on the structure described above. Subsequently, using the resist layer 351, the interlayer film 342 on the top wiring layer is isotropically processed. The interlayer film 342, for example, has a thickness of 300 nm.

Figure 15F:
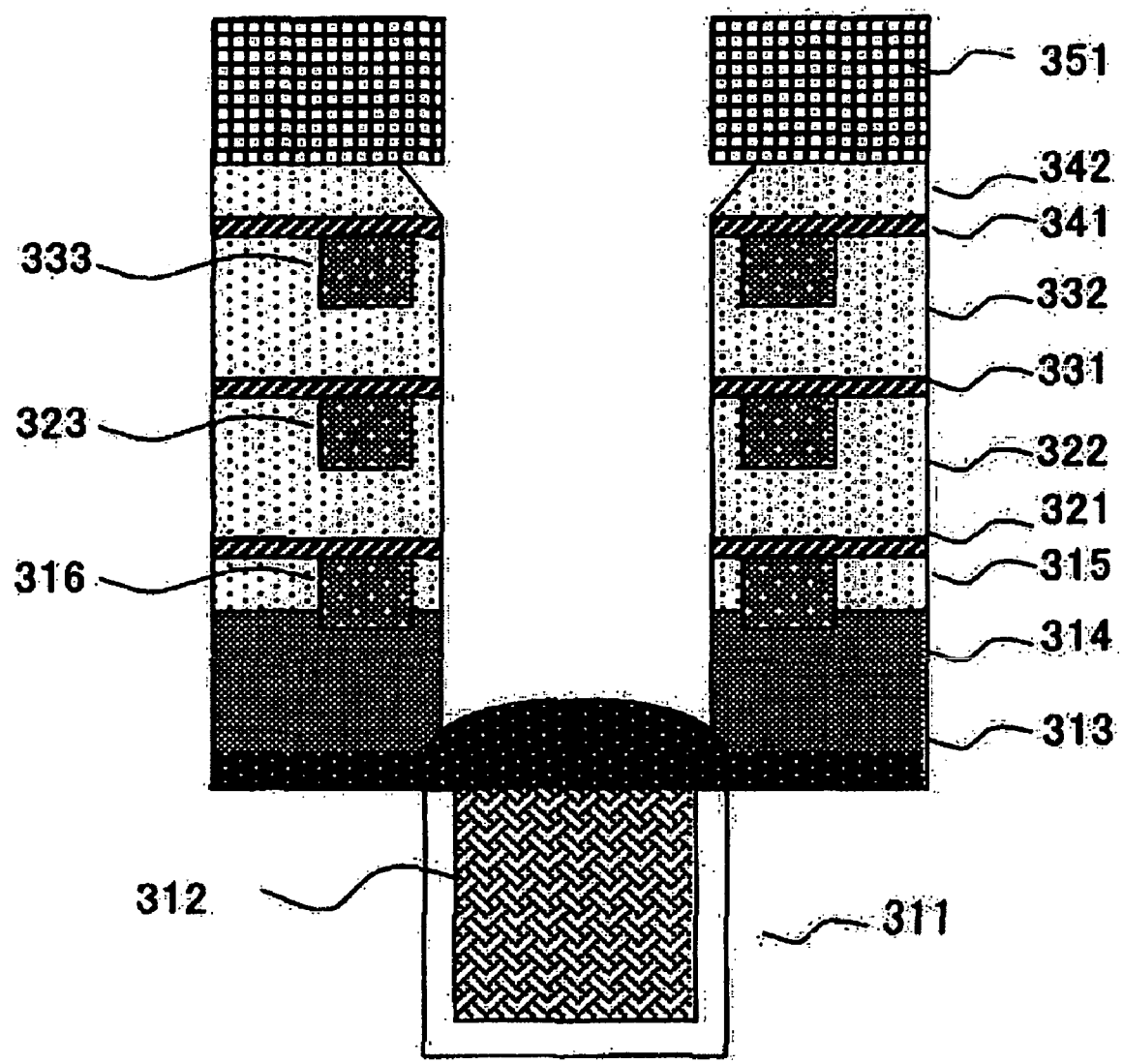

Furthermore, as shown in FIG. 15F, the interlayer films in the region in which the wave guide is to be formed is processed by anisotropic etching to form the waveguide.

Figure 15G:
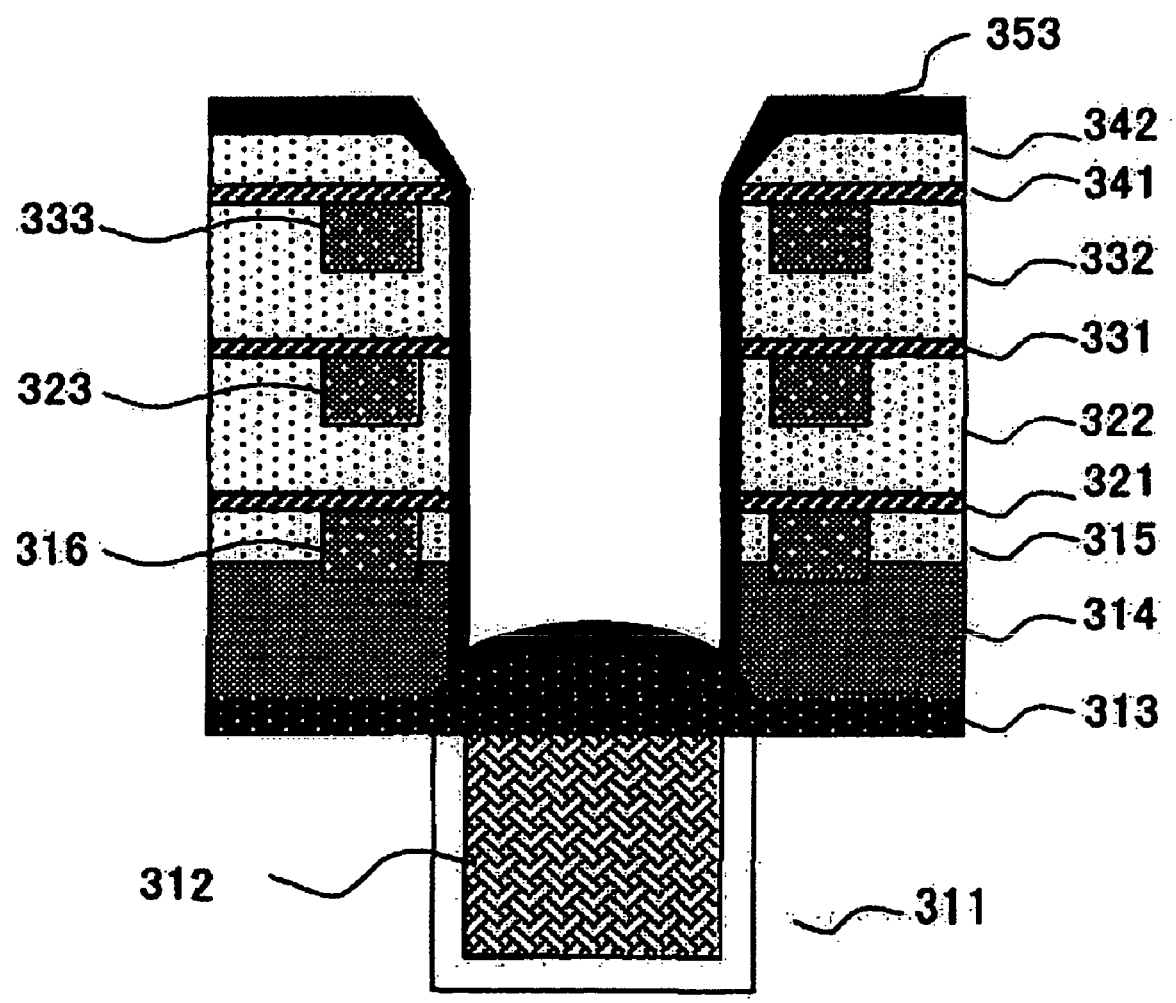
Figure 15H:
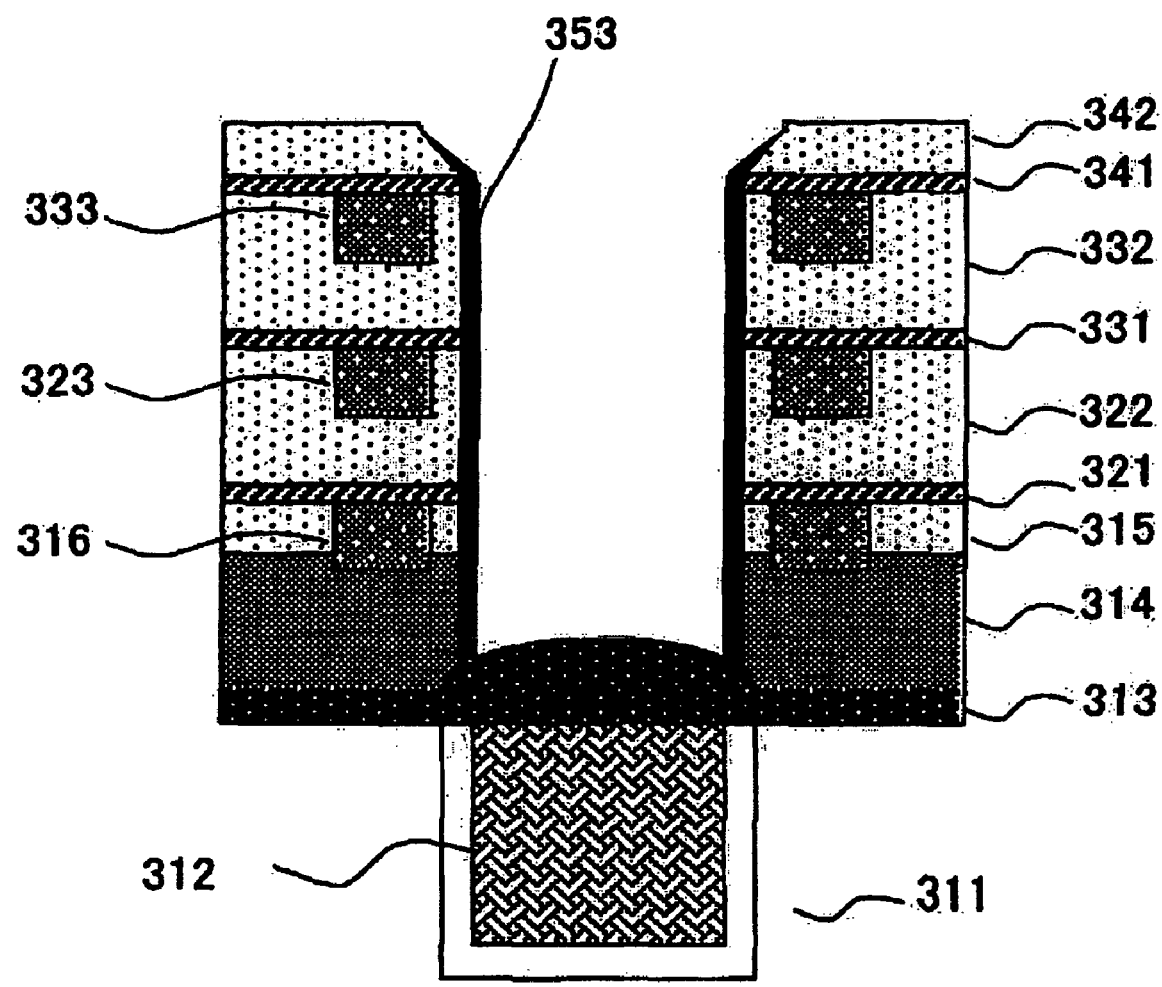

After the waveguide is formed, as shown in FIG. 15G, the resist layer 351 used in lithography is removed, and then as a metal film 353 for forming an outer tube of the waveguide, an aluminum film is formed at a thickness of 50 nm. Subsequently, as shown in FIG. 15H, by etching back the entire surface of the metal film 353, the metal film 353 for forming the outer tube of the waveguide is allowed to remain only on the side face. As the metal film 153, aluminum is used in this embodiment. Instead of using the aluminum film as the metal film 353, a clad structure may be employed in which a low-refractive-index film is used as the sidewall and the inside is embedded with a high-refractive-index film.

Figure 15I:
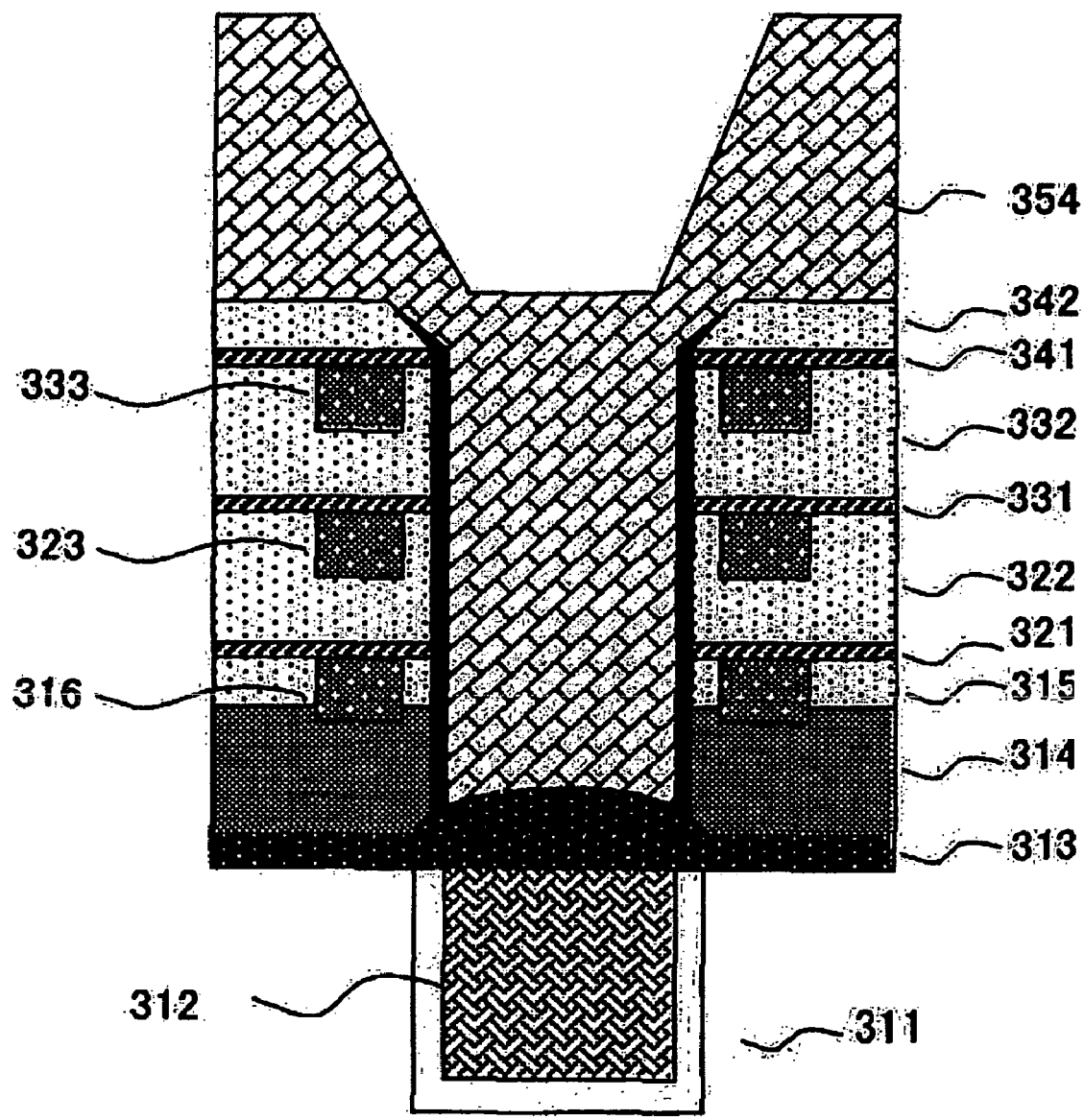

Subsequently, as shown in FIG. 15I, an insulating film 354 is embedded in the waveguide by high-density plasma CVD.

The insulating film 354 is a transparent film that transmits visible light. Specifically, an ordinary SiO2 is used in this example.

Figure 15J:
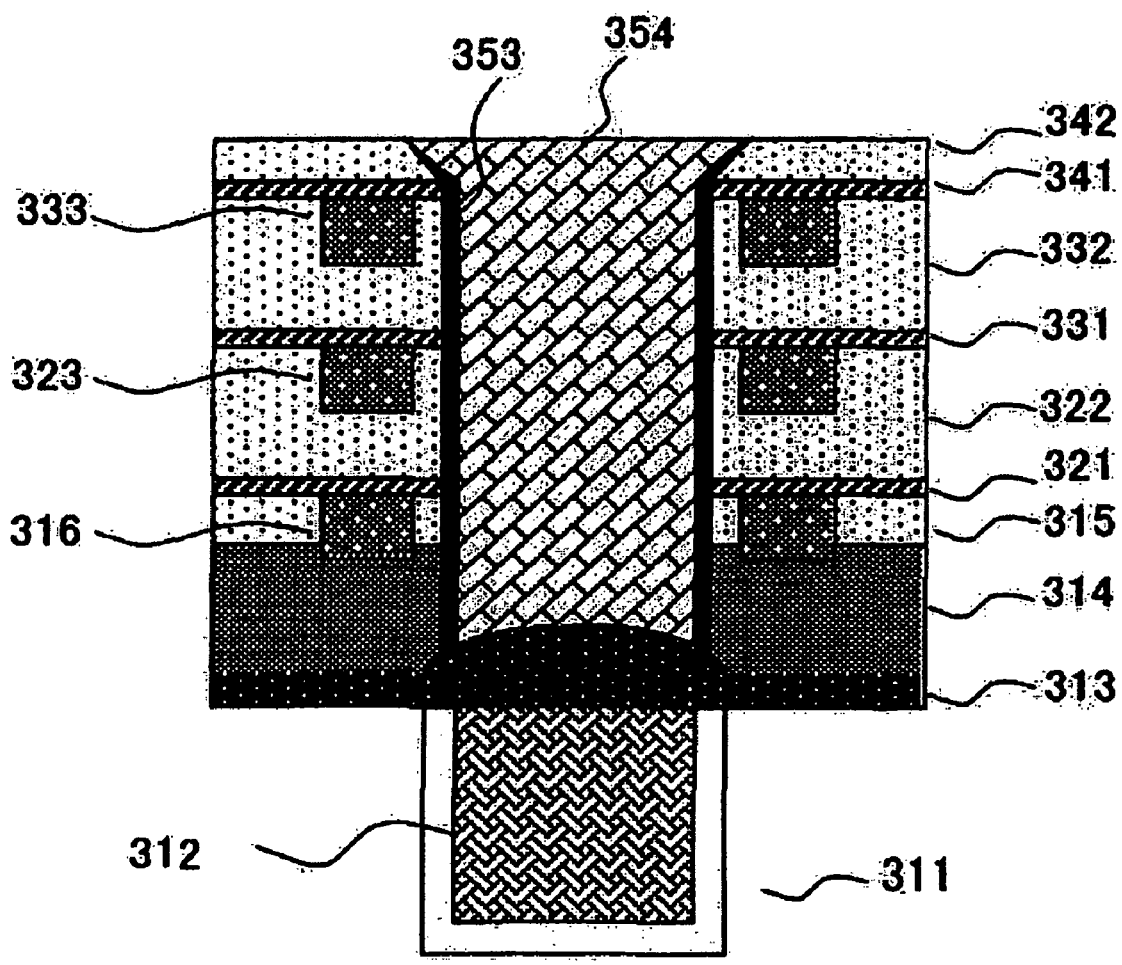

After the insulating film 354 is embedded, as shown in FIG. 15J, planarization is performed by CMP to remove the insulating film 354 formed in the region other than the waveguide.

Although an example in which high-density plasma CVD is used to embed the transparent insulating film 354 in the waveguide has been described above, the transparent insulating film 354 may be embedded by other method, for example, a coating method. In such a case, if planarization is simultaneously achieved by the coating method, the planarization process using CMP can be eliminated.

Figure 15K:
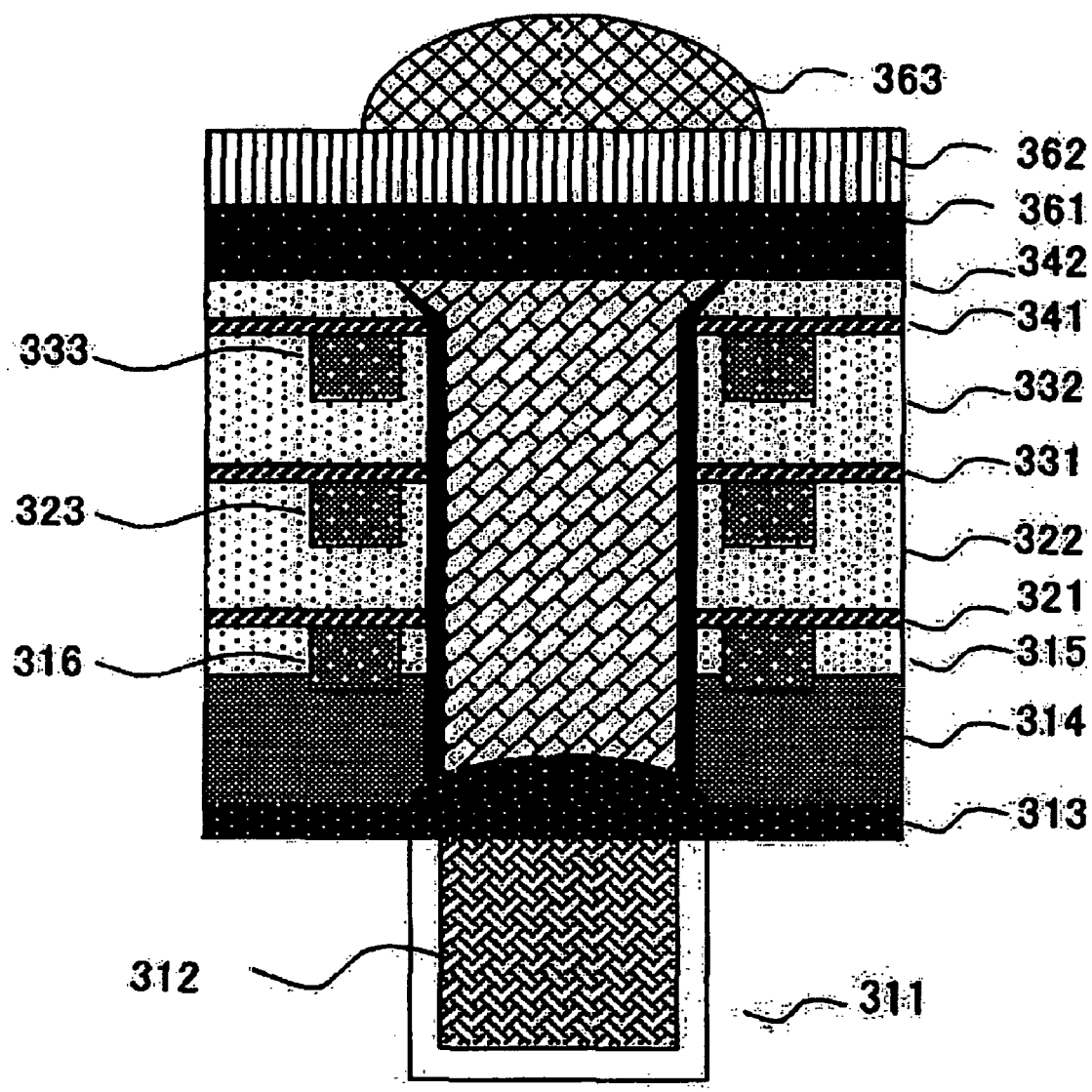

The method for fabricating the solid-state imaging device in Embodiment 4 has been described above. In the subsequent step, an on-chip lens may be formed in order to allow a sufficient amount of light to enter the waveguide. That is, as shown in FIG. 15K, a SiN film 361, a color filter 362, and an on-chip lens 363 may be formed on the planarized transparent insulating film 354.

Furthermore, although not shown in the drawing, as in Embodiments 2 and 3, without planarizing by CMP the insulating film embedded by high-density plasma CVD, a film composed of a material having a higher refractive index than the embedded insulating film 354 may be formed thereon, and subsequently, the film may be allowed to remain only above the waveguide, thus forming a concave lens to be combined.

Furthermore, in Embodiment 4, although an example in which the metal film 353 is formed directly after a portion for forming the waveguide is opened has been described, it may be possible to form the metal film 253 after an insulating film is formed, for example, with a thickness of 50 nm. In such a case, dielectric strength between the waveguide and the signal lines is easily ensured.

Embodiment 5

Next, a method for fabricating a solid-state imaging device according to a fifth embodiment (hereinafter referred to as "Embodiment 5") of the present invention will be described. FIGS. 16A to 16K are sectional side elevations illustrating a method for fabricating a solid-state imaging device according to Embodiment 5 of the present invention. Here, in order to facilitate the description, the configurations of the element region, element isolation region, etc., provided on the silicon substrate as a base are not also shown in the drawings.

Figure 16A:
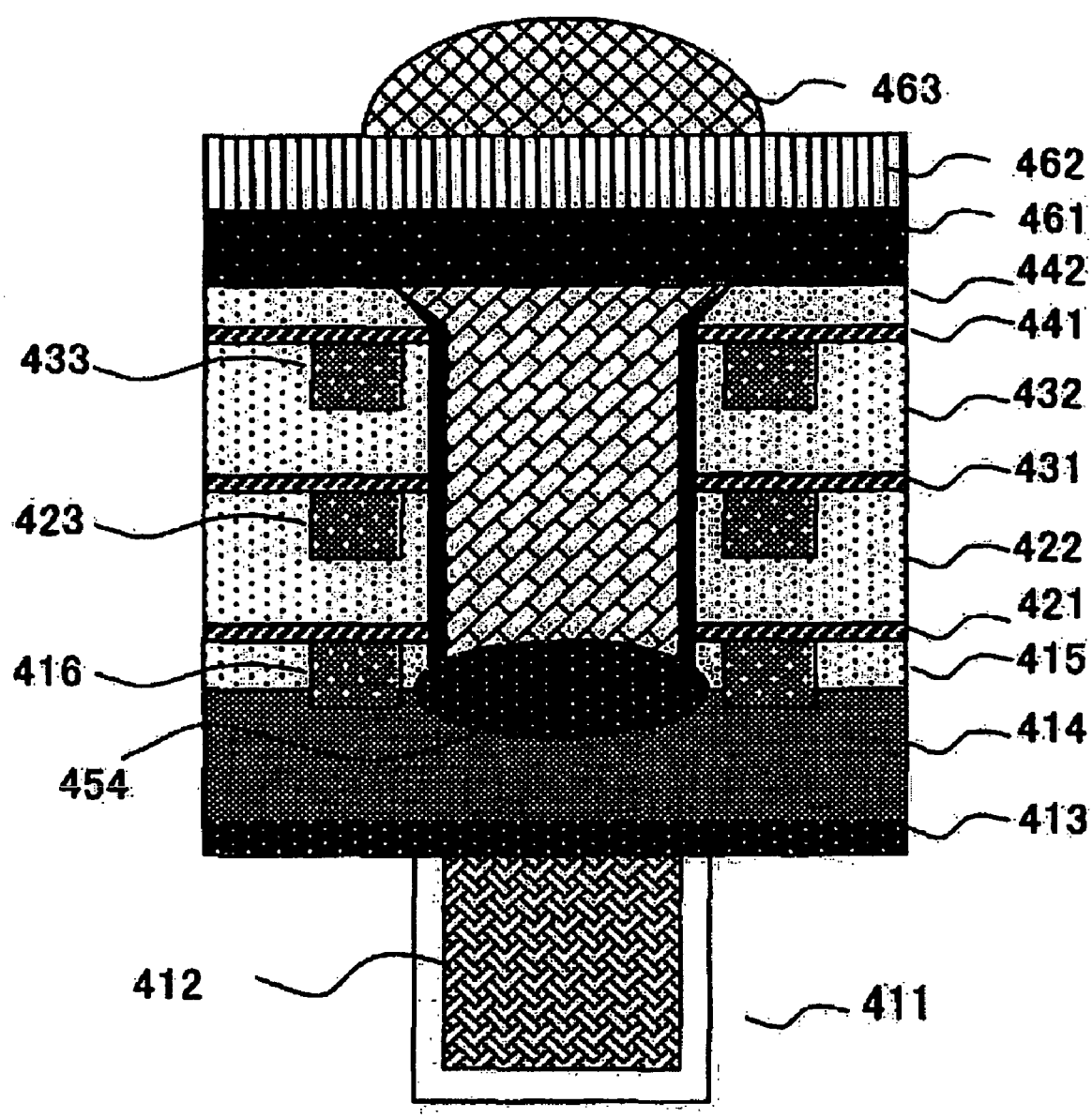
FIGS. 16A to 16K are sectional side elevations illustrating a method for fabricating a solid-state imaging device according to Embodiment 5 of the present invention.

In Embodiment 4, an example of a structure in which a condensing lens is disposed directly above the diode 312 has been described. As shown in FIG. 16A, a condensing lens 454 may be disposed away from a diode 412. In such a case, it is possible to prevent the diode 412 from being influenced by a damage which may be caused during processing of the condensing lens 454. In such a case, desirably, the condensing lens 454 has a structure in which a convex lens and a concave lens are combined, which is believed to improve the light collection capability compared with a hemispherical lens. Accordingly, in Embodiment 5, a fabrication method in a case including a condensing lens 454 having a structure in which a convex lens and a concave lens are combined will be described.

Figure 16B:
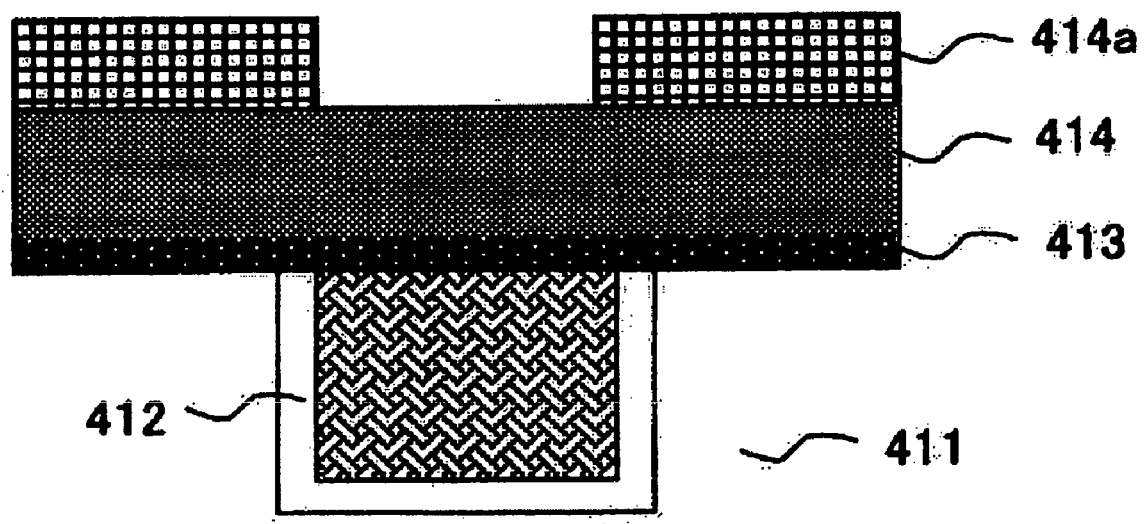
Figure 16C:
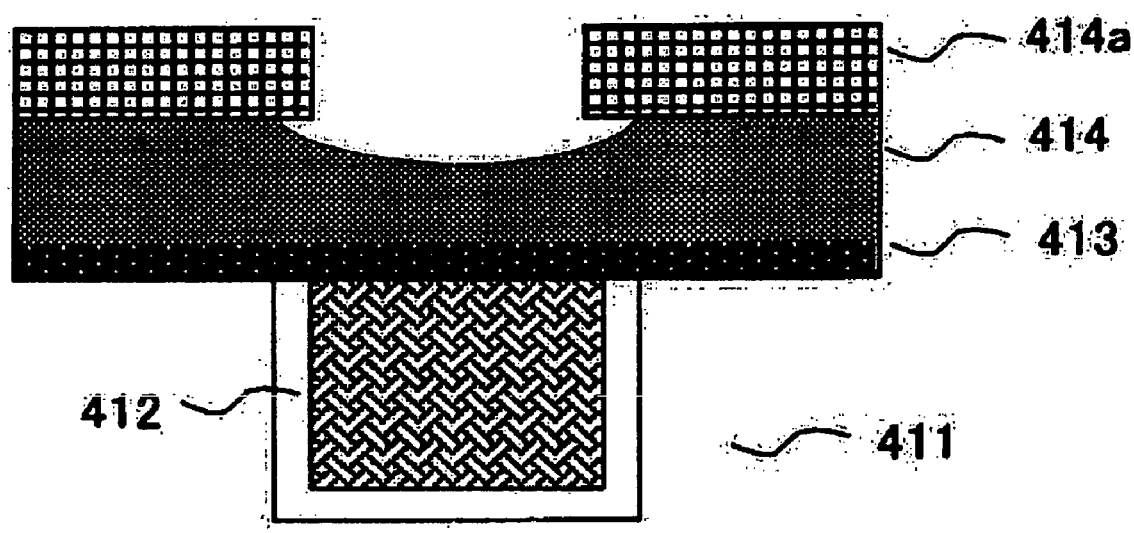
Figure 16D:
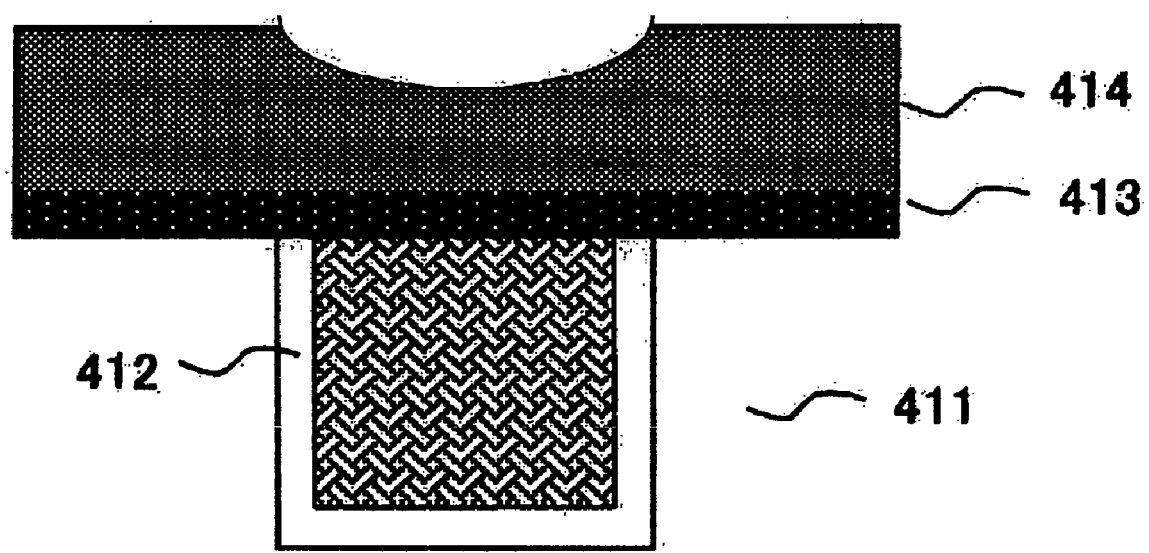
Figure 16E:
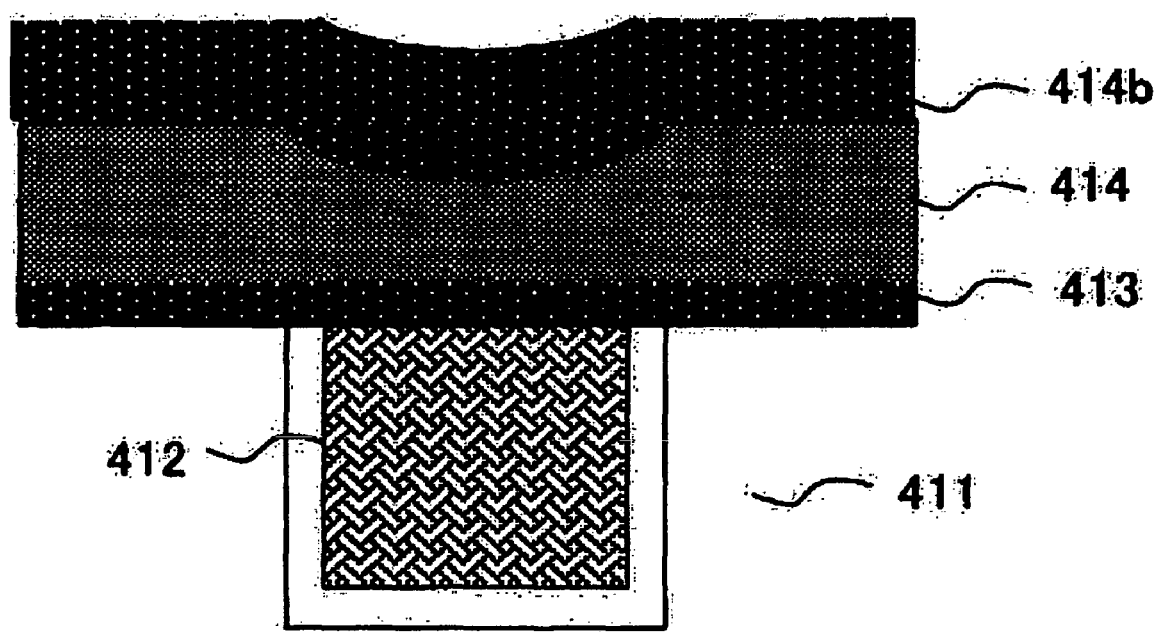

In Embodiment 5, first as shown in FIG. 16B, on a silicon substrate 411 provided with element and element isolation regions (not shown in the drawing), a diode 412 which performs photoelectric conversion, an SiN film 413, and a poly-interlayer film 414, patterning of a resist layer 414a is performed by lithography so as to correspond to a lens region formed above the diode 412. Subsequently, as shown in FIG. 16C, using the resist layer 414a, the poly-interlayer film 414 is isotropically processed to form a concave lens. As shown in FIG. 16D, the resist layer 414a used for forming the concave lens is then stripped off, and as shown in FIG. 16E, a SiN film 414b is further formed thereon. Although the material for forming the lens is not limited to the SiN film, the material must have a higher refractive index than the poly-interlayer film 414. The poly-interlayer film is composed of a SiO2 film in this embodiment.

Figure 16F:
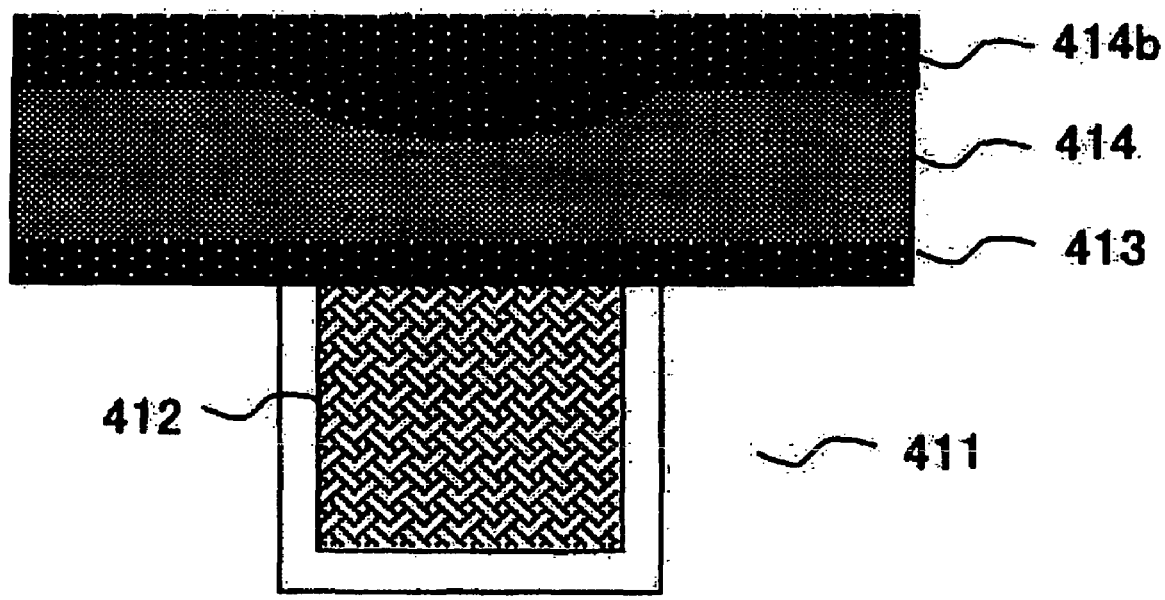
Figure 16G:
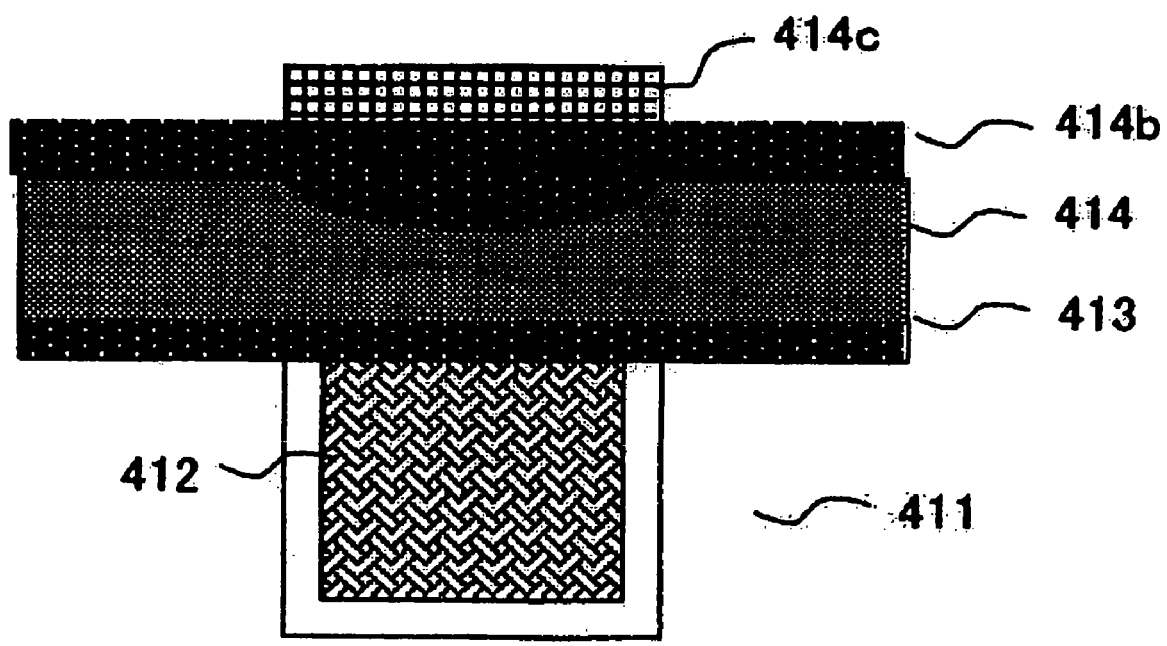
Figure 16H:
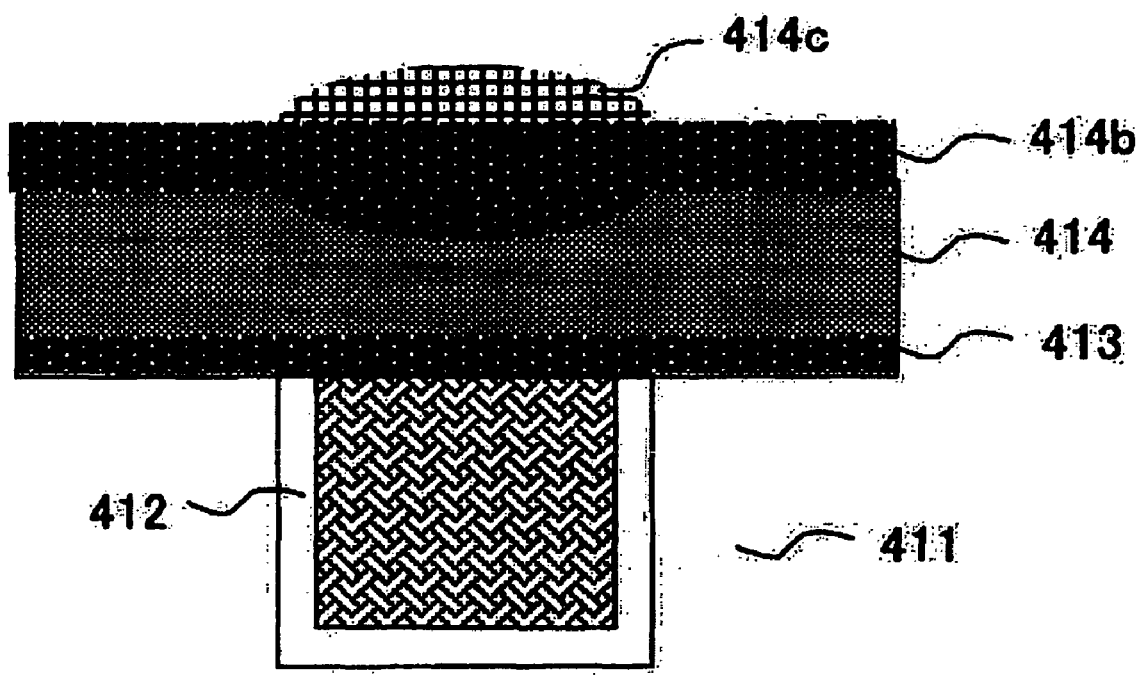
Figure 16I:
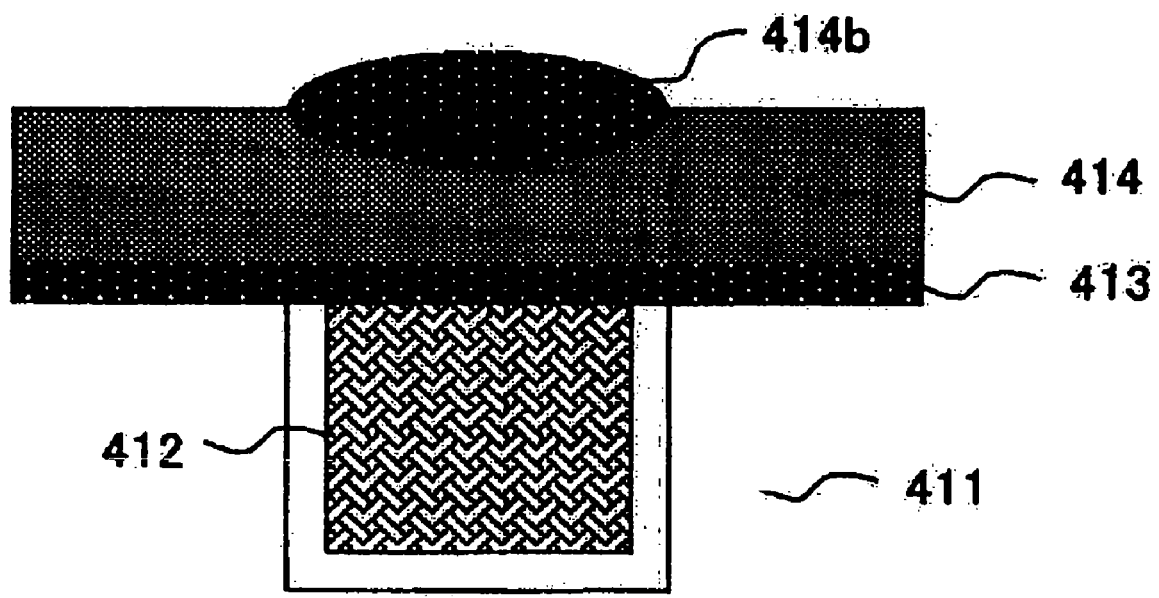

After the SiN film 414b is formed, as shown in FIG. 16F, the SiN film 414b is planarized by CMP. Then, as shown in FIG. 16G, patterning of a resist layer 414c is performed by lithography at a position corresponding to a region in which a condensing lens is to be formed. The resist layer 414c is rounded by heat treatment as shown in FIG. 16H. Subsequently, by processing the SiN film 414b and the resist layer 414c at the same etching rate, a condensing lens 414b is formed above the diode 412 as shown in FIG. 16I.

Figure 16J:
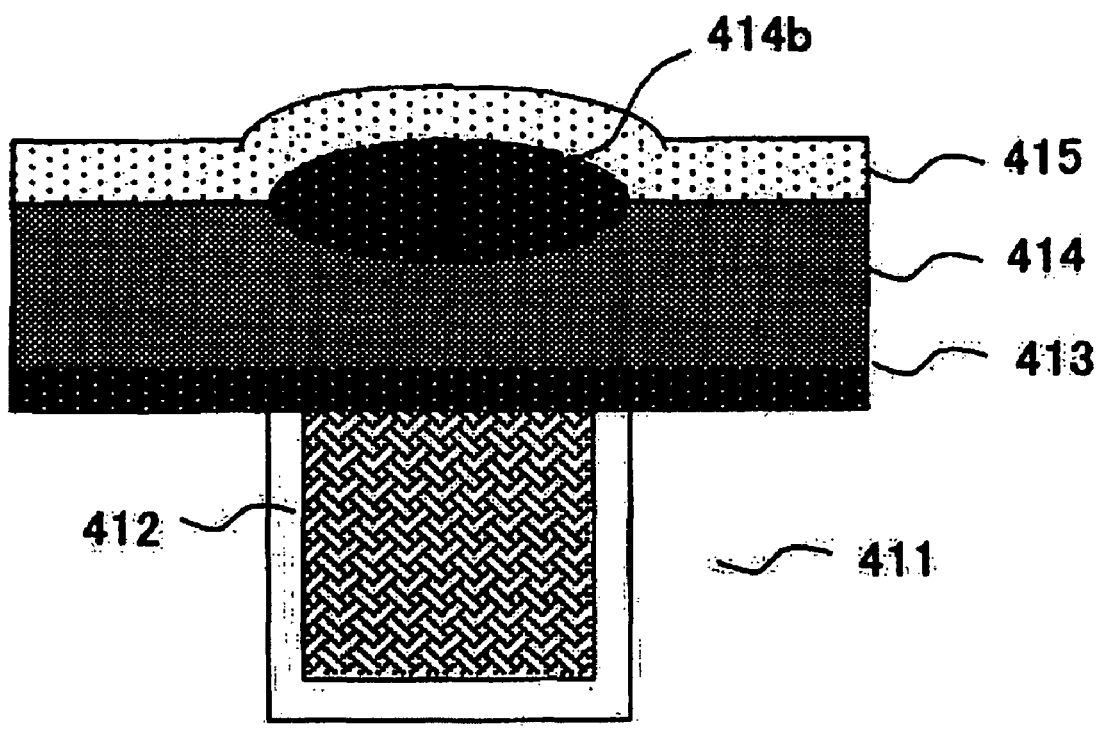
Figure 16K:
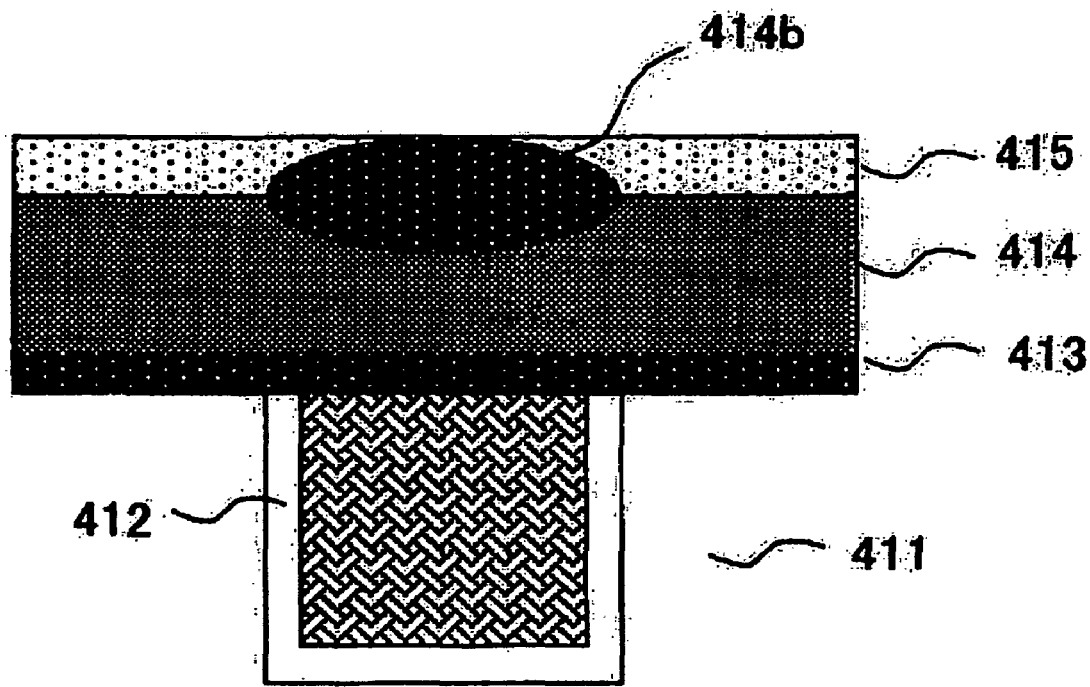

Subsequently, as shown in FIG. 16J, an interlayer film 415 for first signal lines are formed. By planarizing by CMP a convex portion resulting from the formation of the lens, a state prior to the formation of the first signal lines are obtained. Then, by carrying out the step of forming Cu lines using a usual dual damascene process and the step of forming the waveguide described in Embodiment 2 or 3, the solid-state imaging device shown in FIG. 16A is produced.

According to Embodiments 2 to 5 described above, the limitation of the region for placing the waveguide due to the layout of signal lines can be minimized, and a sufficient amount of light is allowed to enter the light-receiving section. Furthermore, by disposing a condensing lens between the waveguide and the light-receiving section, light reflected at the lower side of waveguide can be prevented from leaking into the adjacent pixels. Consequently, it is possible to provide a highly sensitive solid-state imaging device.

Although examples of three-layered signal lines have been described above in Embodiments 2 to 5, the present invention is not limited to the three-layered wiring. Furthermore, although the cases in which Cu is used as wiring have been described in Embodiments 2 to 5, the present invention is, of course, not limited to Cu wiring.

Embodiment 6

Next, a solid-state imaging device (CMOS sensor) according to a sixth embodiment (hereinafter referred to as "Embodiment 6") of the present invention will be described.

Figure 17:
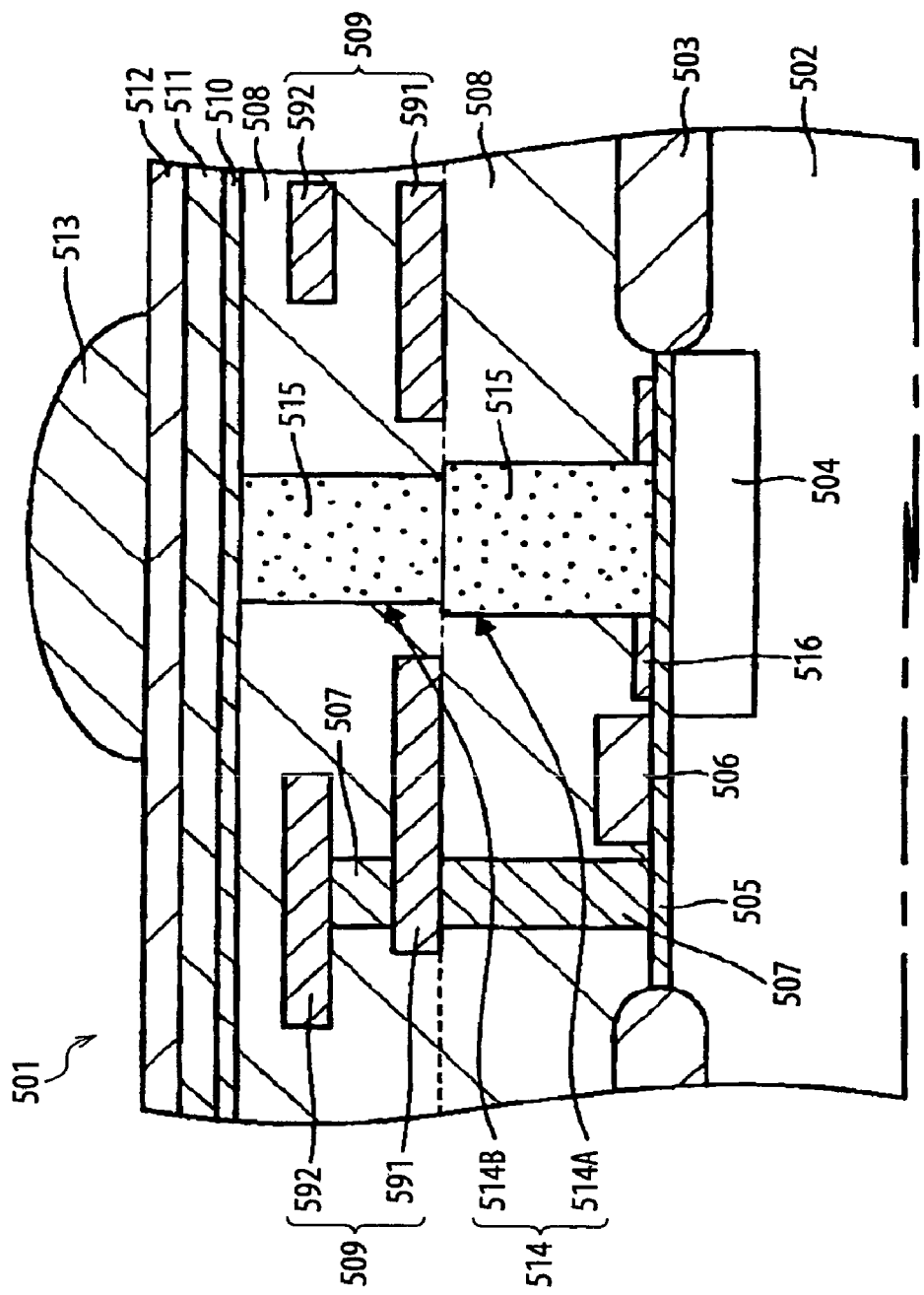
FIG. 17 is a schematic sectional view showing a structure of a solid-state imaging device according to Embodiment 6 of the present invention.

FIG. 17 shows a general structure of a solid-state imaging device (CMOS sensor) to which the present invention is applied.

In the example of FIG. 17, a cross section corresponding to one pixel of the solid-state imaging device is shown.

In a solid-state imaging device 501 according to this embodiment, a light-receiving section 504 which receives incident light is disposed in a predetermined region in a semiconductor substrate 502, the predetermined region being isolated by element isolation regions 503. At predetermined positions above the light-receiving section 504, a read gate 506 and conductive plugs 507 connected to signal lines which will be described below are disposed in an insulating film 508 with a gate insulating film 505 therebetween.

In the example shown in FIG. 17, signal lines 509 are formed in a two-layered manner (first signal lines 591 and second signal lines 592), and the signal lines 591 and 592 are connected with conductive plugs 507. Above the signal lines in the top layer, a color filter 512 is disposed on an insulating film 508 with a passivation film 510 and a planarizing film 511 therebetween, and an on-chip lens 513 is disposed on the color filter 512 at a position corresponding to the light-receiving section 504.

A hole 514 extends from the light-receiving section 504 to the bottom of the passivation film 510 so as to link between the light-receiving section 504 and the on-chip lens 513. A high-refractive-index layer (e.g., plasma SiN film formed by high-density plasma CVD) 15 having a higher refractive index (n=2.0) than the insulating film 508 is embedded in the hole 514. Reference numeral 16 represents an etching stop film (e.g., SiN film) having a high selective ratio to the insulating film (e.g. SiO2 film) 8.

A solid-state imaging device 501 having a structure in which collection efficiency of incident light is improved is thus constructed.

In this embodiment, in particular, the hole 514 includes a plurality of layers.

In this embodiment, for example, the hole 514 includes, for example, two layers 514A and 514B. The upper surface of the layer 514A is, for example, flush with the planarized upper surface of the insulating film 508 indicated by a broken line. The upper surface of the layer 514B is, for example, flush with the planarized upper surface of the insulating 508 under the passivation film 510.

By using such a construction, unlike the conventional structure in which a high-refractive-index layer 544 is embedded in one deep hole to form a hole 543, since the hole 514 includes a plurality of layers 514A and 514B each embedded with a SiN film 515 which is a high-refractive-index layer, the embedding property of the plasma SiN film 515 in each of layers 514A and 514B is improved compared with the embedding property of the conventional plasma SiN film. Thus, generation of voids in the plasma SiN film 515 can be avoided.

Since the hole 514 includes a plurality of layers 514A and 514B as described above, for example, there is a concern about a misalignment between the layers.

Figure 18:
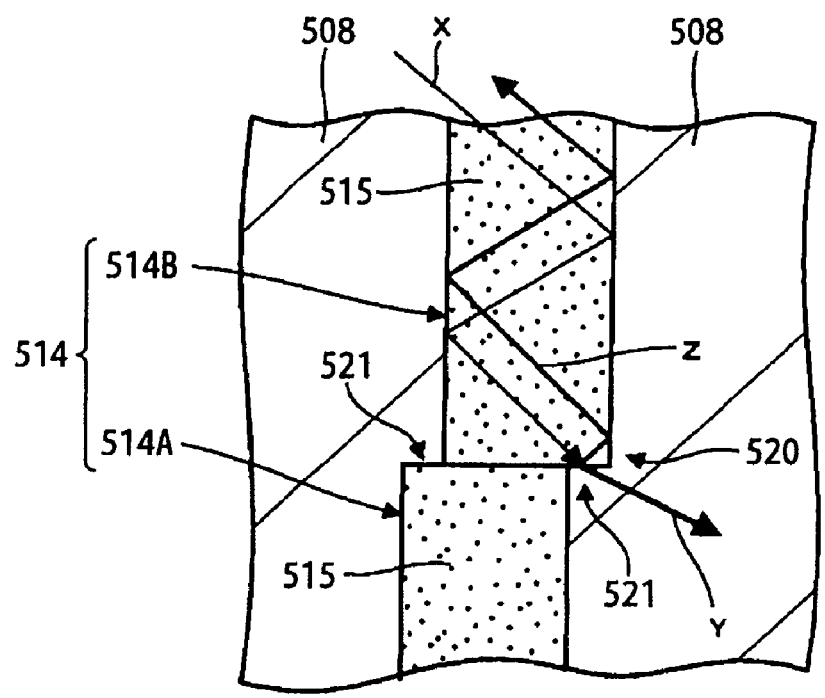
FIG. 18 is an enlarged sectional view showing a problem which may occur between layers.

For example, when a resist mask for forming the second layer, i.e., layer 514B, is formed by lithography, if a misalignment occurs with the first layer 514A, as shown in an enlarged view of FIG. 18, a step 521 is formed at the sidewalls, at the joint 520 between the layers 514A and 514B which are vertically connected to each other.

When the step 521 is formed at the joint 520 between the layers 514A and 514B, light (indicated by arrow x in the drawing) entering from above the hole 514 advances from the plasma SiN film 515 which is embedded therein toward the insulating film 508. Depending on the incident angle, light is refracted at the step 521 to advance into the insulating film 508 (indicated by arrow Y in the drawing), or light is totally reflected at the step 521 to advance upward in the hole 514 and is scattered to outside from the surface (indicated by arrow Z in the drawing). Possibly, light is totally reflected again at the interface between the surface of the hole 514 and the upper layer (e.g., passivation film 510) back into the hole 514.

As described above, due to the formation of the step 521, the collection capability of incident light to the light-receiving section 504 is clearly reduced, resulting in a decrease in light collection efficiency.

Figure 19:
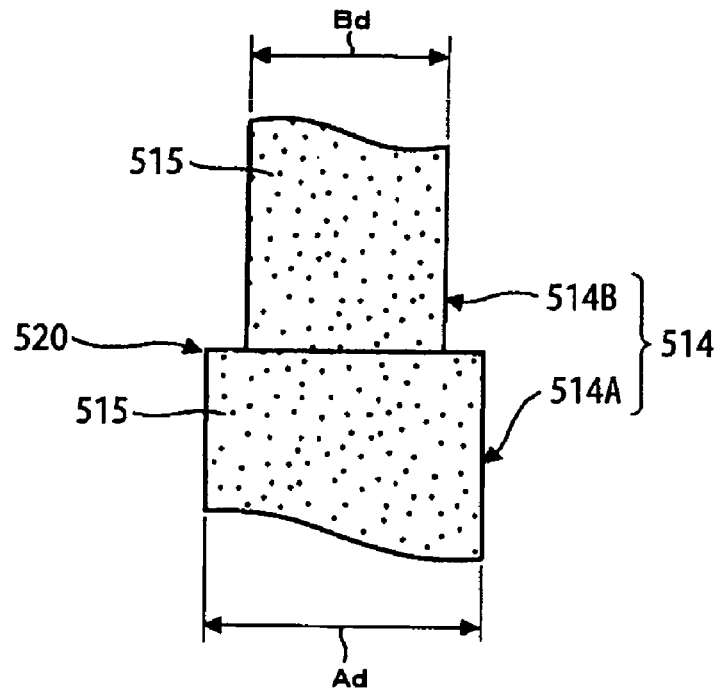
FIG. 19 is an explanatory view showing specified diameters of two adjacent layers.

Accordingly, in this embodiment, the adjacent layers 514A and 514B are formed with different diameters. Namely, as shown in FIG. 19, a lower diameter Bd of the upper layer 514B is set smaller than an upper diameter Ad of the lower layer 514A. Consequently, the decrease in light collection efficiency can be reduced.

In such a case, although a step occurs at the joint 520, because of the larger upper diameter Ad of the lower layer at the joint 520, unnecessary reflection or refraction, such as the one shown in FIG. 18, does not occur.

In order to form the upper layer 514B so as to have a lower diameter Bd that is smaller than the upper diameter Ad of the lower layer 514A, the diameter of the mask is decreased by that amount. A maximum deviation occurring in lithography is about 0.1 μm. Therefore, for example, in the lithographic process for forming the upper layer 514B, the lower diameter Bd is controlled so as be smaller than the upper diameter Ad of the lower layer 514A by 0.2 μm (0.1 μ2).

Thereby, a step 521, such as the one described above, can be prevented from occurring at the joint 520 between the layers 514A and 514B.

In the solid-state imaging device 501 in this embodiment, unlike the conventional structure, a high-refractive-index layer is not embedded in one deep hole. The hole 514 includes a plurality of layers 514A and 514B each embedded with the SiN film 515 which is a high-refractive-index layer. Thus, the embedding property of the plasma SiN film 515 in each of the layers 514A and 514B is superior to the embedding property of the plasma SiN film in the conventional one layer 547. As a result, it is possible to provide a solid-state imaging device having a satisfactory embedding property in which voids are not generated in the plasma SiN film 515.

Furthermore, since the lower diameter Bd of the upper layer 514B is set smaller than the upper diameter Ad of the lower layer 514A at the interface (joint 520) between the layers 514A and 514B, unnecessary reflection or refraction does not occur at the joint 520. Thus, it is possible to provide a solid-state imaging device in which light collection efficiency is not decreased.

Furthermore, in order to reduce the interface level in the light-receiving section 504 or to inhibit white spots from being generated by repairing the disorder in the crystal lattice, for example, hydrogen contained in the plasma SiN film 515 is supplied to the light-receiving section 504 by annealing treatment. In such a case, since the plasma SiN film 515 in the hole 514 does not have a void and has a sufficient volume, a sufficient amount of hydrogen can be supplied from the plasma SiN film 515 to the light-receiving section 504, and the effect of inhibiting the generation of white spots can be shown satisfactorily.

Furthermore, when voids occur in the hole, the covering power (coverage) of the high-refractive-index layer in the hole is unsatisfactory, and the high-refractive-index layer is easily detached. However, in this embodiment, since voids are not generated in the hole 514, the coverage of the SiN film 515, which is the high-refractive-index layer, in the hole 514 can be improved.

In the example described above, at least one of the layers 514A and 514B constituting the hole 514 may have a structure in which the sidewall has a tapered shape.

Figure 20:
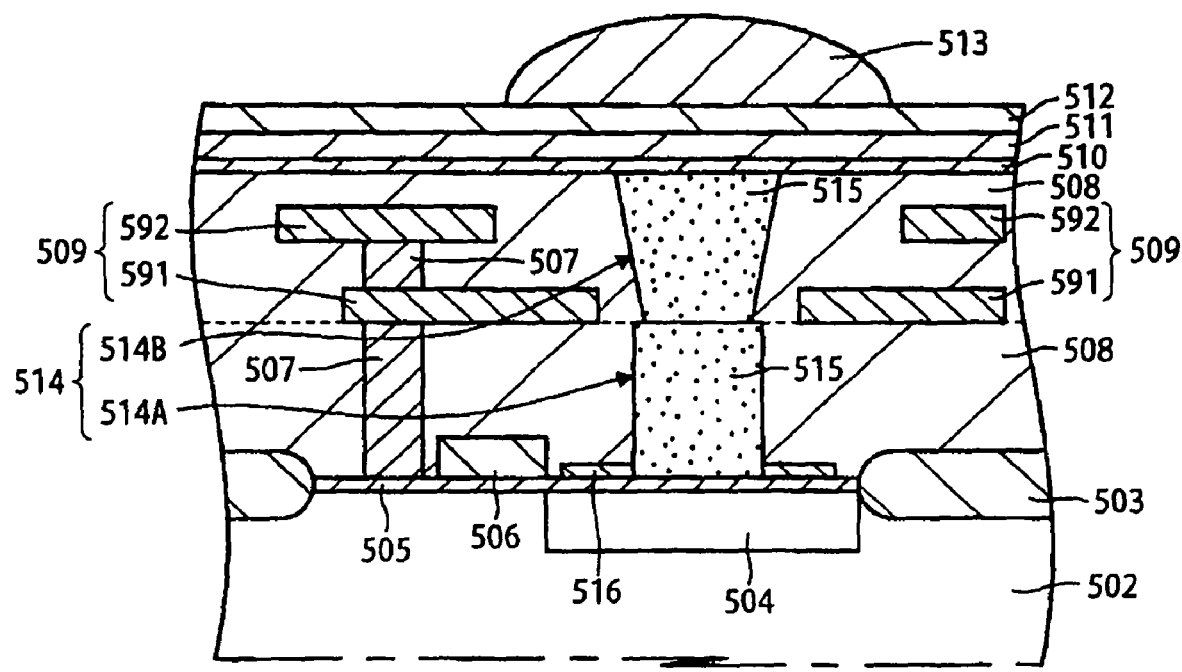
FIG. 20 is a schematic sectional view showing a case in which the upper layer of the hole is formed so as to have a tapered sidewall in the structure shown in FIG. 17.

For example, as shown in FIG. 20, in the example described above, when the sidewall of the layer 514B formed on the top has a tapered shape, light can be taken into the hole 514 more easily, for example, compared with the structure shown in FIG. 17. Moreover, the embedding property of the plasma SiN film 515 in the layer 514B is further improved.

Figure 21:
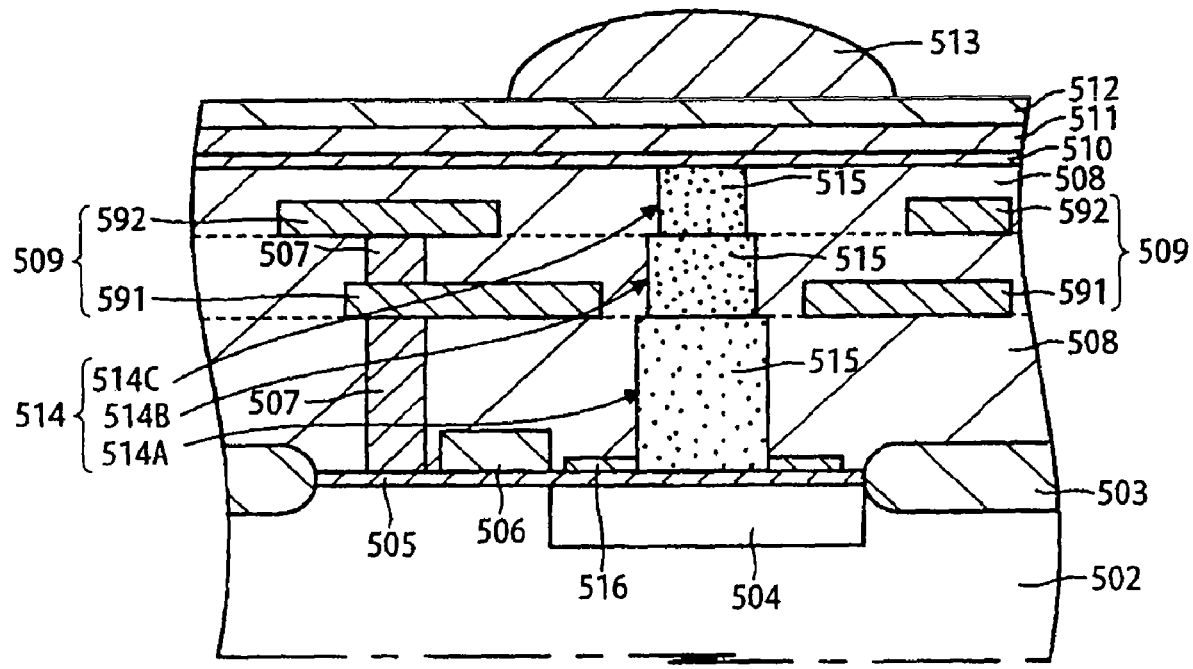
FIG. 21 is a schematic sectional view showing a case in which the hole includes three layers in the structure shown in FIG. 17.

In the example described above, the hole 514 includes two layers 514A and 514B. As another example, a structure in which a hole 514 includes three layers 514A, 514B, and 514C is shown in FIG. 21.

In this example, the upper surfaces of the layers 514A, 514B, and 514C are formed so as to be respectively flush with the upper surface of the planarized insulating film 508 indicated by a broken line under the first signal lines 591, the upper surface of the planarized insulating film 508 indicated by a broken line under the second signal lines 592, and the upper surface of the planarized insulating film 508 under the passivation film 510. That is, the upper surfaces of the layers 514A, 514B, and 514C are formed so as to be flush with their corresponding upper surfaces of the planarized insulating films 508.

The other portions are the same as those in the structure shown in FIG. 17. The same reference numerals are used for the same elements as those in FIG. 17, and a description thereof will be omitted.

In such a structure, the layers 514B and 514C each have a decreased depth and the embedding property of the plasma SiN film 515 in each of the layers 514B and 514C is improved. Therefore, the embedding property in the hole 514 is further improved compared with the structure shown in FIG. 17.

Figure 22:
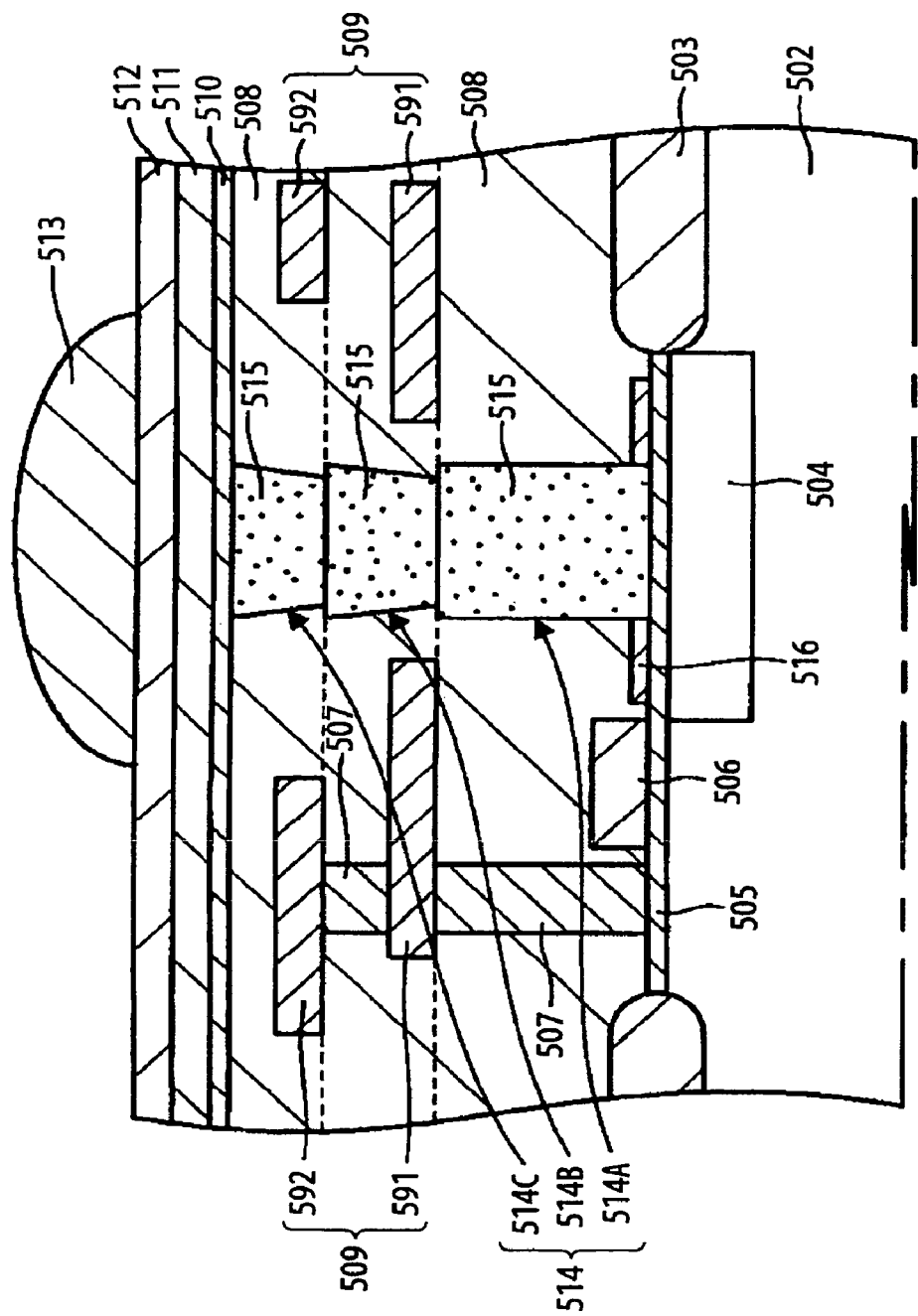
FIG. 22 is a schematic sectional view showing a case in which two layers of the hole are formed so as to have tapered sidewalls in the structure shown in FIG. 17.

Furthermore, for example, as shown in FIG. 22, when the layers 514B and 514C each are formed so that the sidewall has a tapered shape in the structure shown in FIG. 21, in addition to the advantages described above, it is possible to prevent a gradual decrease in the diameter (upper diameter) of the layers 514A, 514B, and 514C which are formed toward the on-chip lens 513. Furthermore, the embedding property of the plasma SiN film 515 in the layers 514B and 514C is improved, and the embedding property in the hole 514 is further improved.

Embodiment 7

Next, an example of a method for fabricating a solid-state imaging device according to a seventh embodiment (hereinafter referred to as "Embodiment 7") will be described with reference to FIGS. 23A to 23J.

Figure 23A:
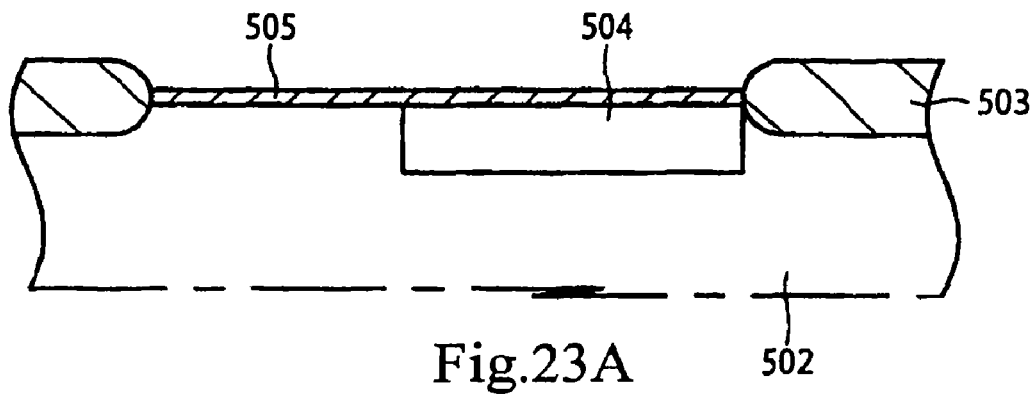
FIGS. 23A to 23K are schematic diagrams illustrating a method for fabricating a solid-state imaging device according to Embodiment 7 of the present invention.

In this embodiment, a method for fabricating the solid-state imaging device shown in FIG. 17 will be described. In the example shown in the drawings, cross sections corresponding to one pixel of the solid-state imaging device are shown, and the same reference numerals are used for the same elements as those in FIG. 17. First, as shown in FIG. 23A, a light-receiving section 504 which receives incident light is formed in a predetermined region isolated by element isolation regions 503 in a semiconductor substrate 502, and a gate-insulating film 505 is formed on the light-receiving section 504.

Figure 23B:
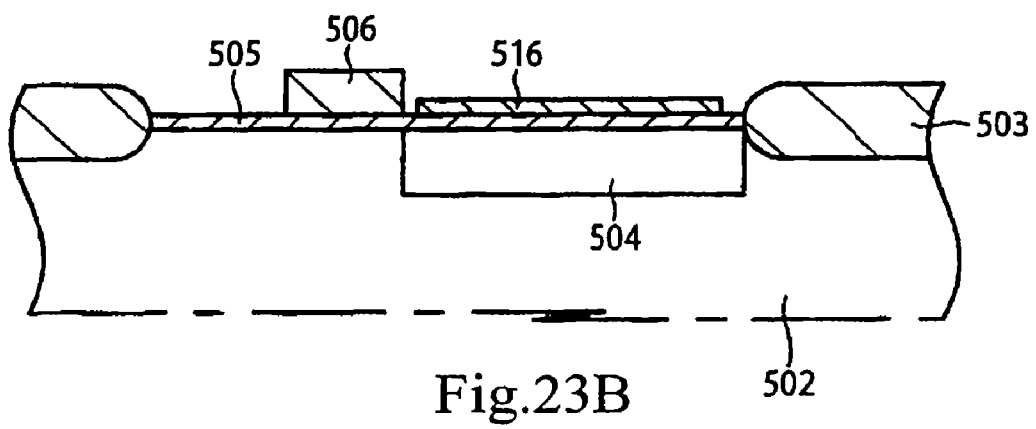

Next, as shown in FIG. 23B, a read gate 506 and an etching stopper film 516 are formed on the light-receiving section 504 with the gate-insulating film 505 therebetween.

Here, as the etching stopper film 516, a SiN film is used which ensures a high etching selective ratio to an insulating film 508 composed of a SiO2 film when an opening 514 is subsequently formed in an insulating film 508 on the etching stopper film 516. The SiN film may be formed, for example, using low-pressure CVD.

Next, an insulating film 508 is formed on the entire surface including the read gate 506, the etching stopper film 516, and the element isolation regions 503, and a resist film (not shown in the drawing) is further formed on the insulating film 508. Patterning of the resist film is performed by known lithography to produce a resist mask for forming the opening 541, and then the insulating film 508 is removed by anisotropic dry etching through the resist mask.

Figure 23C:
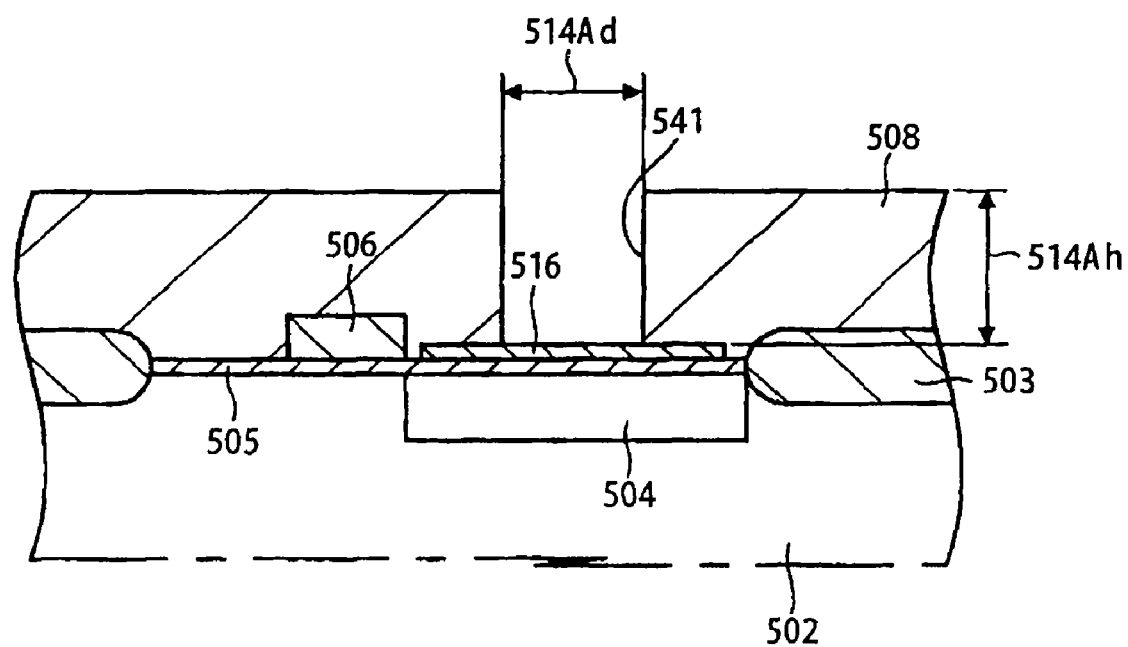

Then, by removing the resist mask, as shown in FIG. 23C, a structure in which the opening 541 is formed in the insulating film 508 is obtained.

The anisotropic dry etching is carried out with a parallel plate etcher, and as a reactant gas, for example, C4F8 gas, Ar gas, or O2 gas may be used. When such a reactant gas is used, a high selective ratio is ensured between the insulating film 508 and the etching stopper film 516.

As described above, since a high selective ratio is ensured between the etching stopper film 516, which is formed on the light-receiving section 504, and the insulating film 508, etching of the insulating film 508 is terminated when it reaches the etching stopper film 516, and thus the surface of the light-receiving section 504 is not affected. Furthermore, the depth 14 Ah of the opening 541 can be set uniformly without variation for each pixel.

Since the opening 541 is formed prior to the formation of signal lines 509 which will be described below, the depth 14 Ah of the opening 541 can be decreased compared with the conventional case in which an opening is formed after the formation of all the signal lines. That is, the opening 541 with a low aspect ratio is formed.

Figure 23D:
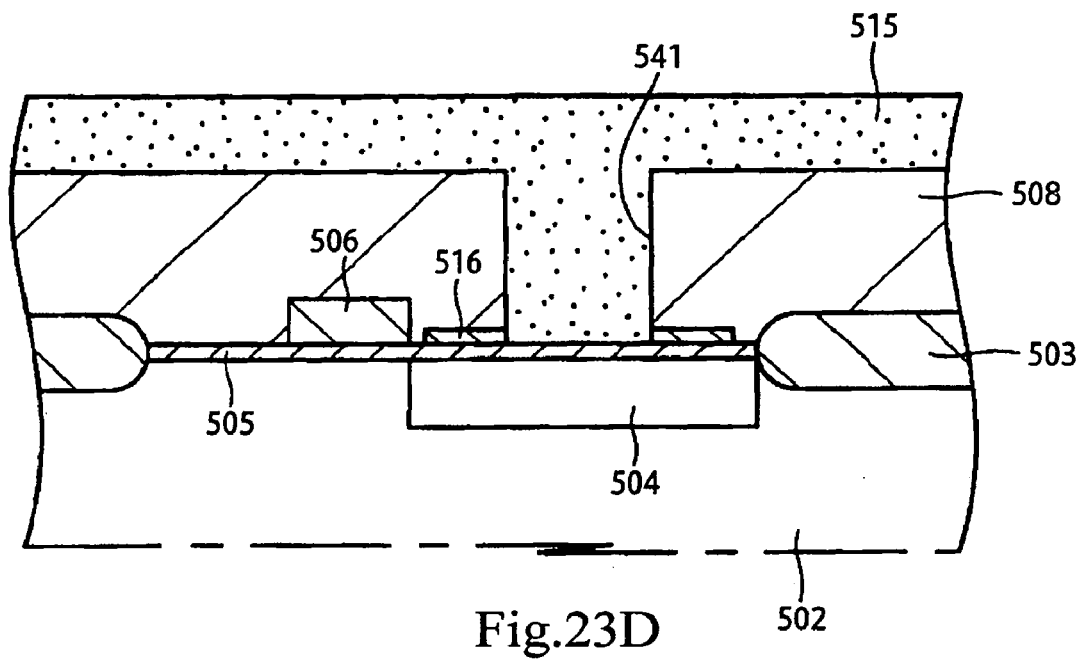

Subsequently, as shown in FIG. 23D, after the etching stopper film 516 exposed in the opening 541 is removed, for example, by isotropic dry etching, a SiN film 515 which is a high-refractive-index layer having a refractive index higher than that of the insulating film 508 is formed over the entire surface of the insulating film 508 including the opening 541, for example, a SiN film (plasma SiN film) 15 is formed by high-density plasma CVD.

As the isotropic etching for removing the etching stopper film 516, for example, chemical dry etching using downflow plasma can be used.

As described above, since the depth 14 Ah of the opening 541 is small, the plasma SiN film can be embedded in the opening 541 satisfactorily without generating voids.

Figure 23E:
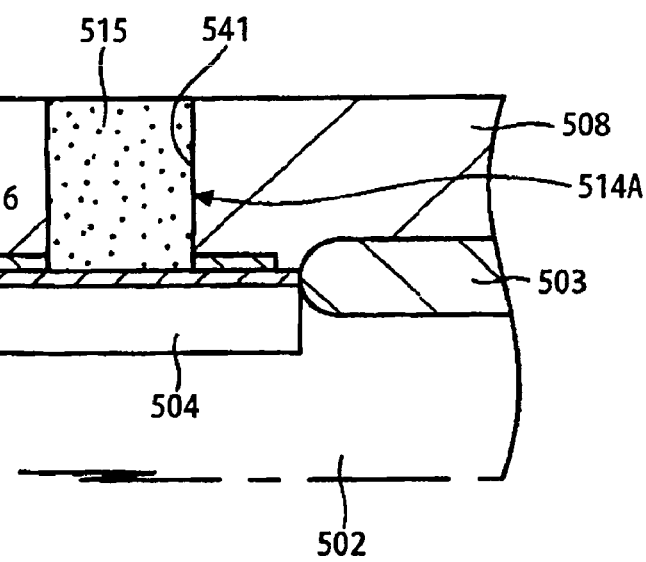

Subsequently, as shown in FIG. 23E, the plasma SiN film 515 is removed by etching to the surface of the insulating film 508, for example, using CMP or an etch-back process.

At this stage, removal by etching must be performed so that the plasma SiN film 515 does not remain on the insulating film 508. The reason for this is that, if the plasma SiN film 515 remains on the insulating film 508, incident light may be reflected multiple times in the plasma SiN film 515 and enter the adjacent pixels to affect them.

Here, for example, when the plasma SiN film 515 is removed by etching using CMP, the upper surface of the insulating film 508 is planarized without leaving the plasma SiN film 515. Thus, it is not necessary to perform planarization again, for example, in the subsequent step of forming signal lines.

A layer 514A in which the plasma SiN film 515 is embedded is thereby produced.

Figure 23F:
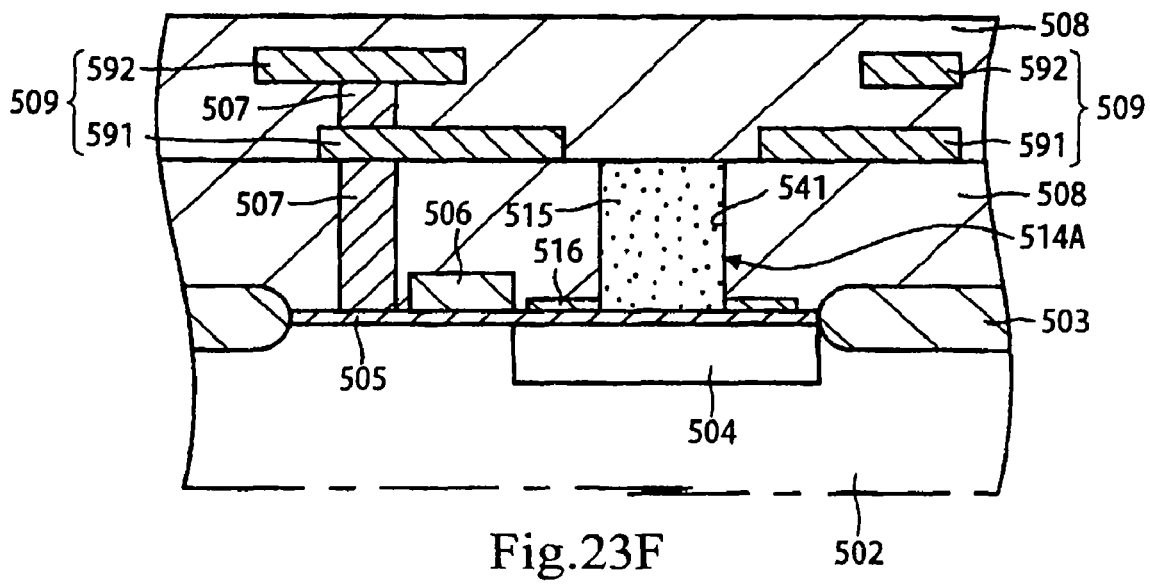

Subsequently, as shown in FIG. 23F, conductive plugs 507 and signal lines 509 are formed.

First, a conductive plug 507 is formed at a predetermined position in the insulating film 508, and a first-layer signal line 591 is formed on the planarized insulating film 508. An insulating film 508 is formed again over the entire surface including the signal line 591, and planarization is performed. A conductive plug 507 is then formed at a predetermined position, and a second-layer signal line 592 is formed on the insulating film 508. An insulating film 508 is formed again over the entire surface including the signal line 592, and the insulating film 508 is planarized. Thus, a two-layered line 509 (first signal line 591 and the second signal line 592) is produced.

In this embodiment, the signal line 509 has a two-layered structure. For example, when the number of layers of the signal lines 509 is increased to three, four, five, six, seven, or more, the steps described above is repeated.

Next, a resist film (not shown in the drawing) is formed on the insulating film 508, and the resist film is formed into a resist mask with a pattern for forming an opening 542 using lithography.

At this stage, in consideration of a deviation in lithography (0.2 μm at a maximum), the pattern for forming the opening 542 is formed so that the lower diameter 514 Bd is smaller than the upper diameter 514 Ad of the lower opening 541 formed in the preceding step (refer to FIG. 23C).

Although there is a difference of about 0.2 μm in the diameter between the openings 541 and 542, since the difference is very small at 0.2 μm, for example, the same resist mask pattern as that used for forming the opening 541 can be used in this step. That is, the diameter of the opening can be adjusted only by controlling in the lithography process.

The insulating film 508 is then removed by anisotropic dry etching through the resist mask.

Figure 23G:
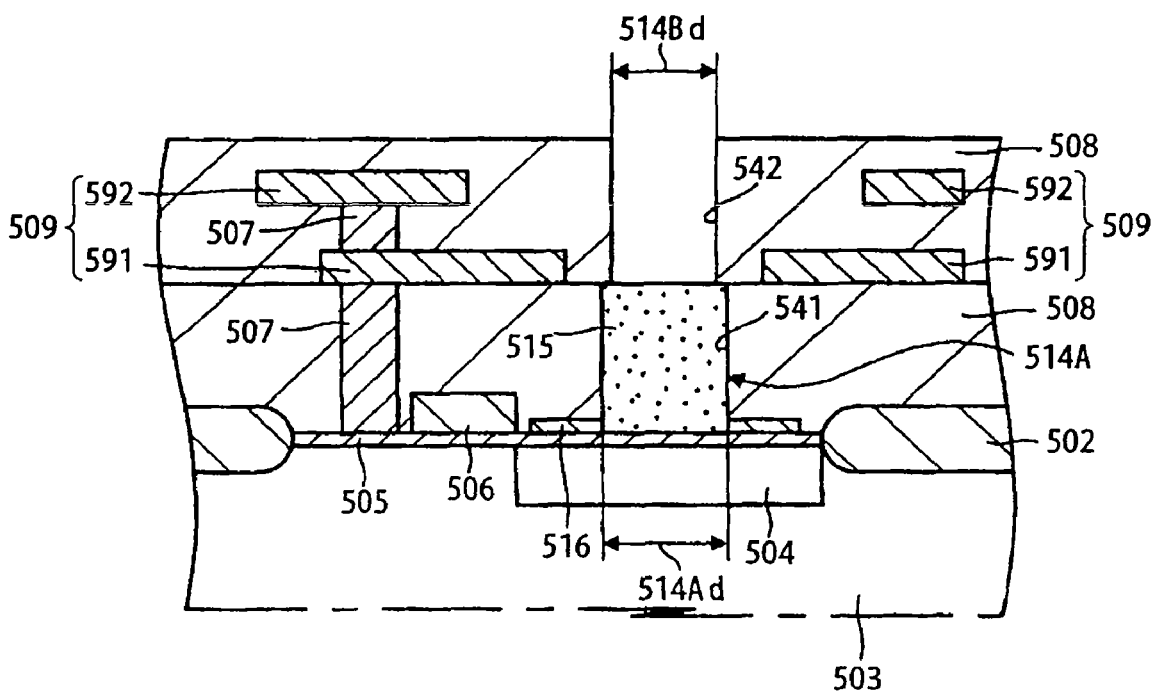

Subsequently, the resist mask is removed. Thereby, as shown in FIG. 23G, the opening 542 is formed in the insulating film 508.

At this stage, the plasma SiN film 515 in the lower layer 514A serves as an etching stopper. The reason for this is that by using C4F2 gas, Ar gas, O2 gas, or the like as a reactant gas in the anisotropic etching, similarly to the case described above, a high selective ratio is ensured between the plasma SiN film 515 in the layer 514A and the insulating film 508 which is etched. This does not affect the surface of the plasma SiN film 515 in the layer 514A. Furthermore, the lower diameter of the upper opening 542 is set smaller than the upper diameter of the lower opening 541 at the interface between the openings (joint 520). Consequently, even if a misalignment occurs between the pattern of the resist mask for forming the opening 542 and the lower opening 542 in the lithographic process, the lower diameter 514 Bd of the upper opening 542 does not protrude from the upper diameter 514 Ad of the lower opening 541, thus preventing the insulating film 508 from being partially etched.

Furthermore, in this step, since the layer 514A is formed in the preceding step, the depth 14 Bh of the opening 542 can also be decreased by that amount.

Figure 23H:
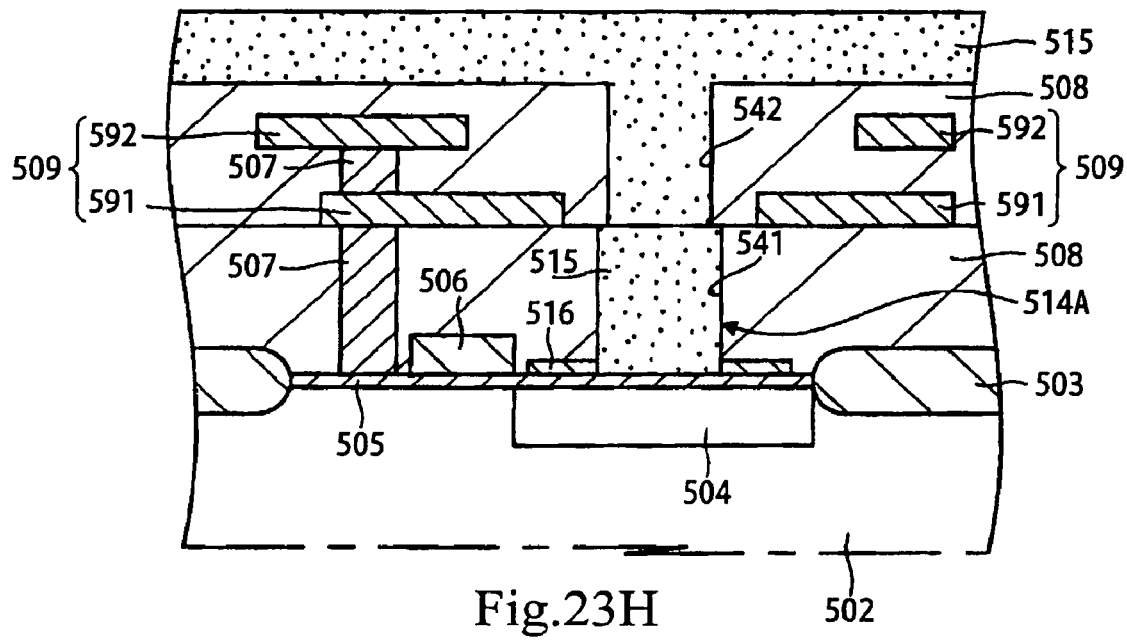

Next, as shown in FIG. 23H, a high-refractive-index layer having a refractive index higher than that of the insulating film 508 is formed over the entire surface of the insulating film 508 including the opening 542. In this step, as in the case shown in FIG. 23D, for example, a SiN film (plasma SiN film) 15 is formed by high-density plasma CVD. At this stage, since the depth of the opening 542 is small as described above, the plasma SiN film can be embedded satisfactorily in the opening 542.

Figure 23I:
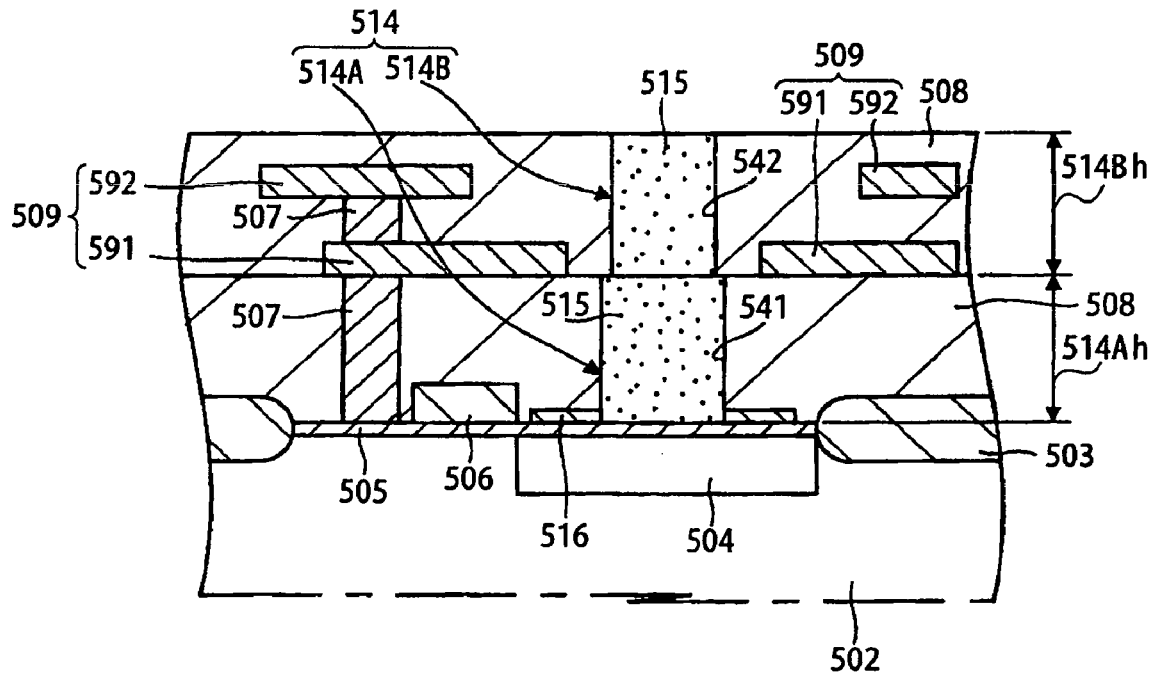

Subsequently, as shown in FIG. 23I, the plasma SiN film 515 is removed by etching to the surface of the insulating film 508 using CMP an etch-back process. As in the case described above, planarization is performed so that the plasma SiN film 515 does not remain on the insulting film 508.

Here, for example, when the plasma SiN film 515 is removed by etching using CMP, the upper surface of the insulating film 508 is planarized without leaving the plasma SiN film 515. Thus, it is not necessary to perform planarization again, for example, in the subsequent step of forming signal lines.

A layer 514B in which the plasma SiN film 515 is embedded is thereby produced. The layer 514B and the lower layer 514A formed first constitute a hole 514.

Figure 23J:
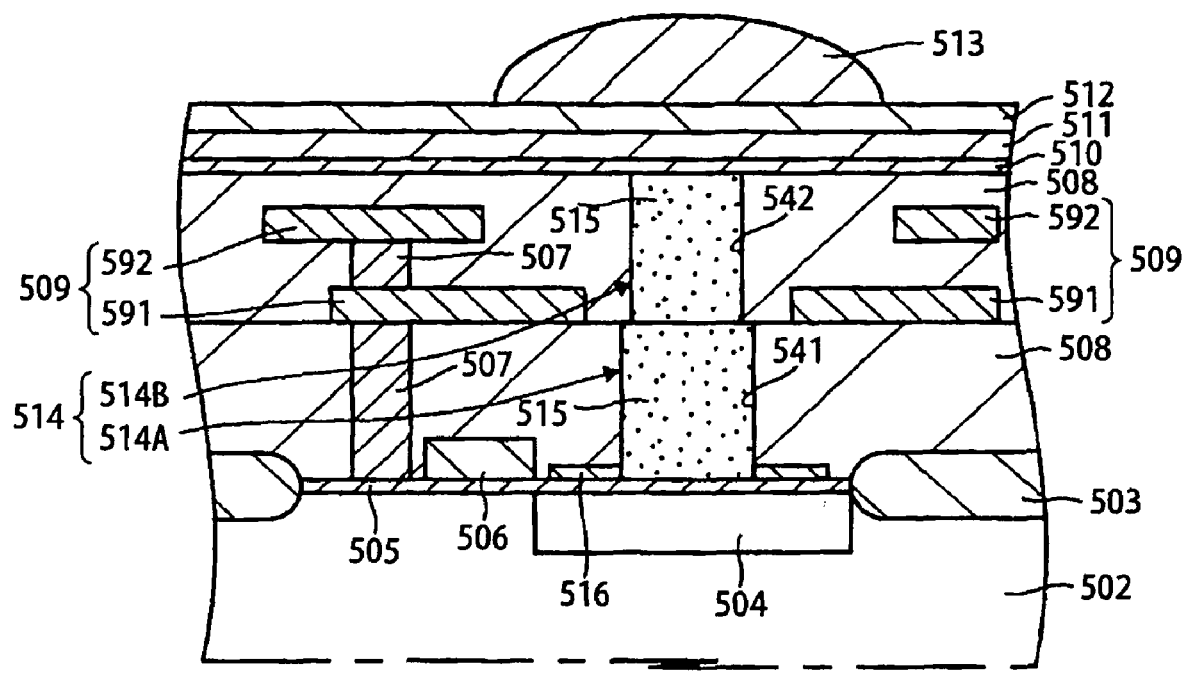
Figure 23K:
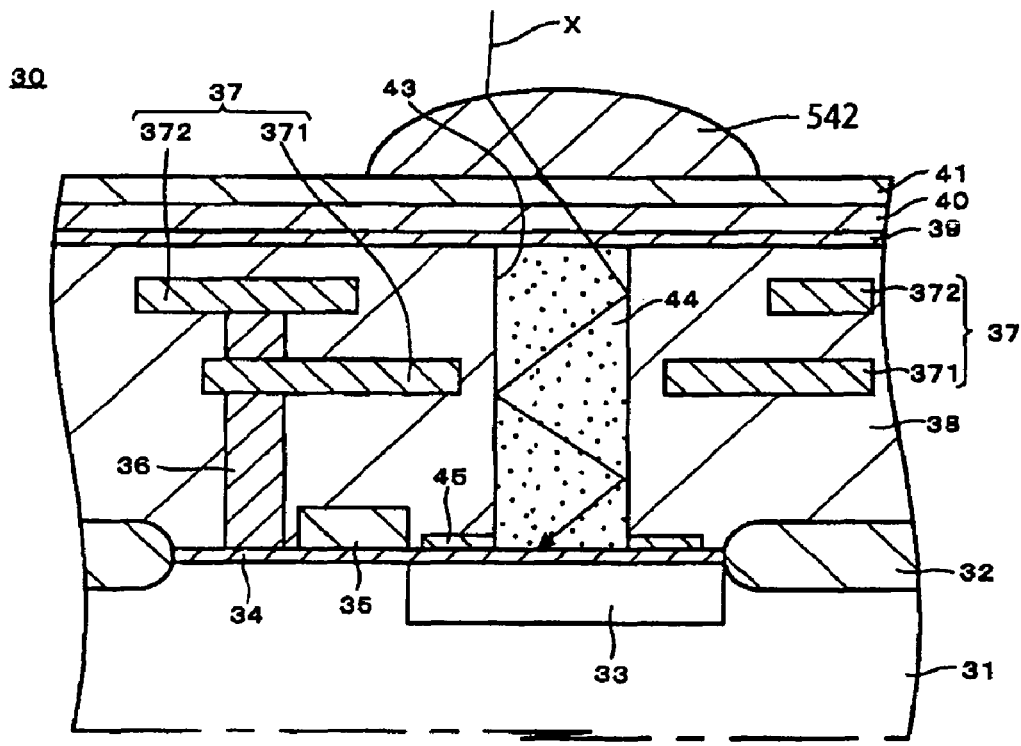

Subsequently, as shown in FIG. 23J, a passivation film 510 is formed entirely so as to cover the surface of the insulating film 508 and the plasma SiN film 515 embedded in the hole 514, a planarizing film 511 is formed on the passivation film 510, and then a color filter 512 is formed thereon. An on-chip lens 513 is formed on the color filter 512 at a position corresponding to the hole 514 above the light-receiving section 504.

The solid-state imaging device having a structure shown in FIG. 17 is thereby fabricated.

According to the method for fabricating the imaging device in this embodiment, the openings 541 and 542 are formed in the insulating film 508, the plasma SiN film 515 being embedded in each of the openings 541 and 542. By repeating such a step a plurality of times, the hole 514 is formed. Consequently, it is possible to decrease the depths 14 Ah and 14 Bh of the openings 541 and 542, for example, compared with the depth h of the opening formed in one step (after all the signal lines are formed) as in the conventional case. That is, it is possible to form an opening with a lower aspect ratio compared with the conventional technique.

As a result, when the plasma SiN film 515 having a high refractive index is embedded in each of the openings 541 and 542 using plasma CVD, embedment of the plasma SiN film 515 can be performed satisfactorily.

Furthermore, the lower diameter 514 Bd of the opening 542 is set smaller than the upper diameter 514 Ad of the opening 541 formed in the preceding step. Consequently, it is possible to prevent unnecessary reflection or refraction from occurring at the joint 520 between the openings 541 and 542.

In the embodiment described above, the sidewall of at least one of the opening may be formed in a tapered shape.

For example, when the sidewall of the opening 542 formed on the top is formed in a tapered shape, in the step shown in FIG. 23G in which the resist pattern for the opening 542 is formed using lithography, for example, by adjusting the exposure condition, etching is performed so that the resist pattern has a tapered shape. At this stage, if C4F8 gas is used, a tapered shape can be formed satisfactorily and easily due to the effect of forming sidewall-protecting film by CF-based deposits.

Furthermore, as described above, when the plasma SiN film 515 on the insulating film 508 is removed by CMP or the like, planarization of the insulating film 508 and the plasma SiN film 505 can be performed in one step.

In the embodiment described above, the hole 514 is formed by two separate steps of forming the opening. Depending on the embedding property, the number of signal lines, the depth, etc., three or more separate steps of forming the opening may be performed.

When the hole 514 is formed by a larger number of steps, the embedding property of the SiN film 515 in each opening is further improved.

In the embodiment described above, the case in which the present invention is applied to a solid-state imaging device has been described. It is to be understood that the present invention can be applied to other solid-state imaging devices, such as CCD solid-state imaging devices.

The present invention is not limited to the embodiments described above, and various other structures may be employed within the scope not deviating from the gist of the present invention.

Embodiment 8

Next, an eighth embodiment (hereinafter referred to as "Embodiment 8") of the present invention will be described. Embodiment 8 of the present invention provides a solid-state imaging device having a waveguide structure and a method for fabricating the same, in which by using a waveguide in which two types of transparent films, i.e., a polyimide resin (second high-refractive-index material) and plasma silicon nitride (first high-refractive-index material), are combined, the embedding property of the waveguide is improved, an increase in white spots due to metal diffusion from the polyimide resin is prevented, and reliability of transistors can be prevented from degrading.

Figure 24:
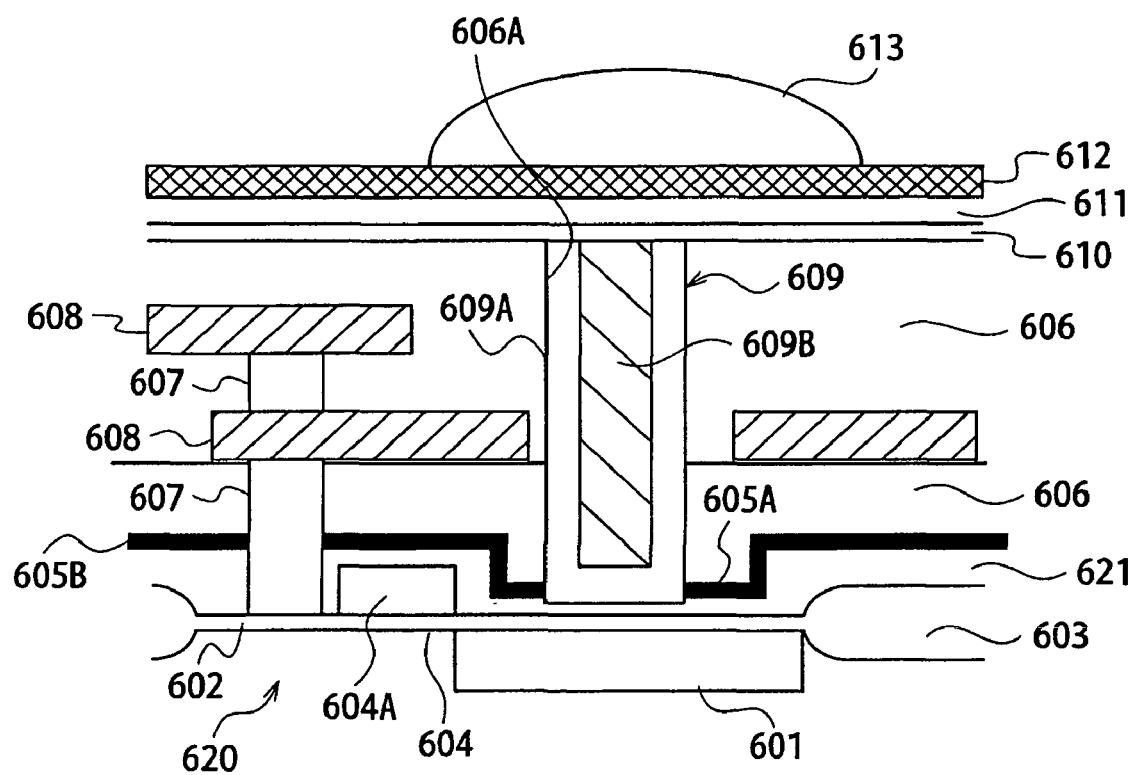
FIG. 24 is a sectional view showing a solid-state imaging device according to Embodiment 8 of the present invention.

FIG. 24 is a sectional view showing a solid-state imaging device according to Embodiment 8 of the present invention.

FIG. 24 shows an example in which the present invention is applied to a CMOS image sensor. In the pixel region isolated by element isolation regions 603 of a substrate 620 composed of a semiconductor material, such as Si, a pixel transistor including a photodiode 1, a read gate 604, etc., is disposed.

Furthermore, a transfer electrode (poly-Si electrode) 4A of the read gate 604 is disposed on the upper surface of the substrate 620 with the gate-insulating film 602 therebetween, and an etching stopper film 605A is disposed thereon with an insulating film 621 therebetween. The etching stopper film 605A is composed of a silicon nitride film formed by low-pressure CVD (LP-silicon nitride).

Multi-layered lines 608 as upper-layer films and an insulating film 606 are disposed on the etching stopper film 605A. Conductive plugs 607 are provided between the individual lines 608 and between contact regions of the substrate 620, and lines 608 in the individual layers are connected. The insulating film 606 is mainly composed of SiO2.

A passivation film 610 is formed on the top insulating film 606, and a color filter 612 and an on-chip lens 613 are disposed on the passivation film 610 with a planarizing film 611 therebetween.

A hole 606A which extends from the uppermost surface of the insulating film 606 to the gate-insulating film 602 on the light-receiving region of the photodiode 601 is formed in the insulating film 606, and a waveguide 609 is embedded in the hole 606A.

The waveguide 609 includes a core (waveguide) including a first waveguide 609A composed of plasma silicon nitride disposed outside and a second waveguide 609B composed of a polyimide resin (PIQ) embedded in the hollow portion of the first waveguide 609A. Although a fabrication method will be described below, the top of the first waveguide 609A is open, and by applying the polyimide material from above the first waveguide 609A, the second waveguide 609B is embedded from the opening of the first waveguide 609A.

As will be described in detail below, the polyimide resin has a refractive index lower than that of the plasma silicon nitride but higher than that of the SiO2 in its periphery.

Such a structure is advantageous in that the embedding property can be improved compared with the waveguide composed of simple plasma silicon nitride, and that excellent optical characteristics can be obtained because of high adhesion between plasma silicon nitride and the polyimide resin.

Furthermore, the first waveguide 609A has an adequate thickness, and the second waveguide 609B and the gate-insulating film 602 are disposed at a sufficient distance from each other so that diffusion of impure metals of the polyimide into the photodiode is minimized.

Moreover, in this embodiment, after the first waveguide 609A is embedded into the hole 604A, prior to embedding of the second waveguide 609B, hydrogen annealing treatment (heat treatment in a hydrogen atmosphere) is performed so that a large amount of hydrogen contained in the plasma silicon nitride is diffused into the photodiode 601. As a result, crystal defects in the photodiode 601 are reduced, thus preventing the occurrence of noise due to white defects.

That is, the first waveguide 609A (plasma silicon nitride) contains hydrogen, and by performing annealing treatment in a hydrogen atmosphere (e.g., at 400° C. for 60 minutes), supply of hydrogen into the photodiode 601 is accelerated. Consequently, dangling bonds due to crystal defects which are caused by metals diffused from the second waveguide 609B into the photodiode 601 are terminated by hydrogen, and thus white spots are reduced.

At this stage, by increasing the space occupied by the first waveguide 609A relative to the second waveguide 609B, the effect of supplying hydrogen is increased, and the effect of reducing white spots is further increased due to an increase in distance from the second waveguide 609B to the photodiode 601. Furthermore, since the first waveguide 609A has a higher refractive index than that of the second waveguide 609B, the light collection capability is also improved.

However, if the percentage of the first waveguide 609A is excessively increased, there are concerns that detachment may occur due to residual stress and that voids may be generated in the waveguide because the surface of the waveguide is blocked by the first waveguide 609A (i.e., the second waveguide 609B cannot be embedded). Therefore, the proper thickness of the first waveguide 609A is, for example, about 1,000 nm.

Furthermore, as shown in FIG. 24, the etching stopper film 605A is a silicon nitride film which functions as an etching stopper when the hole 606A for producing a well structure of the waveguide is formed by etching. In this embodiment, by allowing the etching stopper film 605A to remain in the region other than the light-receiving region of the photodiode 601, the etching stopper film 605A is allowed to function as a hydrogen-absorbing film which prevents hydrogen from entering the transistors, etc., in other regions when hydrogen is diffused into the photodiode 601 by hydrogen annealing treatment (heat treatment in a hydrogen atmosphere) using plasma silicon nitride.

That is, with respect to the hydrogen-supplying effect by the first waveguide 609A, if an excessive amount of hydrogen is supplied to the source/drain regions of the transistor, drain avalanche is accelerated, thus adversely affecting the reliability of transistor (hot carrier resistance).

Since the silicon nitride (LP-silicon nitride) film formed by low-pressure CVD constituting the etching stopper film 605A has a high hydrogen-absorbing effect, the LP-silicon nitride film is allowed to remain in the regions other than the light-receiving region (in particular, the region covering the transistor) to prevent the entry of hydrogen.

In this embodiment, the silicon nitride film disposed in the region other than the light-receiving region in which the silicon nitride film functions as the etching stopper film 605A is referred to as a hydrogen entry-preventing film 605B.

By means of such a hydrogen entry-preventing film 605B, a degradation in characteristics of transistors, etc. due to diffusion of hydrogen is prevented, and adequate operating characteristics are maintained.

In the contact region of the transistor, the hydrogen entry-preventing film 605B is eliminated. However, since a barrier metal layer composed of Ti, TiN, or the like is disposed in the plug, the contact region is protected by the hydrogen-adsorbing effect by the barrier metal layer.

On the other hand, in the portion corresponding to the waveguide, in order to effectively supply hydrogen into the photodiode 601, the etching stopper film 605A is completely removed, and the plasma silicon nitride of the first waveguide 609A is directly brought into contact with the gate-insulating film 602, thus obtaining the hydrogen-supplying effect described above.

Additionally, the hydrogen entry-preventing film 605B may be provided so as to cover all the regions of a plurality of active elements, such as transistors, provided on the semiconductor substrate (excluding the portions through which plugs, etc., pass), or may be provided so as to cover only specific transistors.

In particular, in the transistors disposed in the regions close to the plasma silicon nitride used for the waveguide in this embodiment, (e.g., pixel transistors, such as the read gate), there is a high possibility that entry of hydrogen occurs. Therefore, by surrounding these regions with the silicon nitride film functioning as the hydrogen entry-preventing film 605B, hydrogen can be effectively absorbed and prevented from entering the transistors. Thus, a remarkable effect can be obtained.

Furthermore, in the CMOS image sensor, the pixel region and the peripheral circuit region are provided on the same chip, and there is a possibility that hydrogen may enter the transistors in the peripheral circuit region, although the possibility is low compared with the transistors in the pixel region. Therefore, the hydrogen entry-preventing film 605B may be provided so as to cover the transistors in the peripheral circuit region. Furthermore, the etching stopper film 605A and the hydrogen entry-preventing film 605B are not necessarily continuous in the entire area, and may be placed discontinuously. The position at which the hydrogen entry-preventing film 605B is provided is not limited to the space between the read electrode 604A and the upper-layer film as shown in FIG. 24, and may be provided directly above the gate-insulating film depending on the location.

Figure 25A:
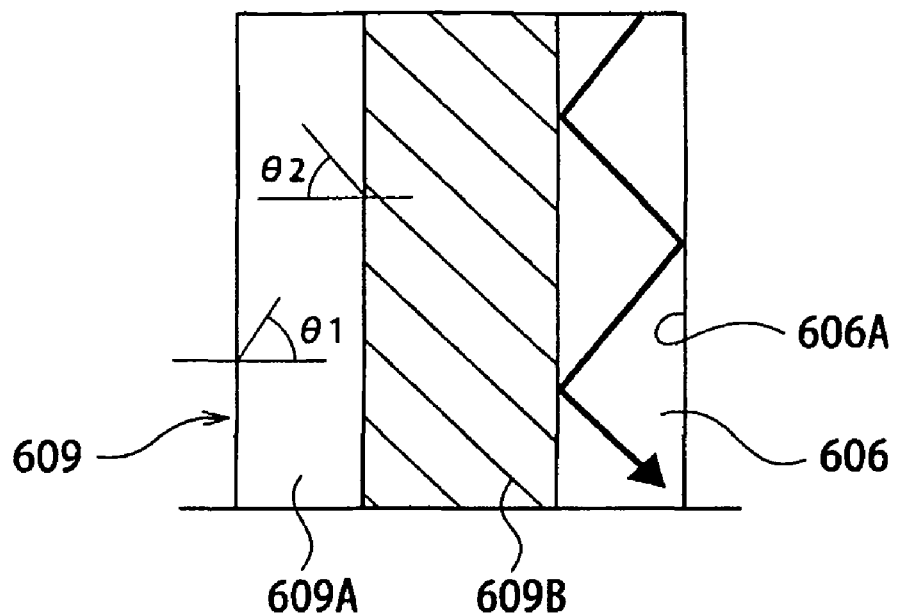
FIGS. 25A and 25B are explanatory views showing reflection paths of light entering a waveguide of the solid-state imaging device shown in FIG. 24.
Figure 25B:
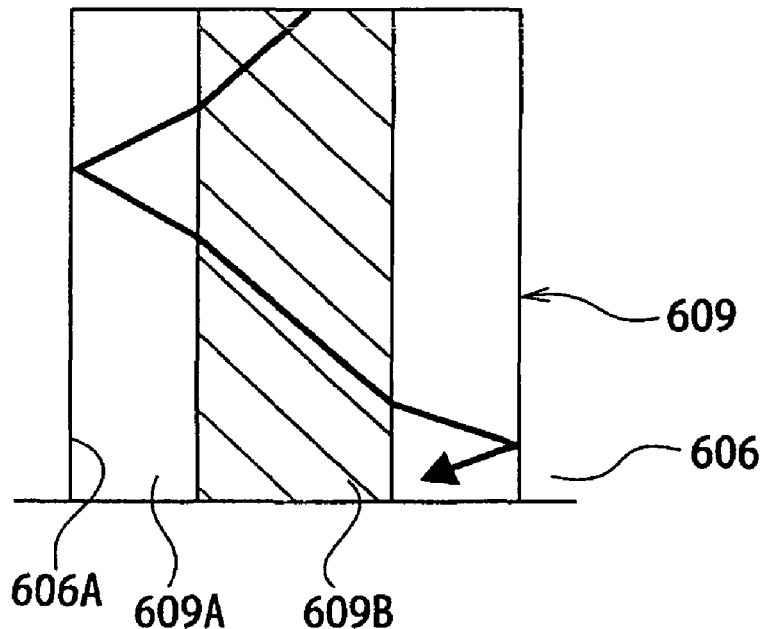

FIGS. 25A and 25B are explanatory views showing reflection paths of light entering the waveguide. FIG. 25A shows the state of light entering the first waveguide 609A, and FIG. 25B shows the state of light entering the second waveguide 609B.

First, the first waveguide 609A (plasma silicon nitride film) has a refractive index n of 2.0, the second waveguide 609B has a refractive index n of 1.7, and the insulating film 606 has a refractive index n of 1.4.

From such a relationship of refractive index, as shown in FIG. 25A, with respect to light which enters from the surface of the first waveguide 609A and directly reaches the interface between the first waveguide 609A and the insulating film 606, when the incident angle μ1, i.e., the angle μ1 between the incident angle and the normal to the interface, is equal to or larger than the critical angle, incident light is reflected at the interface.

Similarly, when light reaching the interface between the first waveguide 609A and the second waveguide 609B has an incident angle equal to or larger than the critical angle □2 of both media, total reflection occurs.

Here, when θ1 and θ2 are compared, Snell's law represented by the equation (1) below is satisfied.

$$na \cdot \sin \theta a = nb \cdot \sin \theta b \quad (1)$$

where na is the refractive index of a medium a, sin θa is the refractive angle of the medium a, nb is the refractive index of a medium b, and sin θb is the refractive angle of the medium b. For example, when na>nb, θa at θb exceeding 90° corresponds to the critical angle.

Accordingly, from the relationship of refractive index, since θ2 is larger, if light entering from the first waveguide 609A has an incident angle that is equal to or larger than □2, it is totally reflected at the interfaces with the insulating film 606 and the second waveguide 609B and enters the photodiode 601.

As shown in FIG. 25B, light entering from the second waveguide 609B is refracted at the interface with the first waveguide 609A, moves through the first waveguide 609A, is totally reflected at the interface between the first waveguide 609A and the insulating film 606, enters the second waveguide 609B through the first waveguide 609A, is refracted at the interface with the first waveguide 609A on the other side, and is totally reflected at the interface between the first waveguide 609A and the insulating film 606 on the other side. By repeating such a process, light enters the photodiode 601.

As the conditions for the propagation of light described above, according to Snell's law, the refractive index of the first waveguide 609A must be higher than the refractive index of the second waveguide 609B, and the incident angle must be equal to or larger than the critical angle θ3 of the second waveguide 609B and the insulating film 606.

Embodiment 9

Next, a method for fabricating a solid-state imaging device according to a ninth embodiment (hereinafter referred to as "Embodiment 9") of the present invention will be described.

FIGS. 26A to 26F are sectional views illustrating fabrication steps in Embodiment 9.

Figure 26A:
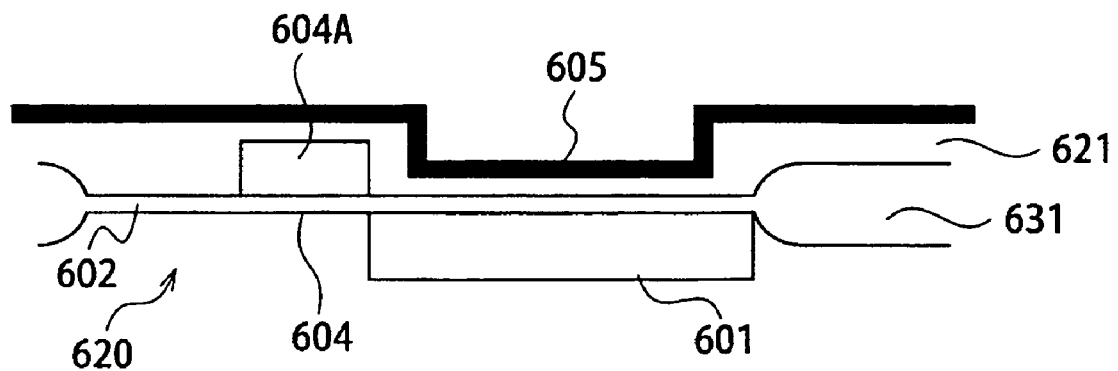
FIGS. 26A to 26F are sectional views illustrating a method for fabricating the solid-state imaging device shown in FIG. 24 according to Embodiment 9 of the present invention.

First, as shown in FIG. 26A, as in the conventional fabrication step, various elements, such as a photodiode 601 and a read gate 604, are formed in a substrate 620. Furthermore, a gate-insulating film 602, a read electrode 604A, a lower insulating film 621, etc., are formed on the substrate 620.

A silicon nitride film 605 which serves as en etching stopper film 605A and a hydrogen entry-preventing film 605B is formed thereon entirely. In consideration of the etching selective ratio during the formation of a hole, as the silicon nitride film 605, a silicon nitride film formed by low-pressure CVC is used.

Figure 26B:
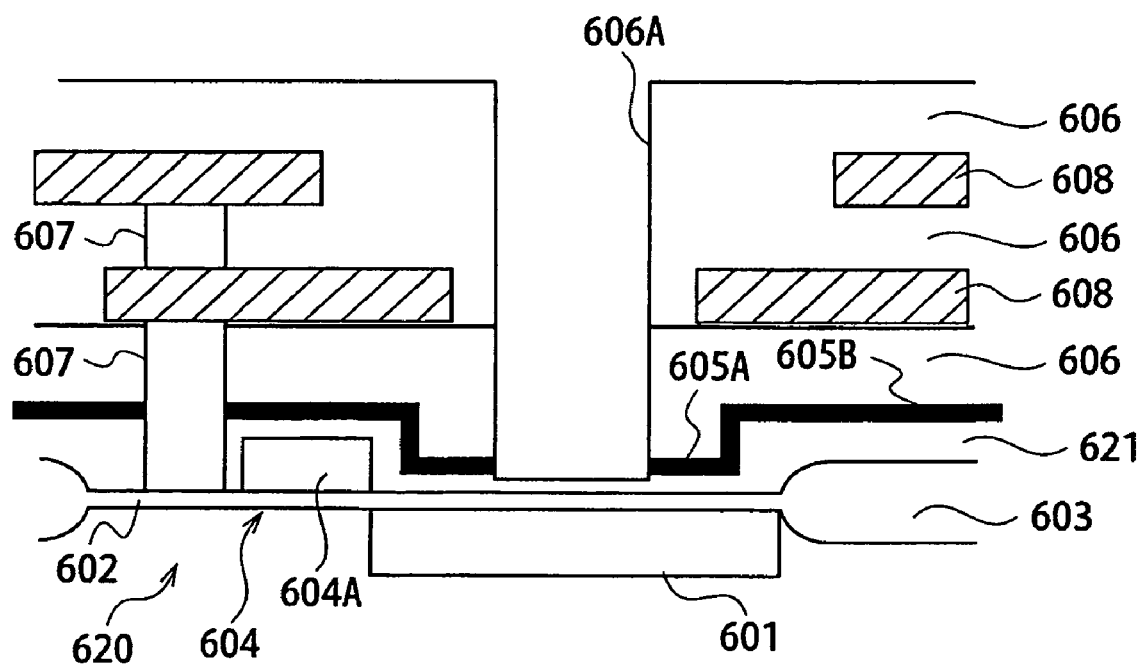

Subsequently, as shown in FIG. 26B, as in the conventional fabrication step, an upper-layer film (including an insulating film 606, conductive plugs 607, lines 608, etc.) is formed. In this process unnecessary parts of the silicon nitride film 605 are selectively removed, for example, by dry etching used in the step of forming a contact hole for the conductive plug 607, and an etching stopper film 605A and a hydrogen entry-preventing film 605B are thereby formed. In the etching of the silicon nitride film 605, a hydrogen-containing organic gas, such as CH2F2 or CHF2, is used.

A hole 606A is then formed by etching the upper-layer film. In this process, resist patterning is performed on the upper-layer film, and a hole is opened by anisotropic dry etching using the etching stopper film 605A as a stopper. Then, the resist is removed, and a portion of the etching stopper film 605A corresponding to the waveguide is removed to expose the gate-insulating film 602.

Figure 26C:
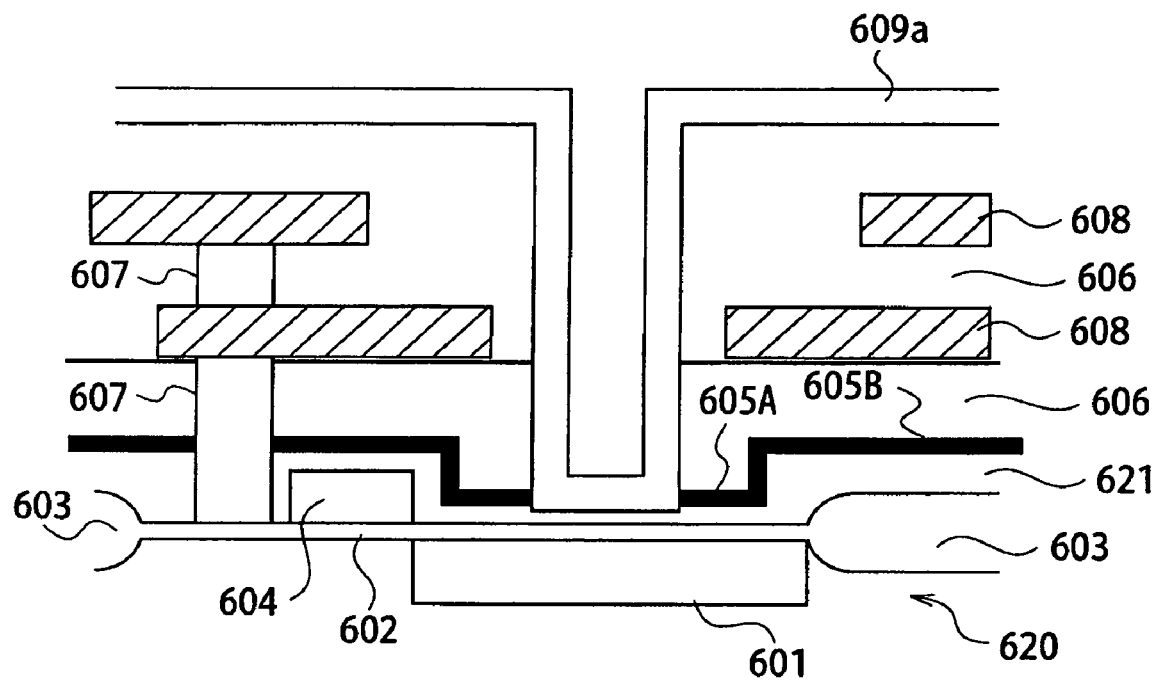

Subsequently, as shown in FIG. 26C, plasma CVD is performed on the upper surface of the upper-layer film (insulating film 606) to form a plasma silicon nitride film 609a, and a part of plasma silicon nitride is embedded in the hole 606A to form a part which serves as a first waveguide 609A. At this stage, annealing treatment is performed in a hydrogen atmosphere, for example at 400° C. for 60 minutes. Thus, hydrogen is supplied to the photodiode 601.

Figure 26D:
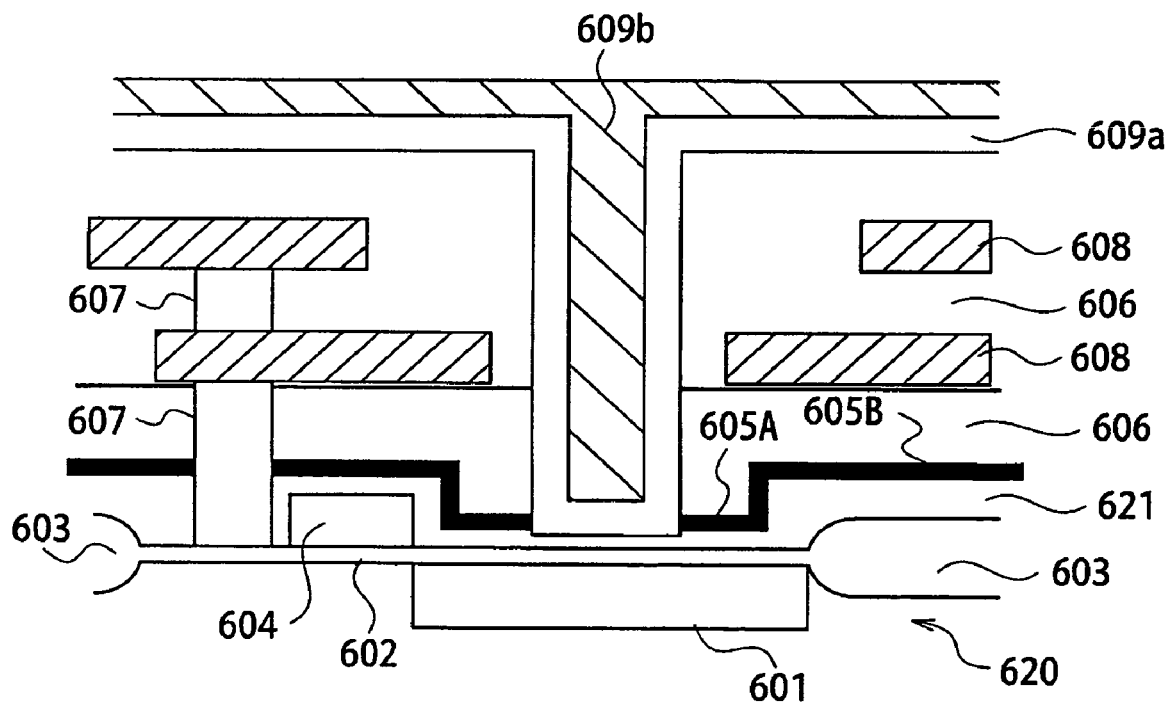

Subsequently, as shown in FIG. 26D, a polyimide film 609b is applied on the plasma silicon nitride film 609a, and the polyimide is embedded in the hollow portion of the plasma nitride film 609a for forming a second waveguide 609B. The polyimide is applied by spin coating at 3,000 rmp for 30 seconds.

Subsequently, to ensure adhesion with the underlayer (oxide film or nitride film), hardening treatment is performed in a nitrogen or air atmosphere, for example, at 300° C. to 350° C. for 60 minutes.

Figure 26E:
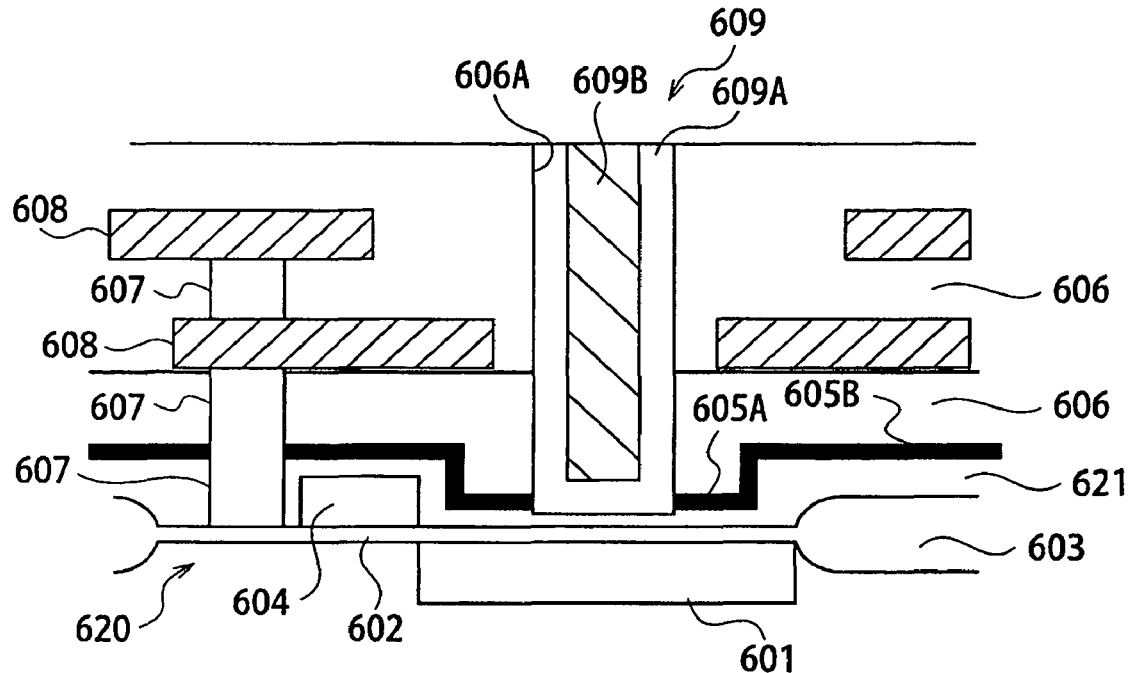

Subsequently, as shown in FIG. 26E, the plasma silicon nitride film 609a and the polyimide film 609b remaining on the upper surface of the upper-layer film (insulating film 606) are removed by etching using downflow plasma, and global planarization is performed by an etch-back process to the upper surface of the upper-layer film (insulating film 606). Fluorine-based gas is used for the polyimide film 609b, and CHF2, Ar, or O2 gas is used for the plasma silicon nitride film 609a.

Figure 26F:
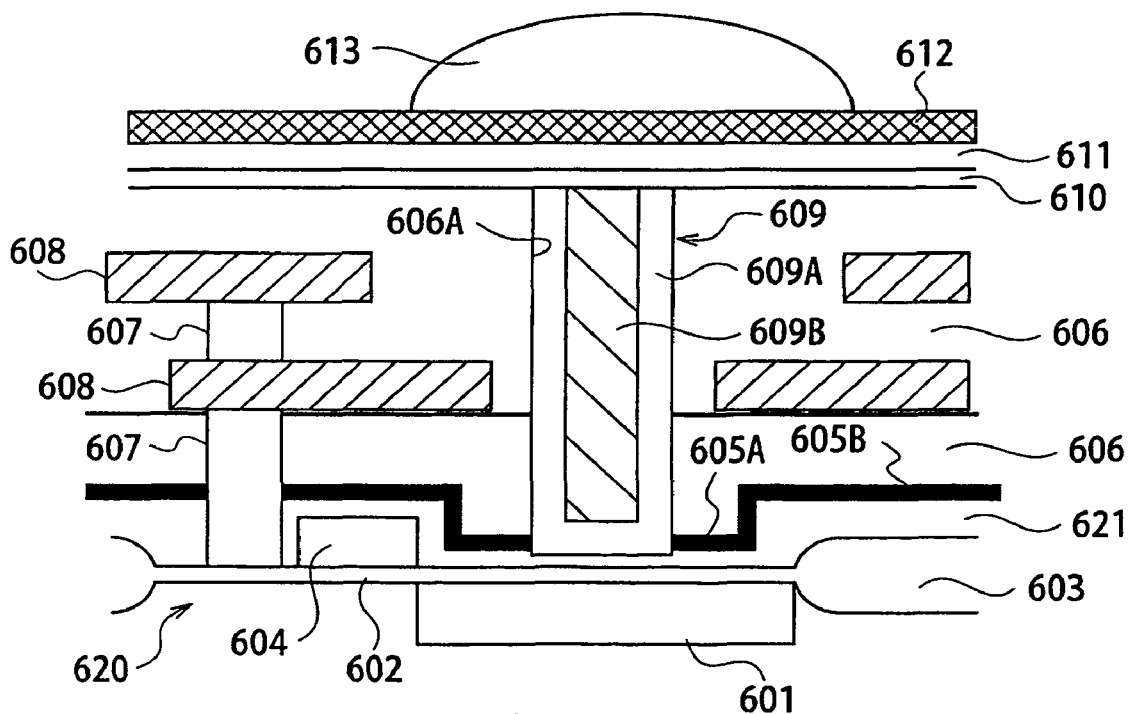

Subsequently, as shown in FIG. 26F, as in the conventional fabrication step, a passivation film 610, a planarizing film 611, a color filter 612, and an on-chip lens 613 are formed in that order. The solid-state imaging device is thereby completed.

In the solid-state imaging device and the fabrication method therefor in this example, the following advantages can be obtained:

(1) By using a polyimide resin for the second waveguide constituting the waveguide, the embedding property of the waveguide can be improved, the light collection capability can be improved, and the variation in sensitivity characteristics can be reduced. In particular, in the solid-state imaging device having a multi-layered wiring structure, as the number of wiring layers and the number of pixels increase, the aspect ratio of the waveguide increases. Thus, a more remarkable effect is achieved.

(2) Even if a polyimide resin is used for the second waveguide, by using a plasma silicon nitride film as the first waveguide and by performing hydrogen annealing, it is possible to prevent an increase in white spots due to metal diffusion from the polyimide resin.

(3) With respect to the hydrogen-supplying effect by hydrogen annealing of the plasma silicon nitride film serving as the first waveguide, above the transistor region, hydrogen is absorbed by the LP-silicon nitride film used as an etch stopper film for forming the hole, and the transistor in the lower layer can be protected. Thus, it is possible to prevent the reliability of transistor (hot carrier resistance) from being degraded.

INDUSTRIAL APPLICABILITY

According to a solid-state imaging device and a fabrication method therefor of the present invention, the waveguide has a forward tapered portion. That is, the opening for forming the waveguide has a forward tapered shape in which the size of the planar shape decreases from the light incident side surface toward the light-receiving section. Consequently, the embedding property of the light-transmissive material constituting the waveguide can be improved, and the light collection efficiency to the light-receiving section can be improved. Furthermore, lines can be prevented from being scraped. Thus, the reliability of the solid-state imaging device is ensured.

According to another solid-state imaging device of the present invention, a hole in which a high-refractive-index layer is satisfactorily embedded can be constructed. Consequently, compared with the conventional technique, the embedding property of the high-refractive-index layer in the hole, coatability, etc., are greatly improved. Thus, it is possible to provide a solid-state imaging device with improved reliability.

Furthermore, no unnecessary reflection or refraction occurs at the joint, incident light can be guided into the light-receiving section without leakage. Thus, it is possible to provide a solid-state imaging device in which light collection efficiency and sensitivity characteristics are further improved compared with the conventional technique.

Furthermore, in the case in which at least one layer among a plurality of layers of a hole is formed so as to have a tapered sidewall, incident light is allowed to enter the hole easily. Thus, light collection efficiency is further improved.

According to another method for fabricating a solid-state imaging device of the present invention, the depth of the individual openings can be decreased, and the high-refractive-index layers can be satisfactorily embedded in the respective openings. Consequently, it is possible to fabricate a solid-state imaging device having high light collection efficiency.

Furthermore, when the lower diameter of the upper opening is set smaller than the upper diameter of the lower opening, since a step which may cause unnecessary reflection or refraction is not formed, it is possible to fabricate a solid-state imaging device having improved light collection efficiency and sensitivity characteristics.

Furthermore, in the case in which the sidewall of at least one opening is formed in a tapered shape, light can be taken into the hole easily. Thus, light collection efficiency can be further improved.

Furthermore, according to another solid-state imaging device and a fabrication method therefor of the present invention, by releasing hydrogen contained in the first high-refractive-index material provided in the waveguide, the photoelectric conversion section containing hydrogen is produced. Consequently, an increase in white spots due to metal diffusion from the waveguide into the photoelectric conversion section can be reduced. Thus, image quality can be enhanced.

Furthermore, by allowing the etching stopper film used for forming the hole in the region other than the light-receiving region of the photoelectric conversion section, hydrogen is prevented from entering the region other than the photoelectric conversion section. Thus, it is possible to prevent the characteristics of transistors, etc., from being degraded.

What is claimed is:

1. A solid-state imaging device comprising:
   a substrate;
   a light-receiving section on the substrate, the light-receiving section generates a charge in response to receiving light;
   an insulating film on the substrate:
   a plurality of signal lines located within the insulating film;
   a waveguide in the insulating film and associated with the light-receiving section, the waveguide effective to receive incident light and guide incident light to the light-receiving section; and
   a planarizing layer located above the waveguide and the plurality of signal lines;
   wherein,
      the waveguide is tapered from a point of receipt of incident light to the light-receiving section, and
      some of the plurality of signal lines extend over a portion of the light-receiving section.

2. The solid-state imaging device according to claim 1, wherein the waveguide comprises a light-transmissive material.

3. The solid-state imaging device according to claim 1, wherein a part of a side face of the waveguide covers an upper surface of at least one signal line among the plurality of signal lines.

4. The solid-state imaging device according to claim 1, wherein the tapered portion of the waveguide is disposed according to the placement of the plurality of signal lines disposed adjacent to the light-receiving section.

5. The solid-state imaging device according to claim 1, wherein the waveguide comprises a light-transmissive film having a relatively high refractive index, the light-transmissive film being embedded in a hole formed by etching an insulating film having a relatively low refractive index, the light-transmissive film includes a first material portion containing at least hydrogen, and the light-receiving section contains hydrogen released from the first material portion by heat treatment in a hydrogen atmosphere.

6. The solid-state imaging device according to claim 5, wherein the first material portion comprises silicon nitride formed by plasma CVD.

* * * * *